US008735026B2

(12) United States Patent
Shimada et al.

(10) Patent No.: US 8,735,026 B2
(45) Date of Patent: May 27, 2014

(54) POLYMERIZABLE COMPOSITION, LIGHT-BLOCKING COLOR FILTER FOR SOLID-STATE IMAGING DEVICE, AND SOLID-STATE IMAGING DEVICE

(75) Inventors: Kazuto Shimada, Shizuoka (JP); Tomotaka Tsuchimura, Shizuoka (JP); Yoichi Maruyama, Shizuoka (JP); Toru Fujimori, Shizuoka (JP); Yushi Kaneko, Shizuoka (JP); Hiroyuki Einaga, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 112 days.

(21) Appl. No.: 12/935,789

(22) PCT Filed: Feb. 17, 2009

(86) PCT No.: PCT/JP2009/052607
§ 371 (c)(1),
(2), (4) Date: Dec. 27, 2010

(87) PCT Pub. No.: WO2009/122789
PCT Pub. Date: Oct. 8, 2009

(65) Prior Publication Data
US 2011/0104596 A1 May 5, 2011

(30) Foreign Application Priority Data

Mar. 31, 2008 (JP) .................................. 2008-093394

(51) Int. Cl.
*G02B 5/20* (2006.01)
*G03F 7/032* (2006.01)
(52) U.S. Cl.
USPC .......................... 430/7; 430/270.1; 430/287.1
(58) Field of Classification Search
None
See application file for complete search history.

(56) References Cited

FOREIGN PATENT DOCUMENTS

| EP | 0 780 731 A2 | * | 6/1997 |
|----|----|----|----|
| EP | 1 826 200 A2 | | 8/2007 |
| EP | 2 105 792 A1 | | 9/2009 |
| EP | 2 112 182 A1 | | 10/2009 |
| JP | 9-054431 A | | 2/1997 |
| JP | 10-046042 A | | 2/1998 |
| JP | 10-246955 A | | 9/1998 |
| JP | 2005-292801 A | | 10/2005 |
| JP | 2005-338328 A | * | 12/2005 |
| JP | 2006-036750 A | | 2/2006 |
| JP | 2006-039140 A | | 2/2006 |
| JP | 2006-053569 A | | 2/2006 |
| JP | 2006-251783 A | | 9/2006 |
| JP | 2006-276878 A | | 10/2006 |
| JP | 2006-313286 A | | 11/2006 |
| JP | 2007-025535 A | | 2/2007 |
| JP | 2007-033467 A | | 2/2007 |
| JP | 2007-115921 A | | 5/2007 |
| TW | 2006-15694 | | 5/2006 |
| WO | 2006-046736 A1 | | 5/2006 |

OTHER PUBLICATIONS

Computer-generated translation of JP 2007-115921 (May 2007).*
Computer-generated translation of JP 2006-036750 (Feb. 2006).*
Computer-generated transaltion of JP 2005-338328 (Dec. 2005), part 1 of 2.*
Computer-generated transaltion of JP 2005-338328 (Dec. 2005), part 2 of 2.*
Extended European Search Report dated Jul. 7, 2011 for corresponding European Application No. 09728726 (9 pages).
Office Action dated Sep. 11, 2013 in the corresponding Taiwanese Application.
Office Action dated Jul. 30, 2013 in Japanese Application No. 2008-093394.
Office Action dated Sep. 18, 2012 in Japanese Application No. JP 2008-093394.
Office Action dated Dec. 3, 2013 in Japanese Application No. 2008-093394.

* cited by examiner

*Primary Examiner* — John A. McPherson
(74) *Attorney, Agent, or Firm* — Sughrue Mion, PLLC

(57) ABSTRACT

A polymerizable composition including at least a polymerizable compound, a binder polymer, a photopolymerization initiator, and a titanium black dispersion, wherein the mass ratio of the content of the polymerizable compound to the content of the binder polymer is more than 1.

18 Claims, No Drawings

POLYMERIZABLE COMPOSITION, LIGHT-BLOCKING COLOR FILTER FOR SOLID-STATE IMAGING DEVICE, AND SOLID-STATE IMAGING DEVICE

CROSS REFERENCE TO RELATED APPLICATIONS

This application is a National Stage of International Application No. PCT/JP2009/052607 filed Feb. 17, 2009, claiming priority based on Japanese Patent Application No. 2008-093394 filed Mar. 31, 2008, the contents of all of which are incorporated herein by reference in their entirety.

TECHNICAL FIELD

The present invention relates to a polymerizable composition, a light-blocking color filter for a solid-state imaging device, and a solid-state imaging device.

BACKGROUND ART

A color filter used in a liquid crystal display device includes a light-blocking film called a black matrix for the purpose of improving contrast by blocking light between color pixels, or the like. Furthermore, in a solid-state imaging device, a light-blocking color filter is provided for the purpose of preventing the occurrence of noise, improving image quality, or the like.

As a composition for forming a black matrix for a liquid crystal display device or a light-blocking color filter for a solid-state imaging device, a polymerizable composition containing a black color material such as carbon black, titanium black, and the like is known (see, for example, Japanese Patent Application Laid-Open (JP-A) No. 10-246955, JP-A No. 9-54431, JP-A No. 10-46042, JP-A No. 2006-36750, and JP-A No. 2007-115921)

DISCLOSURE OF INVENTION

Problems to be Solved by the Invention

A black matrix for a liquid crystal display device is required to have light-blocking properties in mainly the visible region, whereas a light-blocking color filter for a solid-state imaging device is required to have light-blocking properties in the IR region, in addition to light-blocking properties in the visible region.

Furthermore, a black matrix for a liquid crystal display device is required to be microfabricated, whereas a light-blocking color filter for a solid-state imaging device (particularly, a light-blocking color filter for light-blocking a side opposite to the side of a support on which a light-receiving element is formed (hereinafter also referred to as a "backside")) is required to have a capability of blocking light evenly over a wider area, as compared with a black matrix for a liquid crystal display device.

When a light-blocking color filter having a wide area is formed as a light-blocking color filter for a solid-state imaging device using a polymerizable composition in which a black pigment such as carbon black (which is conventionally used in a black matrix of a liquid crystal display device or the like) is used, it is necessary to block light at 800 to 1300 nm in addition to light in a visible light region for the prevention of generation of noise. In this case, when carbon black is used, the transmittance to light at 300 to 500 nm is remarkably reduced, and curing by light becomes difficult. Titanium black has a higher light-blocking property with respect to infrared light than carbon black, and has higher light transmittance at 300 to 500 nm than carbon black. However, light transmittance is insufficient, leading to insufficient curing, and thus, reduction in sensitivity.

In addition, when the content of a black color material is increased in order to enhance the light-blocking property, there is a problem that residues in the periphery of a light-blocking color filter are easily generated.

In consideration of the above-described problems, the present invention has been made for achieving the following objects.

Specifically, an object of the present invention is to provide a polymerizable composition having high sensitivity during curing and causing little generation of residues, even when it is necessary to block light in a wavelength region from ultraviolet light to infrared light, and a light-blocking color filter for a solid-state imaging device formed using the polymerizable composition, and a solid-state imaging device.

Means for Solving Problems

The problems in the conventional art can be solved by the invention described below.

<1> A polymerizable composition comprising at least (A) a polymerizable compound, (B) a binder polymer, (C) a photopolymerization initiator, and (D) a titanium black dispersion, wherein the mass ratio of the content of (A) the polymerizable compound to the content of (B) the binder polymer is more than 1.

<2> The polymerizable composition according to <1>, wherein (C) the photopolymerization initiator is an oxime compound.

<3> The polymerizable composition according to <1> or <2>, wherein (B) the binder polymer has a polymerizable group in a side chain.

<4> The polymerizable composition according to any one of <1> to <3>, wherein the content of the titanium black is from 40% by mass to 90% by mass with respect to a total solid content of the polymerizable composition.

<5> The polymerizable composition according to any one of <1> to <4>, which is used for formation of a colored region of a solid-state imaging device.

<6> A light-blocking color filter for a solid-state imaging device, comprising a colored region formed using the polymerizable composition according to <5> on a support.

<7> A solid-state imaging device comprising the light-blocking color filter for a solid-state imaging device according to <6>.

Effects of Invention

According to the present invention, a polymerizable composition having high sensitivity during curing and causing little generation of residues, even when it is necessary to block light in a wavelength region from ultraviolet light to infrared light, and a light-blocking color filter for a solid-state imaging device formed using the polymerizable composition, and a solid-state imaging device can be provided.

BEST MODE FOR CARRYING OUT THE INVENTION

<<Polymerizable Composition>>

The polymerizable composition of the present invention includes at least (A) a polymerizable compound, (B) a binder polymer, (C) a photopolymerization initiator, and (D) a titanium black dispersion, wherein the mass ratio of the content of (A) the polymerizable compound to the content of (B) the binder polymer is more than 1.

Herein, "the mass ratio of the content of (A) the polymerizable compound to the content of (B) the binder polymer is more than 1" means that when the content of (A) the polymerizable compound is denoted as (a) and the content of (B) the binder polymer is denoted as (b), the content ratio (a)/(b) is more than 1, that is, the content of (A) the polymerizable compound is more than the content of (B) the binder polymer.

In such a constitution, by setting the mass ratio of the content of (A) the polymerizable compound to the content of (B) the binder polymer to more than 1, when it is necessary to block light in a wavelength region from ultraviolet light to infrared light, for example, in the case when the polymerizable composition is used for forming a colored region (pattern) in a solid-state imaging device, or in other cases, a polymerizable composition having high sensitivity during curing and causing little generation of residues can be provided.

Hereinbelow, the components (A) to (D), and other components in the polymerizable composition of the invention will be described.

<(A) Polymerizable Compound>

(A) The polymerizable compound used in the present invention preferably contains at least one functional group capable of reacting by a radical generated by light and/or by an acid, and examples thereof include a cyclic ether, a compound having an ethylenically unsaturated double bond, and the like. Among these, from the viewpoint of sensitivity, the compound having an ethylenically unsaturated double bond is preferable, which desirably has bi- or more functionality. A group of such compounds is widely known in the present industrial field, and they may be used in the invention without any particular restriction. They have a chemical form of, for example, a monomer, a prepolymer, that is, a dimer, a trimer, and an oligomer, or a mixture thereof, and copolymers thereof. Examples of the monomer or a copolymer thereof include unsaturated carboxylic acids (for example, acrylic acid, methacrylic acid, itaconic acid, crotonic acid, isocrotonic acid, maleic acid, and the like), esters and amides thereof, and an ester of an unsaturated carboxylic acid and an aliphatic polyhydric alcohol compound and an amide of an unsaturated carboxylic acid and an aliphatic polyamine compound are preferably used. Furthermore, an addition reaction product of an unsaturated carboxylic acid ester or amide having a nucleophilic substituent such as a hydroxyl group, an amino group, a mercapto group, and the like with a monofunctional or polyfunctional isocyanate, epoxy, or the like, a dehydration-condensation reaction product of an unsaturated carboxylic acid ester or amide having a nucleophilic substituent such as a hydroxyl group, an amino group, a mercapto group, and the like with a monofunctional or polyfunctional carboxylic acid, etc. may also be used suitably. Furthermore, an addition reaction product of an unsaturated carboxylic acid ester or amide having an electrophilic substituent such as an isocyanate group, an epoxy group, and the like with a monofunctional or polyfunctional alcohol, amine, or thiol, and a substitution reaction product of an unsaturated carboxylic acid ester or amide having a leaving substituent such as a halogen group, a tosyloxy group, and the like with a monofunctional or polyfunctional alcohol, amine, or thiol are also suitable. Furthermore, as other examples, a group of compounds in which the above-mentioned unsaturated carboxylic acid is replaced by an unsaturated phosphonic acid, styrene, vinyl ether, or the like may also be used.

Specific examples of the monomer which is an ester of an aliphatic polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, a polyester acrylate oligomer, an EO-modified isocyanurate triacrylate, and the like.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane, and the like.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like.

Examples of the crotonic acid ester include ethylene glycol dicrotonate, tetramethylene glycol dicrotonate, pentaerythritol dicrotonate, and sorbitol tetradicrotonate. Examples of isocrotonic acid esters include ethylene glycol diisocrotonate, pentaerythritol diisocrotonate, sorbitol tetraisocrotonate, and the like.

Examples of the maleic acid ester include ethylene glycol dimaleate, triethylene glycol dimaleate, pentaerythritol dimaleate, sorbitol tetramaleate, and the like.

As examples of other esters, aliphatic alcohol-based esters described in JP-B No. 51-47334 and JP-A No. 57-196231, those having an aromatic skeleton described in JP-A No. 59-5240, JP-A No. 59-5241, and JP-A No. 2-226149, those having an amino group described in JP-A No. 1-165613, and the like are also used suitably. Moreover, the above-mentioned ester monomers may also be used as a mixture.

Furthermore, specific examples of the monomer which is an amide of an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, xylylenebismethacrylamide, and the like.

Preferred examples of other amide-based monomers include those containing a cyclohexylene structure described in Japanese Examined Patent Application Publication (JP-B) No. 54-21726.

In addition, urethane addition-polymerizable compounds produced by use of an addition reaction between isocyanate and a hydroxyl group are also preferable, and typical examples thereof include the vinylurethane compounds containing two or more polymerizable vinyl groups in one molecule which are prepared by addition-reacting a hydrogen group-containing vinyl monomer represented by the following general formula (A) to a polyisocyanate compound having two or more isocyanate groups in one molecule, which are described in JP-B No. 48-41708, and the like.

$$CH_2=C(R^4)COOCH_2CH(R^5)OH \quad (A)$$

(In the general formula (A), $R^4$ and $R^5$ each represent H or $CH_3$.)

Furthermore, urethane acrylates described in JP-A No. 51-37193, JP-B No. 2-32293, and JP-B No. 2-16765, and urethane compounds having an ethylene oxide-based skeleton described in JP-B No. 58-49860, JP-B No. 56-17654, JP-B No. 62-39417, JP-B No. 62-39418 are also suitable. Furthermore, by use of an addition-polymerizable compound having an amino structure or a sulfide structure in the molecule described in JP-A No. 63-277653, JP-A No. 63-260909, and JP-A No. 1-105238, a photopolymerizable composition having very good photosensitive speed can be obtained.

Other examples include polyester acrylates such as those described in JP-A No. 48-64183, JP-B No. 49-43191, and JP-B No. 52-30490, and polyfunctional acrylates and methacrylates such as epoxy acrylates formed by a reaction of an epoxy resin and (meth)acrylic acid. Examples also include specific unsaturated compounds described in JP-B No. 46-43946, JP-B No. 1-40337, and JP-B No. 1-40336, and vinylphosphonic acid-based compounds described in JP-A No. 2-25493. In some cases, perfluoroalkyl group-containing structures described in JP-A No. 61-22048 are suitably used. Moreover, those described as photocuring monomers or oligomers in the Journal of the Adhesion Society of Japan, Vol. 20, No. 7, pp. 300 to 308 (1984) may also be used.

With regard to these addition polymerizable compounds, the structure thereof and details of an application method such as use thereof alone or in combination and the amount thereof added may be freely set according to the eventual performance design of a photopolymerizable composition. For example, selection is carried out from the following viewpoints.

From the viewpoint of sensitivity, a structure having a high unsaturated group content per molecule is preferable, and in many cases di- or higher-functionality is preferable. Furthermore, in order to increase the strength of a cured film, a tri- or higher-functional compound is better, and it is also effective to adjust both sensitivity and strength by using a combination of compounds with a different functional number or different polymerizable groups (for example, an acrylic acid ester, a methacrylic acid ester, a styrene-based compound, and a vinyl ether-based compound).

Furthermore, selection and application methods of the polymerizable compound are important factors for compatibility and dispersibility with other components (for example, a photopolymerization initiator, a colorant (a pigment and a dye), a binder polymer, and the like) contained in the photopolymerizable composition, and for example, compatibility can be improved by the use of a low purity compound or the use of two or more types in combination. Moreover, in order to improve adhesion to a hard surface such as a support and the like, a specific structure can be selected.

Preferable examples of the polymerizable compound which can be specifically used in the invention include bisphenol A diacrylate, EO-modified bisphenol A diacrylate, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate, EO-modified dipentaerythritol hexaacrylate, and the like. Preferable commercially available products of the copolymerizable compounds include Urethane Oligomers UAS-10 and UAB-140 (both manufactured by Sanyo Kokusaku Pulp Co., Ltd.), DPHA-40H (manufactured by Nippon Kayaku Co., Ltd.), UA-306H, UA-306T, UA-3061, AH-600, T-600, and AI-600 (all manufactured by Kyoeisha Chemical Co., Ltd.), and the like.

In addition, acid group-containing ethylenically unsaturated compounds are also preferable and include commercially available products such as TO-756 that is a carboxyl group-containing trifunctional acrylate, TO-1382 that is a carboxyl group-containing pentafunctional acrylate, both of which are manufactured by Toagosei Co., Ltd., and the like.

The polymerizable compound in the invention refers to a compound having a low molecular weight of 1000 or less, a preferable polymerizable compound is one having a trifunctional or higher polymerizable group, and a more preferable compound is one having a tetrafunctional or higher polymerizable group. Further, in the invention, two or more kinds of polymerizable compounds can be mixed in order to control the developability and sensitivity.

<(B) Binder Polymer>

A binder polymer is used for the purpose of controlling the developability, controlling the polymerizability, improving the film characteristics, and the like. As the binder, a linear organic polymer is preferably used. As such a "linear organic polymer", any known polymer may be used. In order to enable water development or weakly alkaline water development, a linear organic polymer that is soluble or swellable in water or weakly alkaline water is preferably selected. The linear organic polymer is selected and used according to an intended application not only as a film-forming agent but also as a water, weakly alkaline water, or organic solvent development agent. For example, when a water-soluble organic polymer is used, water development becomes possible. Examples of such a linear organic polymer include radical polymers having a carboxylic acid group in a side chain such as those described in JP-A No. 59-44615, JP-B No. 54-34327, JP-B No. 58-12577, JP-B No. 54-25957, JP-A No. 54-92723, JP-A No. 59-53836, and JP-A No. 59-71048, that is, a resin formed by homopolymerization or copolymerization of a carboxyl group-containing monomer, a resin formed by hydrolysis, half esterification, or half amidation of an acid anhydride unit of a homopolymer or copolymer of an acid anhydride-containing monomer, an epoxy acrylate in which an epoxy resin is modified with an unsaturated monocarboxylic acid or acid anhydride, and the like. Examples of the carboxyl group-containing monomer include acrylic acid, methacrylic acid, itaconic acid, crotonic acid, maleic acid, fumaric acid, 4-carboxylstyrene, and the like, and examples of the acid anhydride-containing monomer include maleic anhydride and the like.

Similarly, there is an acidic cellulose derivative having a carboxylic acid group in a side chain. In addition thereto, one formed by adding a cyclic acid anhydride to a polymer having a hydroxyl group is also useful.

Further, an alkali-soluble resin can be synthesized by using a sulfonic acid group-containing monomer or a phosphoric acid ester-containing monomer as an acid group.

Examples of the phosphoric acid ester-containing monomer include PHOSMER PE, PHOSMER M, PHOSMER PP, PHOSMER CL, PHOSMER MH, and the like, all manufactured by Uni-Chemical Co., Ltd. Further, examples of the sulfonic acid-containing monomer include vinyl sulfonic acid, a 3-sulfopropyl methacrylate potassium salt, a 3-sulfopropylacrylate potassium salt, a 2-acrylamide-2-methyl-1-propane sulfonic acid, and the like.

When the alkali-soluble resin is used as a copolymer, other monomers may also be used, in addition to the monomers given first as a compound for copolymerization. Examples of other monomers include the following compounds (1) to (12).

(1) Acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, 4-hydroxybutyl methacrylate, and the like.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, propargyl acrylate, and the like.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, propargyl methacrylate, and the like.

(4) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide, allyl methacrylamide, and the like.

(5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like.

(6) Vinyl esters such as vinyl acetate, vinyl chloroacetate, vinyl butyrate, vinyl benzoate, and the like.

(7) Styrenes such as styrene, α-methylstyrene, methylstyrene, chloromethylstyrene, p-acetoxystyrene, and the like.

(8) Vinyl ketones such as methyl vinyl ketone, ethyl vinyl ketone, propyl vinyl ketone, phenyl vinyl ketone, and the like.

(9) Olefins such as ethylene, propylene, isobutylene, butadiene, isoprene, and the like.

(10) N-vinylpyrrolidone, acrylonitrile, methacrylonitrile, and the like.

(11) Unsaturated imides such as maleimide, N-acryloyl acrylamide, N-acetyl methacrylamide, N-propionyl methacrylamide, N-(p-chlorobenzoyl) methacrylamide, and the like.

(12) Methacrylic acid-based monomers having a heteroatom bonded at the α-position, for example, the compounds described in Japanese Patent Application Nos. 2001-115595 and 2001-115598, or the like.

Furthermore, urethane-based binder polymers containing an acid group as described in JP-B No. 7-12004, JP-B No. 7-120041, JP-B No. 7-120042, JP-B No. 8-12424, JP-A No. 63-287944, JP-A No. 63-287947, JP-A No. 1-271741, and Japanese Patent Application No. 10-116232 and urethane-based binder polymers containing an acid group and a double bond in the side chain as described in JP-A No. 2002-107918 are very excellent in strength and thus advantageous in respect of printing durability and low-exposure suitability.

Acetal-modified polyvinyl alcohol-based binder polymers having an acid group as described in European Patent (EP) No. 993966, EP No. 1204000, JP-A No. 2001-318463, and the like are preferable because they are excellent in the balance between film strength and developability.

As other water-soluble linear organic polymers, polyvinyl pyrrolidone, polyethylene oxide, and the like are useful. To increase the strength of the cured film, alcohol-soluble nylon, polyethers of 2,2-bis-(4-hydroxyphenyl)-propane and epichlorohydrin, and the like are also useful.

The weight-average molecular weight of the binder polymer which can be used is preferably 5,000 or more, and more preferably in a range from 10,000 to 300,000, and the number-average molecular weight thereof is preferably 1,000 or more, and more preferably in a range from 2,000 to 250,000. Polydispersity (weight-average molecular weight/number-average molecular weight) is preferably 1 or more, and more preferably in a range from 1.1 to 10.

The binder polymer may be any one of a random polymer, a block polymer, a graft polymer, and the like.

The binder polymer which can be used in the invention can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, water, and the like. These solvents may be used singly or as a mixture of two or more kinds thereof.

Examples of a radical polymerization initiator which is used in the synthesis of the binder polymer that can be used for the polymerizable composition in the invention include known compounds such as an azo-based initiator, a peroxide initiator, a thiol compound, and the like.

For the invention, the polymer is preferably a resin having an ethylenically polymerizable group in the side chain from the viewpoint of sensitivity, and examples of the preferred polymerizable group include an allyl group, a methacryl ester group, an acryl ester group, and a styryl group.

The most preferable resin of the invention is one having an acid group, and a polymerizable group in the side chain. The double bond in the side chain can be obtained, for example, by adding an ethylenically unsaturated group-containing epoxy compound to the carboxyl group of an alkali-soluble resin having a carboxyl group.

Examples of the resin having a carboxyl group include 1) a resin formed by subjecting a monomer having a carboxyl group to radical polymerization or ion polymerization, 2) a resin formed by subjecting a monomer having an acid anhydride to radical or ion polymerization, and then subjecting the acid anhydride unit to hydrolysis or half esterification, 3) an epoxy acrylate formed by modifying an epoxy resin with an unsaturated monocarboxylic acid and acid anhydride, and the like.

Specific examples of the vinyl-based resin having a carboxyl group include resins prepared by subjecting monomers having a carboxyl group, for example, unsaturated carboxylic acids such as (meth)acrylic acid, 2-succinoloyloxyethyl methacrylate, 2-maleinoloyloxyethyl methacrylate, 2-phtaloyloxyethyl methacrylate, 2-hexahydrophthaloyloxyethyl methacrylate, maleic acid, fumaric acid, itaconic acid, crotonic acid, and the like to homopolymerization, and resins prepared by copolymerizing such unsaturated carboxylic acids with vinyl monomers having no carboxyl group, such as styrene, α-methyl styrene, methyl(meth)acrylate, ethyl (meth)acrylate, propyl(meth)acrylate, isopropyl(meth)acrylate, butyl(meth)acrylate, vinyl acetate, acrylonitrile, (meth) acryl amide, glycidyl(meth)acrylate, allyl glycidyl ether, glycidyl ethyl acrylate, crotonic glycidyl ether, (meth)acrylic acid chloride, benzyl(meth)acrylate, hydroxyethyl(meth) acrylate, N-methylol acryl amide, N,N-dimethyl acryl amide, N-methacryloylmorpholine, N,N-dimethylaminoethyl (meth)acrylate, N,N-dimethylaminoethyl acrylamide, and the like.

Further, resins formed by copolymerizing an anhydrous maleic acid with styrene, α-methyl styrene, or the like, and then rendering the anhydrous maleic acid unit moiety to be half-esterified with a monohydric alcohol such as methanol, ethanol, propanol, butanol, hydroxyethyl(meth)acrylate, and the like, or hydrolyzing the anhydrous maleic acid unit moiety with water are also included.

Further, a resin can be obtained by allowing a resin having an epoxy group to undergo a reaction with a compound having a nucleophilic group and a polymerizable group. The resin of the invention can also be obtained by reacting a polymer formed by the copolymerization of glycidyl methacrylate with an acrylic acid, a methacrylic acid, a hydroxyethyl methacrylate, or the like. In addition, in this case, it may be considered that the acid value is lowered, but a resin having a desired acid value can be obtained by reacting a hydroxyl group generated by the reaction of an epoxy and a carboxylic acid with an acid anhydride such as succinic acid, anhydrous maleic acid, cyclohexane dicarboxylic acid anhydride, itaconic acid anhydride, and the like.

Further, resins formed by adding unsaturated carboxylic acids such as (meth)acrylic acid, 2-succinoloyloxyethyl methacrylate, 2-maleinoloyloxyethyl methacrylate, 2-phthaloyloxyethyl methacrylate, 2-hexahydrophthaloyloxyethyl methacrylate, maleic acid, fumaric acid, itaconic acid, crotonic acid, and the like, or saturated carboxylic acids such as acetic acid, propionic acid, stearic acid, and the like to a novolak epoxy acrylate resin, a bisphenol epoxy resin, or the like, and then modifying it with an acid anhydride such as anhydrous maleic acid, anhydrous itaconic acid, anhydrous tetrahydrophthalic acid, anhydrous phthalic acid, and the like may be exemplified.

Among these, from the viewpoint of developability, a resin having a carboxyl group, in particular, a (meth)acrylic acid (co)polymerization resin containing a (meth)acrylic acid is preferable, and specific examples of the copolymer include a methyl methacrylate/methacrylic acid copolymer described in JP-A No. 60-208748, a methyl methacrylate/methyl acrylate/methacrylic acid copolymer described in JP-A No. 60-214354, a benzyl methacrylate/methyl methacrylate/ methacrylic acid/2-ethylhexyl acrylate copolymer described in JP-A No. 5-36581, a methyl methacrylate/n-butyl methacrylate/2-ethylhexyl acrylate/methacrylic acid copolymer described in JP-A No. 5-333542, a styrene/methyl methacrylate/methyl acrylate/methacrylic acid copolymer described in JP-A No. 7-261407, a methyl methacrylate/n-butyl acrylate/ 2-ethylhexyl acrylate/methacrylic acid copolymer described in JP-A No. 10-110008, a methyl methacrylate/n-butyl acrylate/2-ethylhexyl acrylate/styrene/methacrylic acid copolymer described in JP-A No. 10-198031, and the like.

As the epoxy unsaturated compound, one having a glycidyl group as an epoxy group, such as glycidyl(meth)acrylate, allyl glycidyl ether, and the like can be used, but an unsaturated compound having an alicyclic epoxy group is preferable. Examples of such a compound include the following.

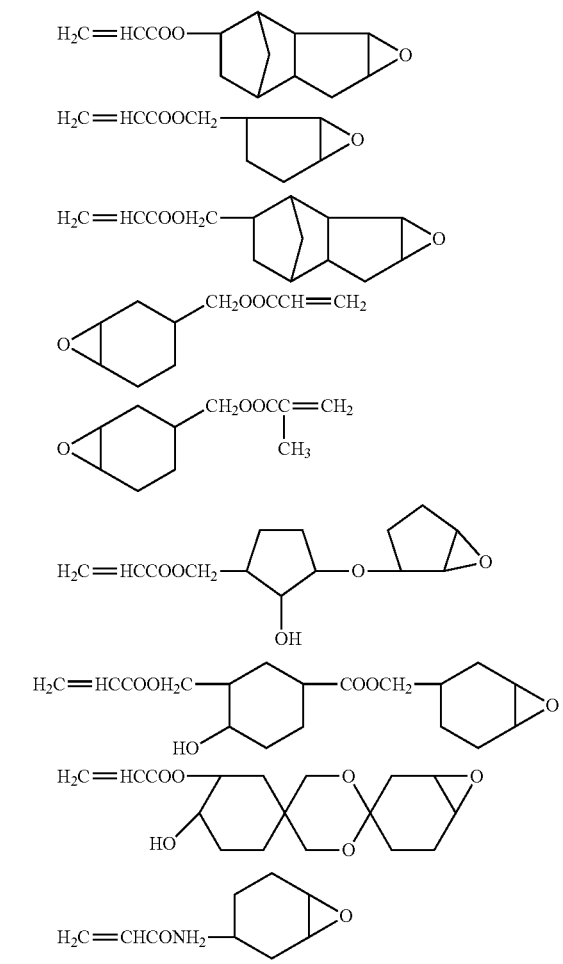

The reaction for introduction into the side chain of the resin may be carried out usually in an organic solvent at a reaction temperature from 50 to 150° C. for from a few hours to a few tens of hours in the presence of a catalyst, for example, a tertiary amine such as triethylamine, benzylmethylamine, and the like, a quaternary ammonium salt such as dodecyltriethylammonium chloride, tetramethylammonium chloride, tetraethylammonium chloride, and the like, pyridine, triphenylphosphine, or the like. If the amount of an alicyclic epoxy unsaturated compound to be introduced is controlled so that the acid value of the resin is in the range from 5 to 200 KOH·mg/g, it will be preferable from the viewpoint of the alkali developability. Further, the weight-average molecular weight of (B) the binder polymer is preferably in the range from 500 to 5,000,000, and more preferably in the range from 1000 to 500,000.

Furthermore, (B) the binder polymer in the invention is preferably a polymer compound having at least one selected from the structural units represented by any one of the following general formulae (B1) to (B3) as an unsaturated double bond moiety.

General Formula (B1)

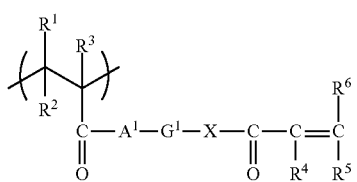

General Formula (B2)

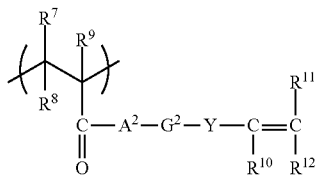

General Formula (B3)

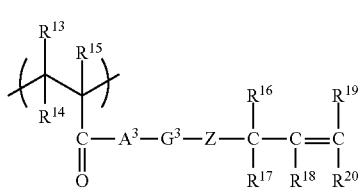

In the general formulae (B1) to (B3), $A^1$, $A^2$, and $A^3$ each independently represent an oxygen atom, a sulfur atom, or —N($R^{21}$)—, wherein $R^{21}$ represents an alkyl group which may have a substituent. $G^1$, $G^2$, and $G^3$ each independently represent a divalent organic group. X and Z each independently represent an oxygen atom, a sulfur atom, or —N($R^{22}$)—, wherein $R^{22}$ represents an alkyl group which may have a substituent. Y represents a single bond, an oxygen atom, a sulfur atom, a phenylene group which may have a substituent, or —N($R^{23}$)—, wherein $R^{23}$ represents an alkyl group which may have a substituent. $R^1$ to $R^{20}$ each independently represent a monovalent substituent.

In the general formula (B1), $R^1$ to $R^3$ each independently represent a monovalent substituent, and examples thereof include a hydrogen atom, an alkyl group which may further have a substituent, and the like. Among these, $R^1$ and $R^2$ are preferably hydrogen atoms, while $R^3$ is preferably a hydrogen atom or a methyl group.

$R^4$ to $R^6$ each independently represent a monovalent substituent, and examples of $R^4$ include a hydrogen atom, an alkyl group which may further have a substituent, and the like. Among these, a hydrogen atom, a methyl group, or an ethyl group is preferred. $R^5$ and $R^6$ each independently represent, for example, a hydrogen atom, a halogen atom, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, an arylsulfonyl group which may further have a substituent, or the like. Among these, a hydrogen atom, an alkoxycarbonyl group, an alkyl group which may further have a substituent, and an aryl group which may further have a substituent are preferred.

Here, examples of the substituent which may be introduced include a methoxycarbonyl group, an ethoxycarbonyl group, an isopropyloxycarbonyl group, a methyl group, an ethyl group, a phenyl group, and the like.

$A^1$ represents an oxygen atom, a sulfur atom, or —N($R^{21}$)— and X represents an oxygen atom, a sulfur atom, or —N($R^{22}$)—, wherein $R^{21}$ and $R^{22}$ may be an alkyl group which may have a substituent.

$G^1$ represents a divalent organic group, but it is preferably an alkylene group which may have a substituent. More preferably, $G^1$ may be an alkylene group having 1 to 20 carbon atoms, which may have a substituent, a cycloalkylene group having 3 to 20 carbon atoms, which may have a substituent, an aromatic group having 6 to 20 carbon atoms, which may have a substituent, and the like, and among them, a linear or branched alkylene group having 1 to 10 carbon atoms, which may have a substituent, a cycloalkylene group having 3 to 10 carbon atoms, which may have a substituent, and an aromatic group having 6 to 12 carbon atoms, which may have a substituent, are preferable in view of performance such as strength, developability, and the like.

Here, the substituent for $G^1$ is preferably a hydroxyl group.

In the general formula (B2), $R^7$ to $R^9$ each independently represent a monovalent substituent, and examples thereof include a hydrogen atom, an alkyl group which may further have a substituent, and the like. Among these, $R^7$ and $R^8$ are preferably hydrogen atoms, while $R^9$ is preferably a hydrogen atom or a methyl group.

$R^{10}$ to $R^{12}$ each independently represent a monovalent substituent, and specific examples of this substituent include a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, an arylsulfonyl group which may have a substituent, and the like. Among these, a hydrogen atom, an alkoxycarbonyl group, an alkyl group which may have a substituent, and an aryl group which may have a substituent are preferred.

Here, examples of the substituents which may be introduced include the same groups as those mentioned for the formula (B1).

$A^2$'s each independently represent an oxygen atom, a sulfur atom, or —N($R^{21}$)—, and $R^{21}$ may be a hydrogen atom, an alkyl group which may have a substituent, and the like.

$G^2$ represents a divalent organic group, but is preferably an alkylene group which may have a substituent. Preferably, $G^2$ is an alkylene group having 1 to 20 carbon atoms, which may have a substituent, a cycloalkylene group having 3 to 20 carbon atoms, which may have a substituent, an aromatic group having 6 to 20 carbon atoms, which may have a substituent, and the like, and among them, a linear or branched alkylene group having 1 to 10 carbon atoms, which may have a substituent, a cycloalkylene group having 3 to 10 carbon atoms, which may have a substituent, and an aromatic group having 6 to 12 carbon atoms, which may have a substituent, are preferable in view of performance such as strength and developability.

Herein, the substituent for $G^2$ is preferably a hydroxyl group.

Y represents a single bond, an oxygen atom, a sulfur atom, —N($R^{23}$)—, or a phenylene group which may have a substituent, wherein $R^{23}$ may be a hydrogen atom, an alkyl group which may have a substituent, and the like.

In the general formula (B3), $R^{13}$ to $R^{15}$ each independently represent a monovalent substituent, and examples thereof include a hydrogen atom, an alkyl group which may have a substituent, and the like. Among these, $R^{13}$ and $R^{14}$ are preferably hydrogen atoms, while $R^{15}$ is preferably a hydrogen atom or a methyl group.

$R^{16}$ to $R^{20}$ each independently represent a monovalent substituent, and examples of $R^{16}$ to $R^{20}$ include a hydrogen atom, a halogen atom, a dialkylamino group, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, an arylsulfonyl group which may further have a substituent, and the like. Among these, a hydrogen atom, an alkoxycarbonyl group, an alkyl group which may have a substituent, and an aryl group which may have a substituent are preferred. Examples of the substituents which may be introduced include the same groups as those mentioned for the general formula (B1).

$A^3$ represents an oxygen atom, a sulfur atom, or —N($R^{21}$)—, while Z represents an oxygen atom, a sulfur atom, or —N($R^{22}$)—. Examples of $R^{21}$ and $R^{22}$ may be the same groups as those mentioned for the general formula (B1).

$G^3$ represents a divalent organic group, but it is preferably an alkylene group which may have a substituent. Preferably, $G^3$ may be an alkylene group having 1 to 20 carbon atoms, which may have a substituent, a cycloalkylene group having 3 to 20 carbon atoms, which may have a substituent, an aromatic group having 6 to 20 carbon atoms, which may have a substituent, and the like. Among these, a linear or branched alkylene group having 1 to 10 carbon atoms, which may have a substituent, a cycloalkylene group having 3 to 10 carbon atoms, which may have a substituent, and an aromatic group having 6 to 12 carbon atoms, which may have a substituent, are preferable in view of performance such as strength and developability.

Herein, the substituent for $G^3$ is preferably a hydroxyl group.

As (B) the binder polymer of the invention, a compound containing the structural units represented by the general formulae (B1) to (B3) in an amount ranging from 20% by mole or more to less than 95% by mole in one molecule, is preferred from the viewpoints of improved curability and reduced development residue. The amount of the structural units is more preferably in the range from 25 to 90% by mole, and even more preferably from 30% by mole or more to less than 85% by mole.

The synthesis of the polymer compound having a structural unit represented by the formulae (B1) to (B3) may be performed on the basis of the synthesis methods described in JP-A No. 2003-262958, Paragraph Nos. [0027] to [0057]. Among these, synthesis method 1) in the same publication is preferred, and this method will be described in the synthesis method (1) as follows.

Specific examples of the polymer compound having a structural unit represented by the formulae (B1) to (B3) include the following polymer compounds 1 to 17.

| Polymer compound | Composition (% by mole) | Mw |
|---|---|---|
| 1 | | 2980 |
| 2 | | 1340 |
| 3 | | 1950 |

| Polymer compound | Composition (% by mole) | Mw |
|---|---|---|
| 4 | 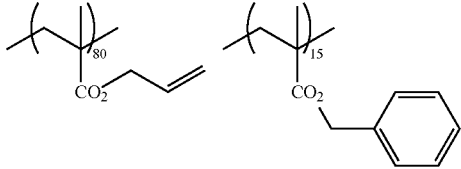 | 960 |
| 5 | 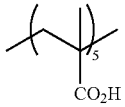 | 3560 |
| 6 | 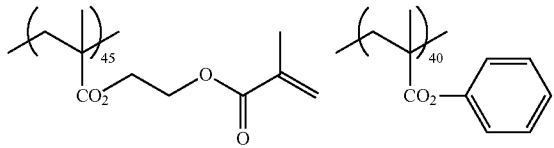 | 2460 |
| 7 | 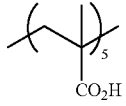 | 3980 |
| 8 | 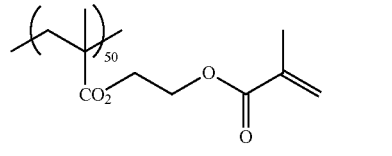 | 3350 |

| Polymer compound | Composition (% by mole) | Mw |
|---|---|---|
| | 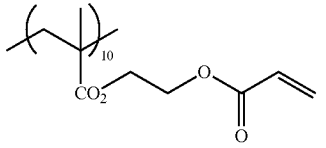 | |
| 9 | 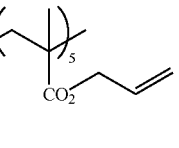 | 2860 |
| 10 | 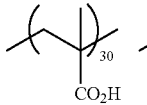 | 2130 |
| 11 |  | 3720 |
| 12 | 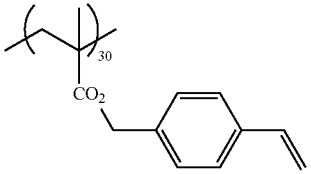 | 3110 |

-continued
| Polymer compound | Composition (% by mole) | Mw |
|---|---|---|
| 13 | 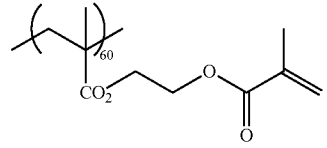 | 3730 |
| 14 | 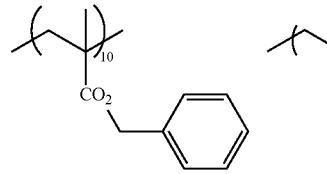 | 2760 |
| 15 | 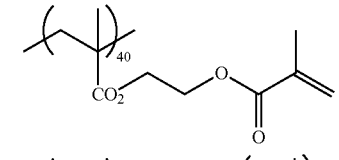 | 3240 |
| 16 | 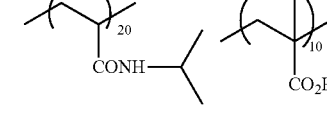 | 1650 |
| 17 | 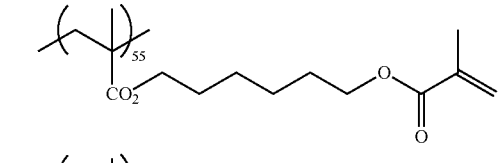 | 2530 |

Moreover, the resins obtained by the following synthesis method (1) or (2) may be preferably mentioned.

(1) A method of extracting a proton using a base from a polymer in which a compound represented by the following general formula (A4) is used as a copolymerizing component, and eliminating L to obtain a desired polymer compound having the structure represented by the general formula (B1).

Further, in the general formula (A4), L represents an anionic leaving group, and is preferably a halogen atom, a sulfonic acid ester, or the like. $R^3$ to $R^6$, $A^1$, $G^1$, and X have the same meanings as defined above for the general formula (B1), and as the base used to generate an elimination reaction, either inorganic compounds or organic compounds may be used. In addition, the details and preferred embodiments of this method are described in Paragraph Nos. [0028] to [0033] of JP-A No. 2003-262958.

Examples of the preferred inorganic compound bases include sodium hydroxide, potassium hydroxide, sodium carbonate, sodium hydrogen carbonate, potassium carbonate, potassium hydrogen carbonate, and the like. Examples of the organic compound bases include metal alkoxides such as sodium methoxide, sodium ethoxide, and potassium t-butoxide, organic amine compounds such as triethylamine, pyridine, and diisopropylethylamine, and the like.

(2) A method of subjecting a polymer in which a compound represented by the following general formula (A5) is used as a copolymerization component, to an elimination reaction for a specific functional group involving a treatment with base, and thus removing $X^{10}$ to obtain a radical reactive group.

Further, in the general formula (A5), $A^5$ represents an oxygen atom, a sulfur atom, or —N($R^{54}$)—, $A^6$ represents an oxygen atom, a sulfur atom, or —$NR^{58}$—, $R^{51}$, $R^{52}$, $R^{53}$, $R^{54}$, $R^{55}$, $R^{56}$, $R^{57}$, and $R^{58}$ each independently represent a hydrogen atom or a monovalent organic group, $X^{10}$ represents a group which is removed by the elimination reaction, $G^5$ represents an organic linking group, and n represents an integer of 1 to 10. Further, the detailed and preferred embodiments of this method are described in detail in JP-A No. 2003-335814.

Preferable examples of the resin obtained by the synthesis method (2) include the polymer compounds described in JP-A No. 2003-335814, specifically, for example, (i) polyvinyl-based polymer compounds, (ii) polyurethane-based polymer compounds, (iii) polyurea-based polymer compounds, (iv) poly(urethane-urea)-based polymer compounds, (v) polyester-based polymer compounds, (vi) polyamide-based polymer compounds, (vii) acetal-modified polyvinyl alcohol-based polymer compounds, and specific compounds obtained from each of these descriptions.

General Formula (A4)

General Formula (A5)

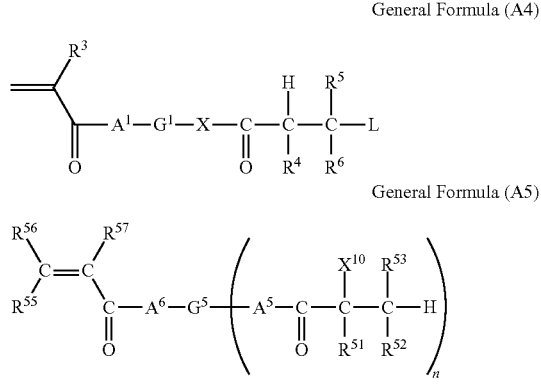

Examples of the compound represented by the general formula (A4) include, but are not limited to, the compounds (M-1) to (M-12) as set forth below.

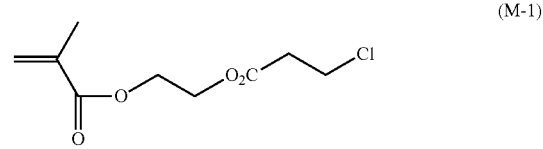
(M-1)

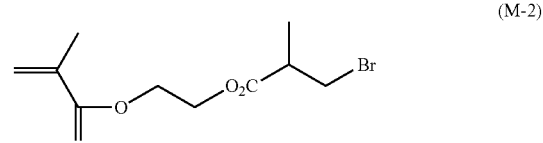
(M-2)

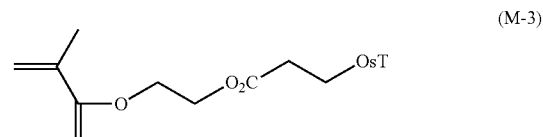
(M-3)

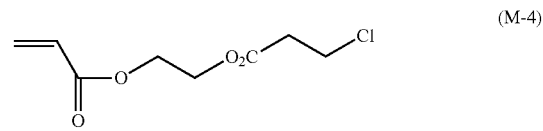
(M-4)

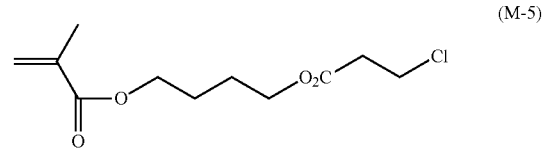
(M-5)

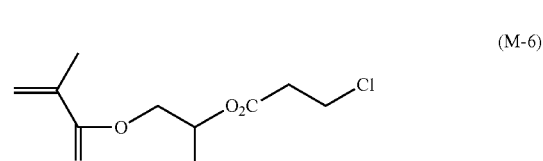
(M-6)

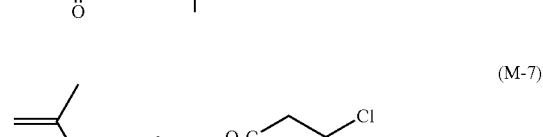
(M-7)

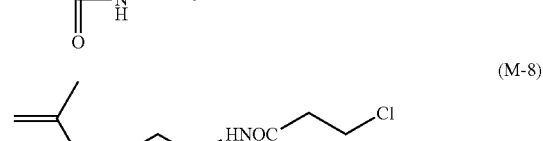
(M-8)

(M-9)

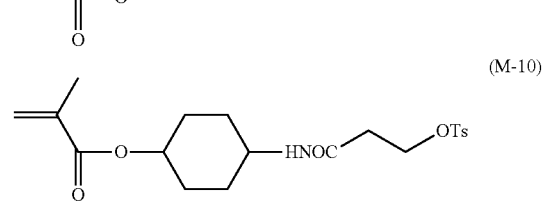
(M-10)

(M-11)
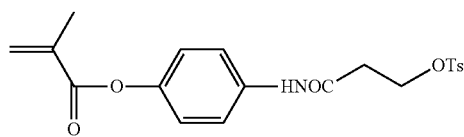
(M-12)
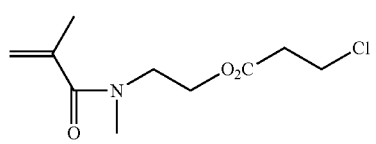
Next, examples (i-1 to i-52) of the compound represented by the general formula (A5) above will be listed below.
i-1
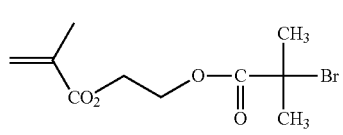
i-2
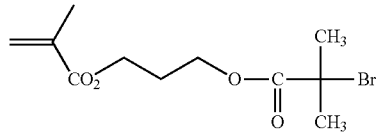
i-3
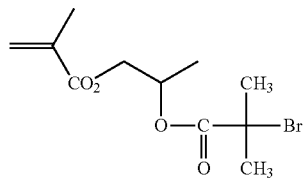
i-4
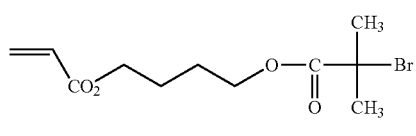
i-5
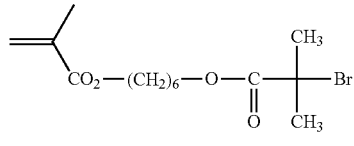
i-6
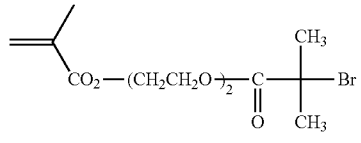
i-7
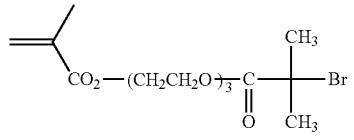
i-8
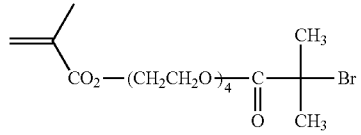
i-9
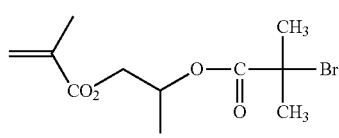
i-10
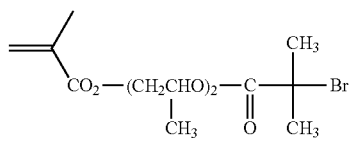
i-11
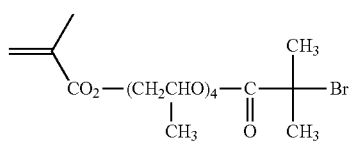
i-12
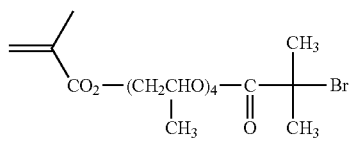
i-13
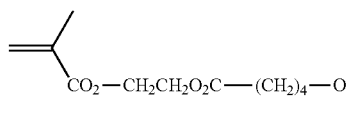
i-14
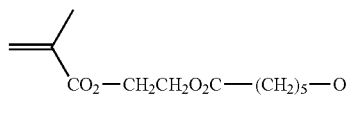
i-15
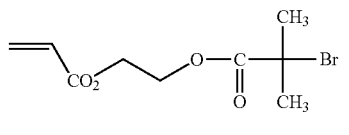
i-16
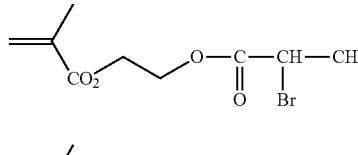
i-17
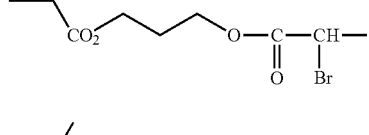
i-18
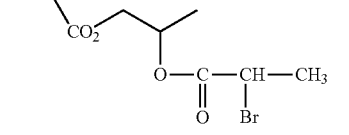
i-19
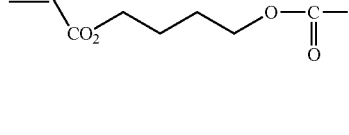

i-20 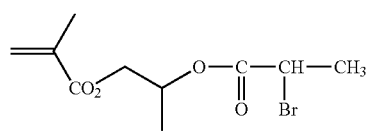
i-21 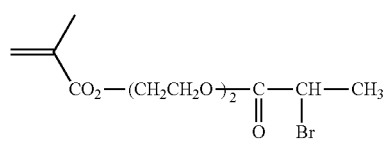
i-22 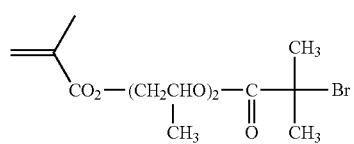
i-23 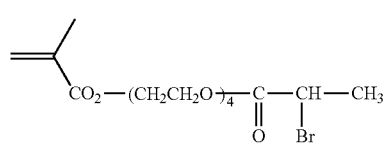
i-24 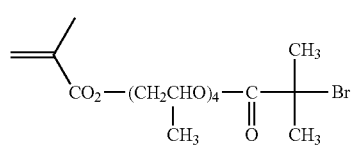
i-25 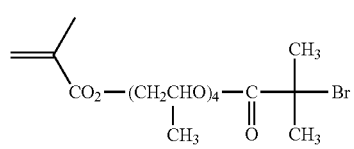
i-26 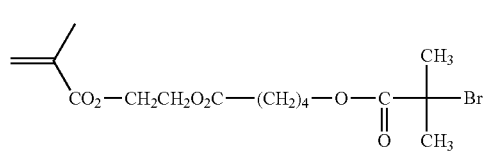
i-27 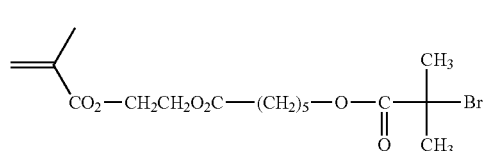
i-28 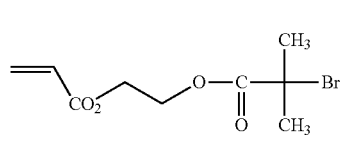
i-29 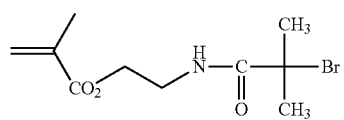
i-30 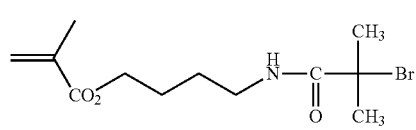
i-31 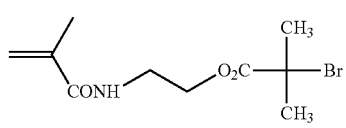
i-32 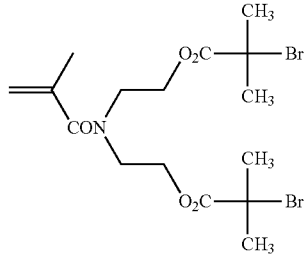
i-33 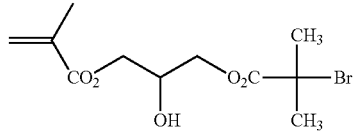
i-34 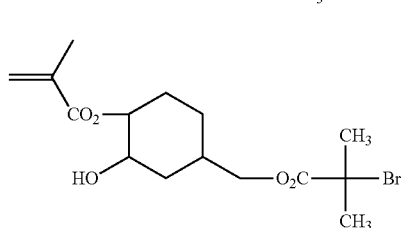
i-35 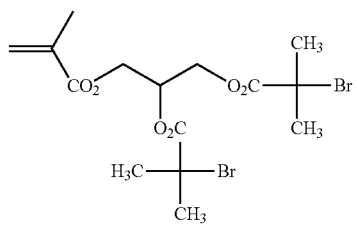
i-36 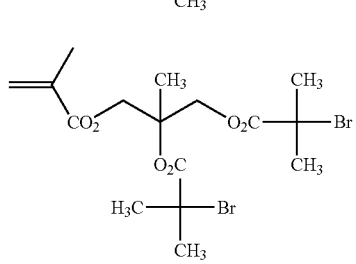
i-37 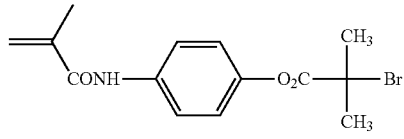
i-38 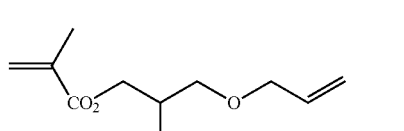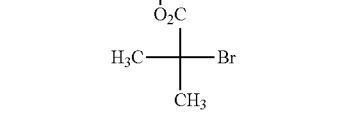

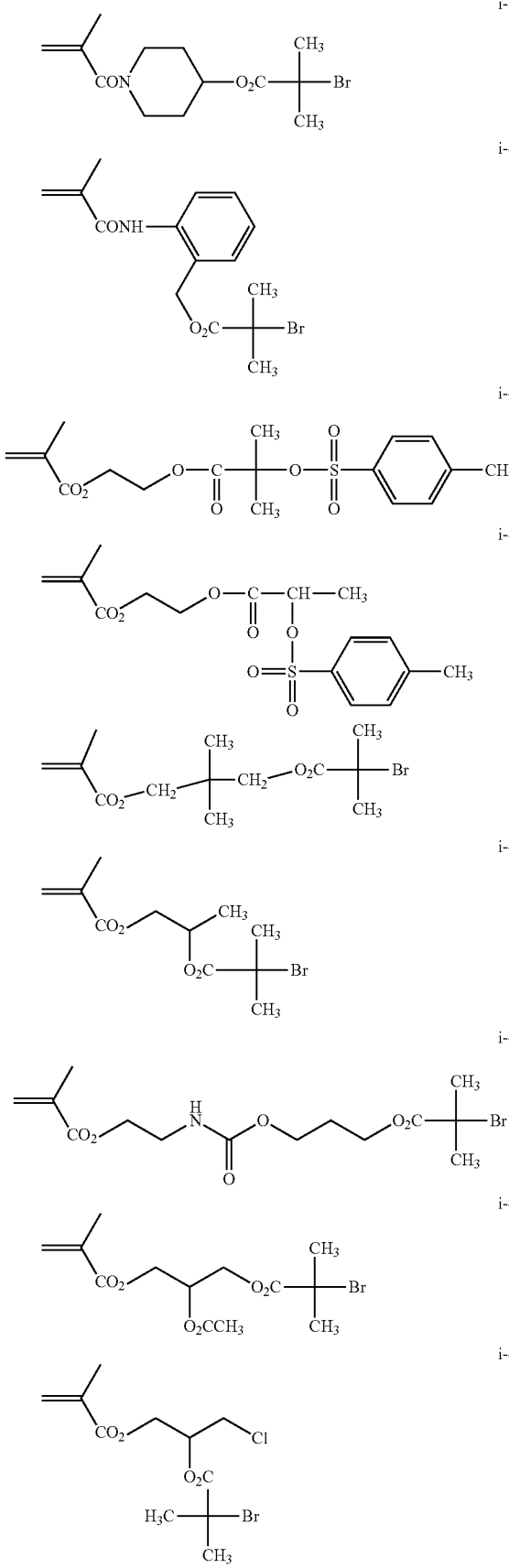
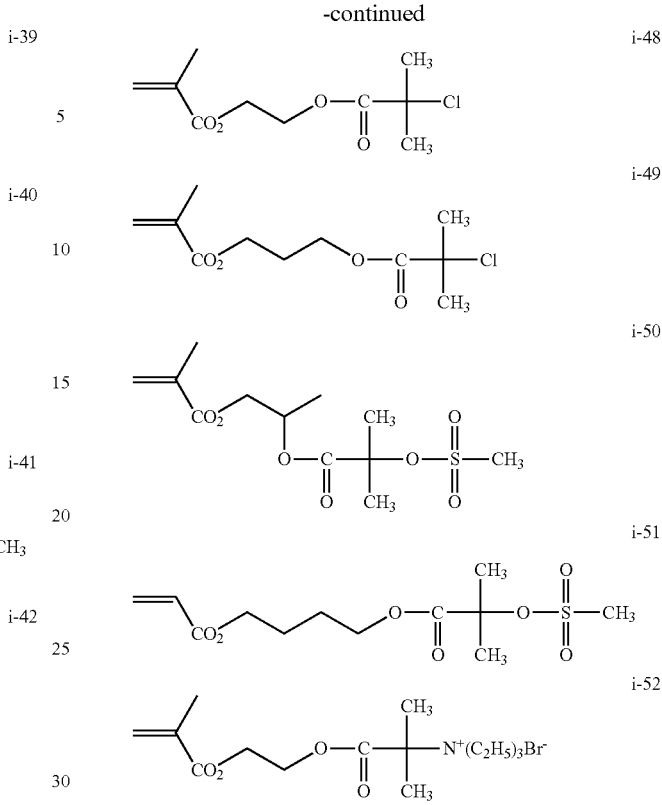

(B) The binder polymer in the invention preferably has a photopolymerizable unsaturated bond from the viewpoint of improving photosensitivity, and preferably has COOH, $SO_3H$, $PO_3H_2$, $OSO_3H$, or $OPO_2H_2$ from the viewpoint of enabling alkali development. Further, (B) the binder polymer of the invention also preferably has an acid value in the range from 20 to 300 KOH·mg/g, preferably from 40 to 200 KOH·mg/g, and more preferably from 60 to 150 KOH·mg/g, from the viewpoint of dispersion stability and the balance of developability and sensitivity.

Examples of the monomer which can be used as a copolymerization monomer in the synthesis of (B) the binder polymer of the invention include the following (1) to (13).

(1) Monomers having a carboxyl group, such as acrylic acid, methacrylic acid, itaconic acid, crotonic acid, maleic acid, fumaric acid, 4-carboxylstyrene and the like. Acidic cellulose derivatives having a carboxyl group in the side chain may also be used.

(2) Monomers having a hydroxyl group, such as acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, 4-hydroxybutyl methacrylate, and the like, and ethyleneoxy-modified products thereof, hydroxystyrene, and the like.

(3) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, propargyl acrylate, and the like.

(4) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, propargyl methacrylate, and the like.

(5) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide, allyl methacrylamide, and the like.

6) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like.

(7) Vinyl esters such as vinyl acetate, vinyl chloroacetate, vinyl butyrate, vinyl benzoate, and the like.

(8) Styrenes such as styrene, α-methylstyrene, methylstyrene, chloromethylstyrene, p-acetoxystyrene, and the like.

(9) Vinyl ketones such as methyl vinyl ketone, ethyl vinyl ketone, propyl vinyl ketone, phenyl vinyl ketone, and the like.

(10) Olefins such as ethylene, propylene, isobutylene, butadiene, isoprene, and the like.

(11) N-vinylpyrrolidone, acrylonitrile, methacrylonitrile, and the like.

(12) Unsaturated imides such as maleimide, N-acryloyl acrylamide, N-acetyl methacrylamide, N-propionyl methacrylamide, N-(p-chlorobenzoyl) methacrylamide, and the like.

(13) Methacrylic acid monomers having a heteroatom bonded at the α-position. For example, the compounds described in JP-A No. 2002-309057, JP-A No. 2002-311569, and the like.

Further, non-acryl-based resins having a polymerizable group in the side chain can also be used in the invention, in addition to the (meth)acryl-based resins, as (B) the binder polymer of the present invention.

Specific examples of such a binder polymer include a urethane resin, a novolak resin, an acetal resin, a styrene-based resin, a polyester-based resin, a polyamide-based resin, a polyurea resin, and a polyimide resin, which each have an ethylenically unsaturated bond in the side chain, and among these, a urethane resin (hereinafter suitably referred to as a "specific urethane resin") and a styrene-based resin (hereinafter suitably referred to as a "specific styrene-based resin") are particularly preferable in view of the efficacy thereof.

First, as a preferred embodiment of the invention, specific urethane resins will be described in detail.

(Urethane Resin Having Ethylenically Unsaturated Bond in Side Chain)

Examples of the specific urethane resin used in the invention include those having at least one functional group represented by the following general formulae (1) to (3) in the side chain. First, the functional groups represented by the following general formulae (1) to (3) will be described.

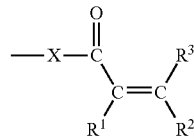

General Formula (1)

In the general formula (1), $R^1$ to $R^3$ each independently represent a hydrogen atom or a monovalent organic group. Examples of $R^1$ preferably include a hydrogen atom, an alkyl group which may have a substituent, and the like. Among these, a hydrogen atom and a methyl group are more preferred in view of high radical reactivity. $R^2$ and $R^3$ each independently represent, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, and the like. Among these, a hydrogen atom, a carboxyl group, an alkoxycarbonyl group, an alkyl group which may have a substituent, and an aryl group which may have a substituent are preferred in view of high radical reactivity.

X represents an oxygen atom, a sulfur atom, or —N($R^{12}$)—, and $R^{12}$ represents a hydrogen atom or a monovalent organic group. Examples of $R^{12}$ include an alkyl group which may have a substituent, and the like. Among these, a hydrogen atom, a methyl group, an ethyl group, and an isopropyl group are preferred in view of high radical reactivity.

Herein, examples of the substituent which can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group, an arylsulfonyl group, and the like.

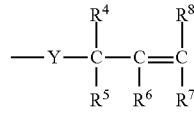

General Formula (2)

In the general formula (2), $R^4$ to $R^8$ each independently represent a hydrogen atom or a monovalent organic group. $R^4$ to $R^8$ each preferably represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, or the like. Among these, a hydrogen atom, a carboxyl group, an alkoxycarbonyl group, an alkyl group which may have a substituent, and an aryl group which may have a substituent are more preferred.

Examples of the substituent which can be introduced are the same as those for the general formula (1). Y represents an oxygen atom, a sulfur atom, or —N($R^{12}$)—. $R^{12}$ has the same meaning as $R^{12}$ in the general formula (1) and preferred examples thereof are also the same.

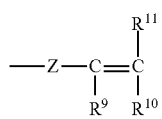

General Formula (3)

In the general formula (3), $R^9$ to $R^{11}$ each independently represent a hydrogen atom or a monovalent organic group, but examples of $R^9$ preferably include a hydrogen atom, an alkyl group which may have a substituent, and the like. Among these, a hydrogen atom and a methyl group are preferred in view of high radical reactivity. $R^{10}$ and $R^{11}$ each independently represent, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, or the like. Among these, a hydrogen atom, a carboxyl group, an alkoxycarbonyl group, an alkyl group which may have a substituent, and an aryl group which may have a substituent are preferred in view of high radical reactivity.

Herein, examples of the substituent which can be introduced are the same as those for the general formula (1). Z represents an oxygen atom, a sulfur atom, —N($R^{13}$)—, or a phenylene group which may have a substituent. $R^{13}$ represents a hydrogen atom or a monovalent organic group, but examples of $R^{13}$ include an alkyl group which may have a substituent, and the like. Among these, a methyl group, an ethyl group, and an isopropyl group are preferred in view of high radical reactivity.

Next, the basic skeleton of the specific urethane resin according to the invention will be described below.

The specific urethane resin according to the invention is a polyurethane resin having a basic skeleton including a structural unit which is a reaction product of at least one diisocyanate compound represented by the following general formula (4) and at least one diol compound represented by the general formula (5) (hereinafter referred to as a "specific polyurethane resin").

  (4)

  (5)

In the general formulae (4) and (5), $X^0$ and $Y^0$ each independently represent a divalent organic residue.

When at least either one of the diisocyanate compound represented by the general formula (4) or the diol compound represented by the general formula (5) contains at least one group represented by the general formulae (1) to (3), a specific polyurethane resin having the group represented by the general formulae (1) to (3) introduced into the side chain is produced as a reaction product of this diisocyanate compound and diol compound. According to such a method, the specific polyurethane resin for use in the invention can be more easily produced than when a desired side chain is substituted and introduced after the reaction and production of a polyurethane resin.

1) Diisocyanate Compound

The diisocyanate compound represented by the general formula (4) may be a reaction product obtained by addition-reacting, for example, a triisocyanate compound with one equivalent of a monofunctional alcohol or monofunctional amine compound having an unsaturated group.

Examples of the triisocyanate compound include, but are not limited to, those as set forth below.

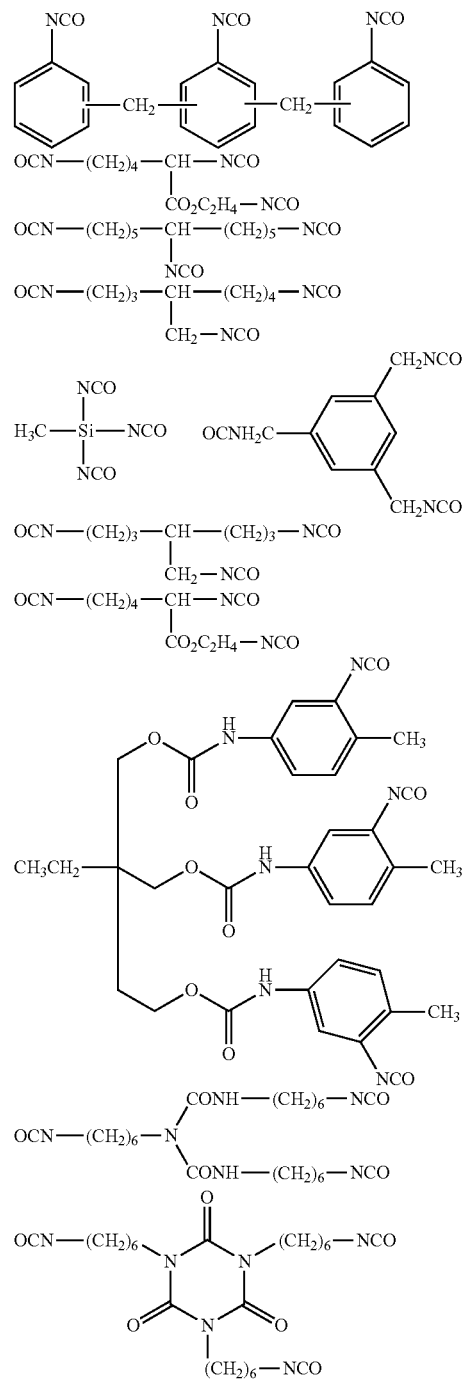

Examples of the monofunctional alcohol or monofunctional amine compound having an unsaturated group include, but are not limited to, those set forth below.

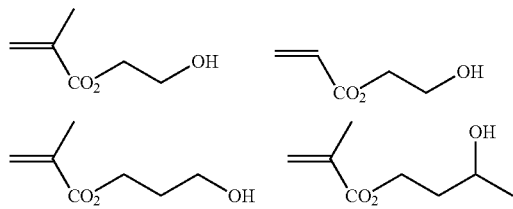

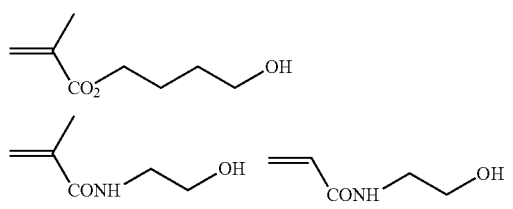

n is an integer of 2 to 10

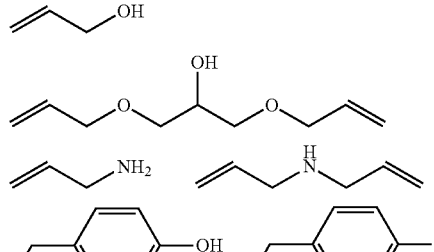

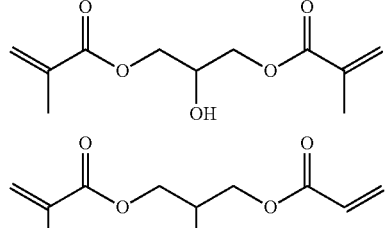

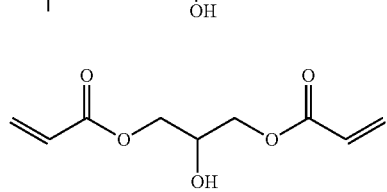

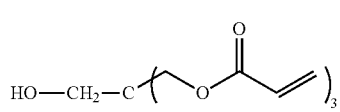

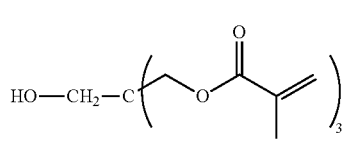

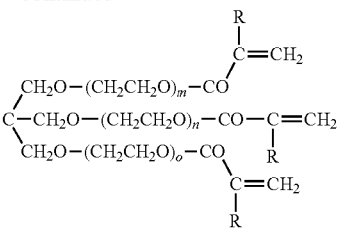

R = hydrogen or a methyl group
l, m, n, o = an integer of 1 to 20

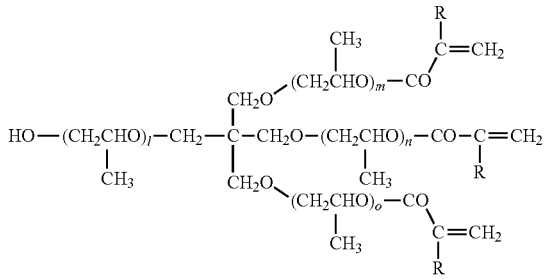

R = hydrogen or a methyl group
l, m, n, o = an integer of 1 to 20

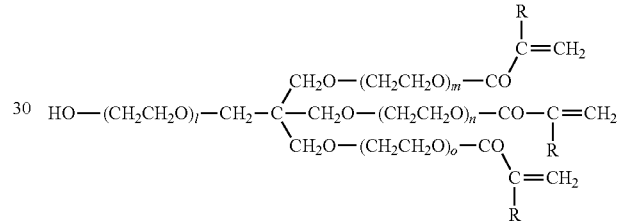

R = hydrogen or a methyl group
l, m, n, o = an integer of 1 to 20

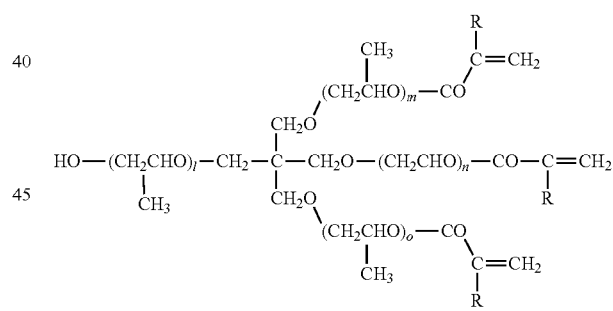

R = hydrogen or a methyl group
l, m, n, o = an integer of 1 to 20

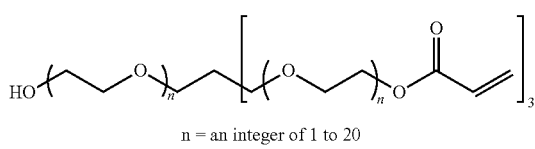

n = an integer of 1 to 20

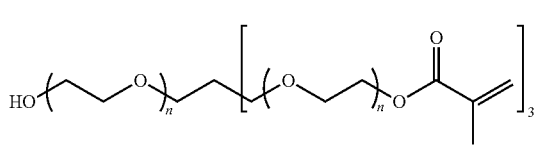

n = an integer of 1 to 20

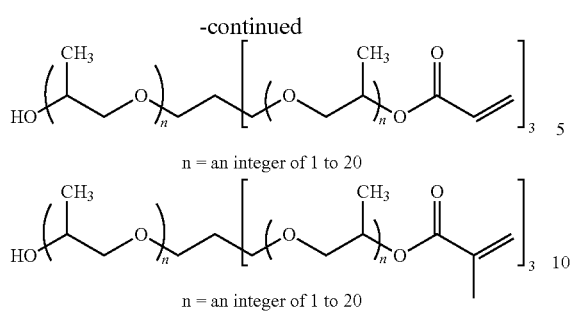

n = an integer of 1 to 20

Here, as for the method of introducing an unsaturated group into the side chain of the polyurethane resin, a method where a diisocyanate compound containing an unsaturated group in the side chain is used as a raw material in the preparation of the polyurethane resin is preferred. Examples of the diisocyanate compound having an unsaturated group in the side chain, which can be obtained by the addition-reaction of a triisocyanate compound with one equivalent of a monofunctional alcohol or monofunctional amine compound having an unsaturated group, include, but are not limited to, those set forth below.

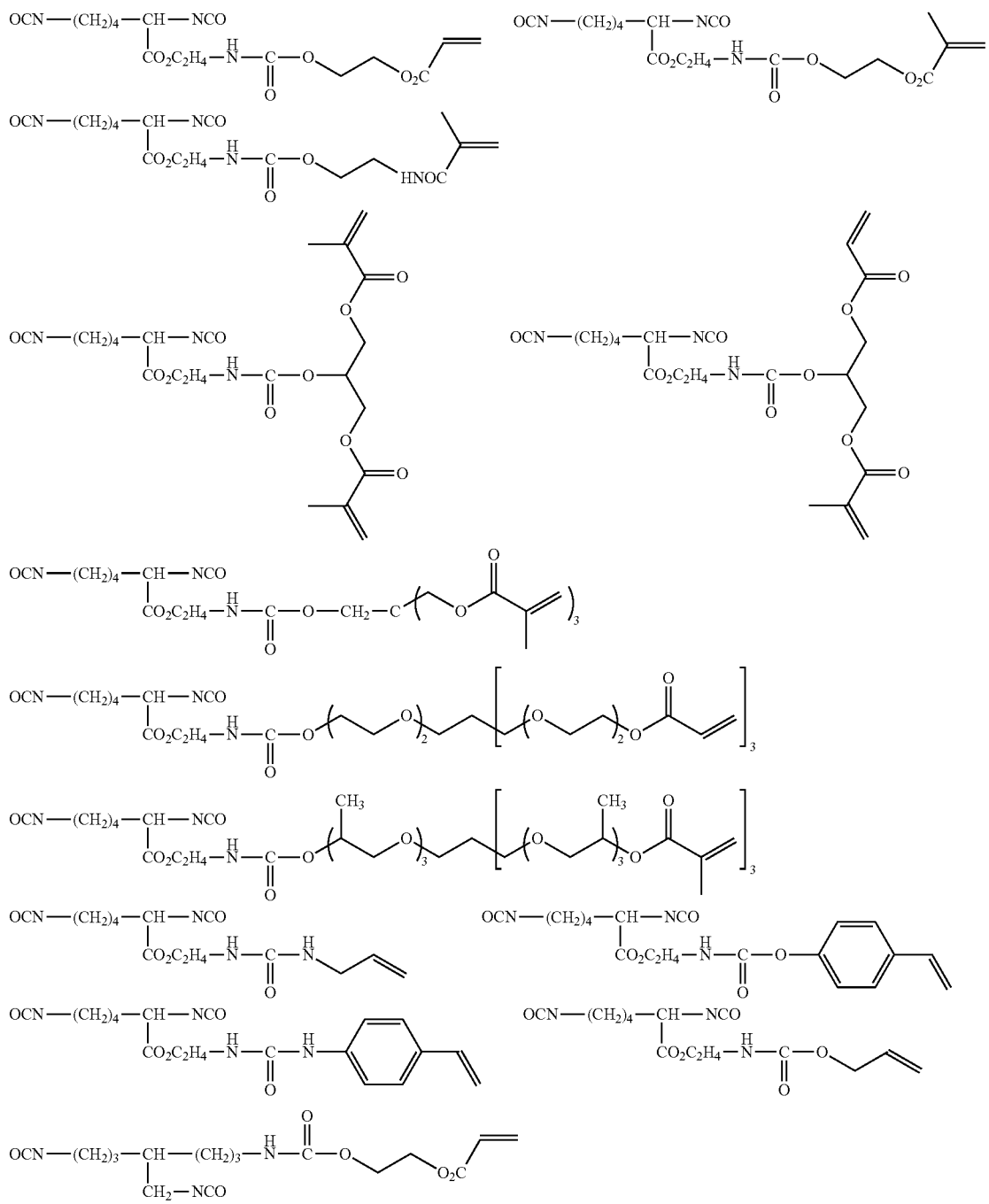

-continued
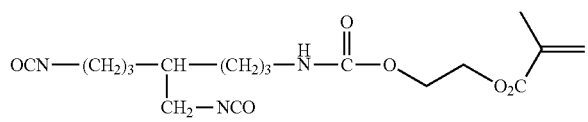 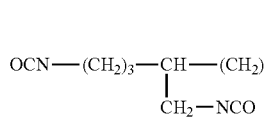 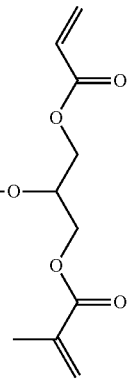
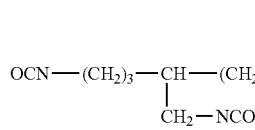 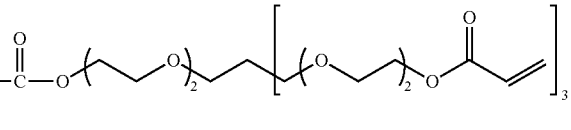
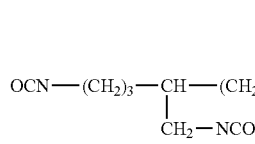 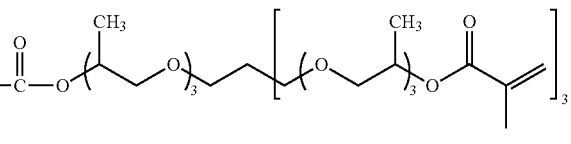
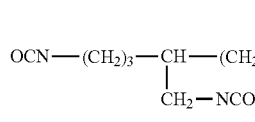 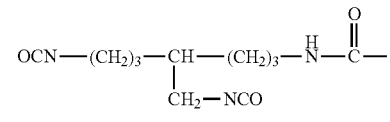
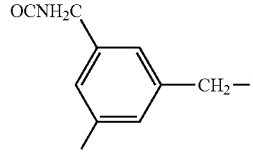 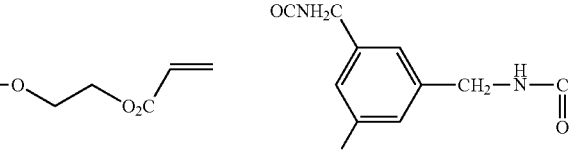
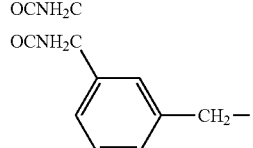 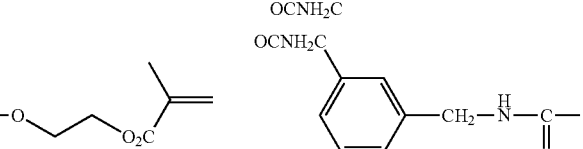
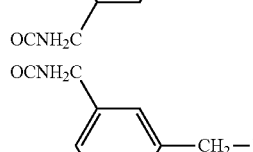 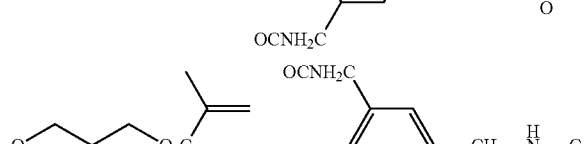
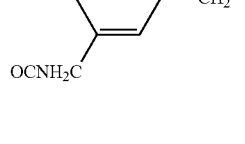 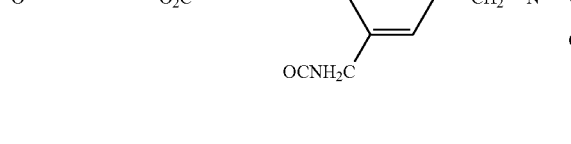
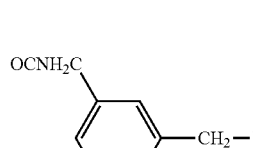 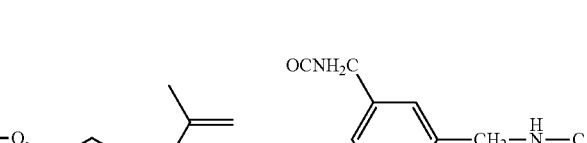 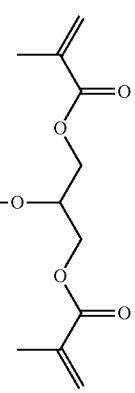

-continued
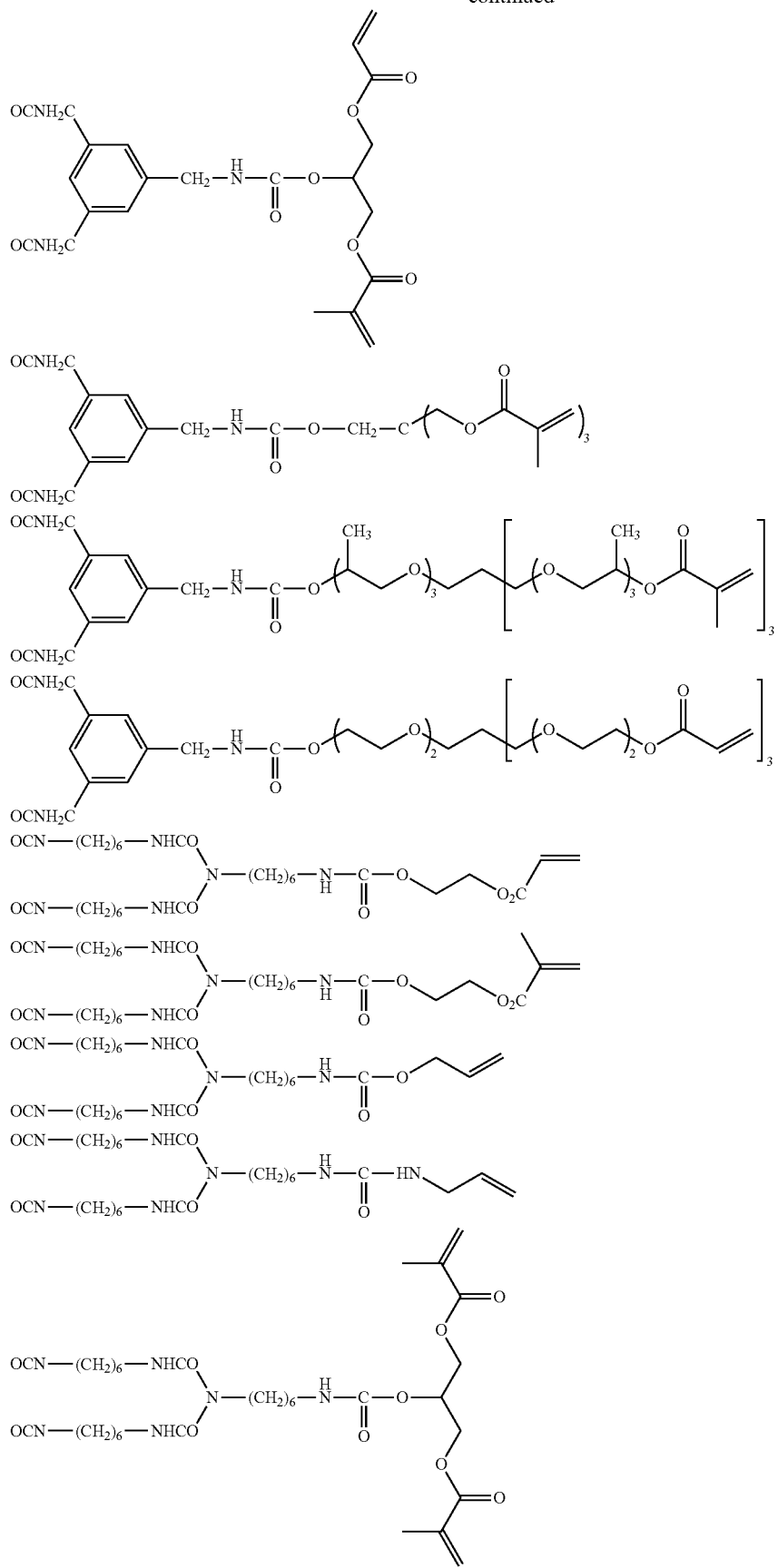

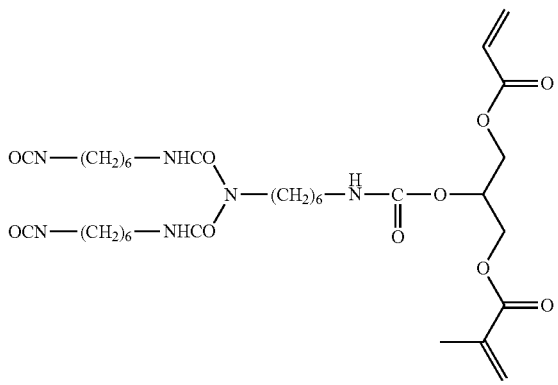

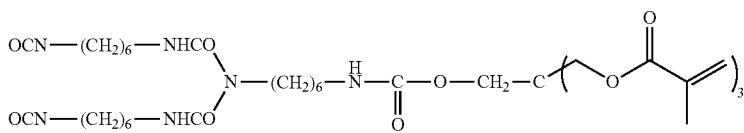

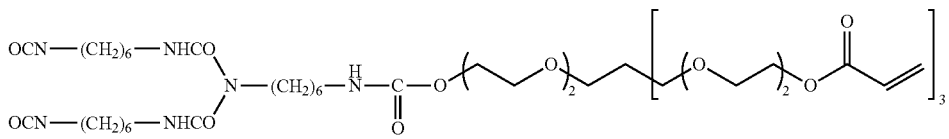

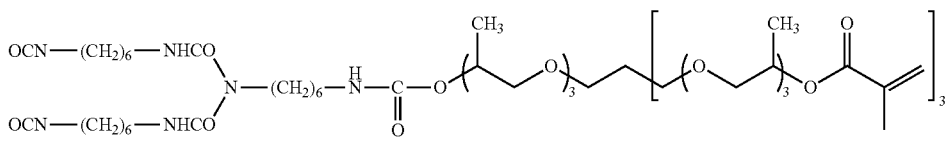

In the specific polyurethane resin used in the invention, a diisocyanate compound other than the above-described diisocyanate compound having an unsaturated group may be copolymerized, for example, from the standpoint of elevating compatibility with other components in the polymerizable composition and enhancing the storage stability.

Examples of the diisocyanate compound which is copolymerized include the following, and a preferable compound is a diisocyanate compound represented by the following general formula (6).

In the general formula (6), $L^1$ represents a divalent aliphatic or aromatic hydrocarbon group which may have a substituent. If desired, $L^1$ may contain another functional group which does not react with the isocyanate group, such as an ester group, a urethane group, an amide group, and a ureido group.

Specific examples of the diisocyanate compound represented by the general formula (6) include the following:

aromatic diisocyanate compounds such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, and the like;

aliphatic diisocyanate compounds such as hexamethylene diisocyanate, trimethylhexamethylene diisocyanate, lysine diisocyanate, dimeric acid diisocyanate, and the like;

alicyclic diisocyanate compounds such as isophorone diisocyanate, 4,4'-methylenebis(cyclohexylisocyanate), methylcyclohexane-2,4(or 2,6)-diisocyanate, 1,3-(isocyanatomethyl)cyclohexane, and the like; and diisocyanate compounds which are a reaction product of a diol with a diisocyanate, such as an adduct of 1 mole of 1,3-butylene glycol and 2 moles of tolylene diisocyanate, and the like; and others.

2) Diol Compound

Examples of the diol compound represented by the general formula (5) include a wide range of polyether diol compounds, polyester diol compounds, polycarbonate diol compounds, and the like.

Here, as for the method of introducing an unsaturated group into the side chain of the polyurethane resin, in addition to the method described above, a method where a diol compound containing an unsaturated group in the side chain is used as a raw material in the production of the polyurethane resin is preferred. This diol compound may be, for example, a commercially available product such as trimethylolpropane monoallyl ether, or a compound easily produced by the reaction of a halogenated diol compound, a triol compound, or an aminodiol compound with a carboxylic acid, an acid chloride, an isocyanate, an alcohol, an amine, a thiol, or a halogenated alkyl compound having an unsaturated group. Specific examples of such a compound include, but are not limited to, the compounds as set forth below.

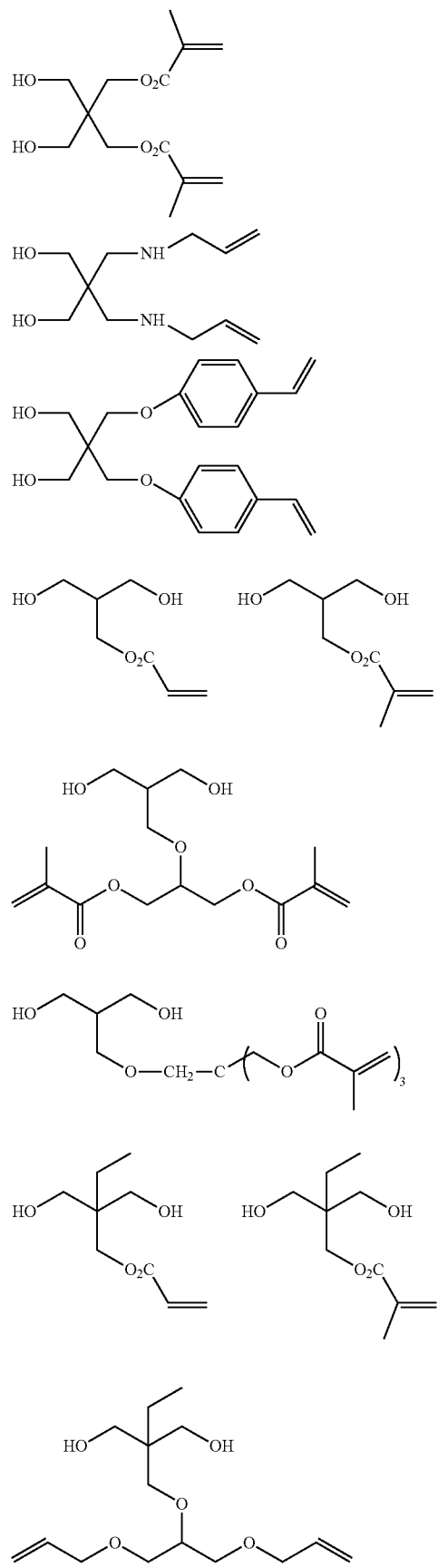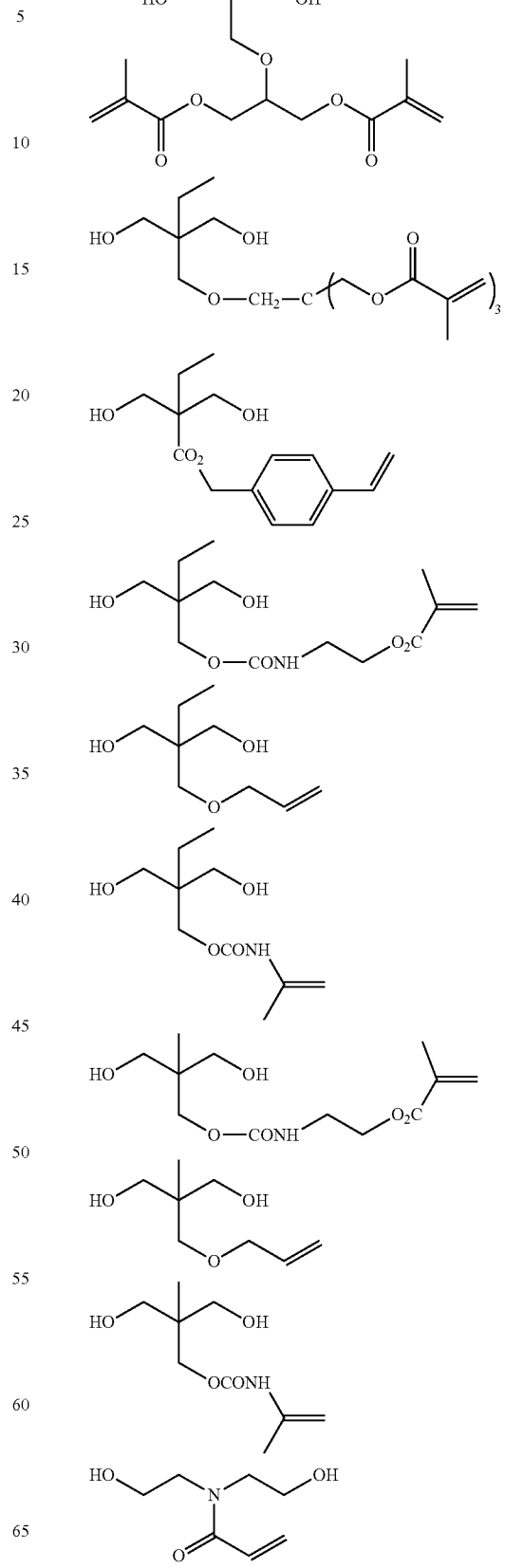

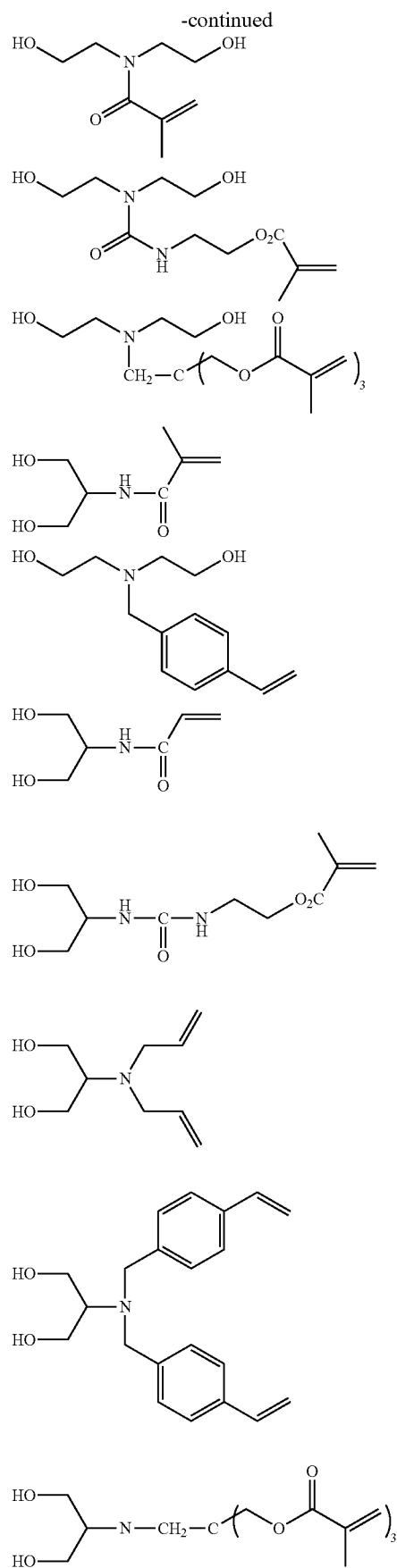
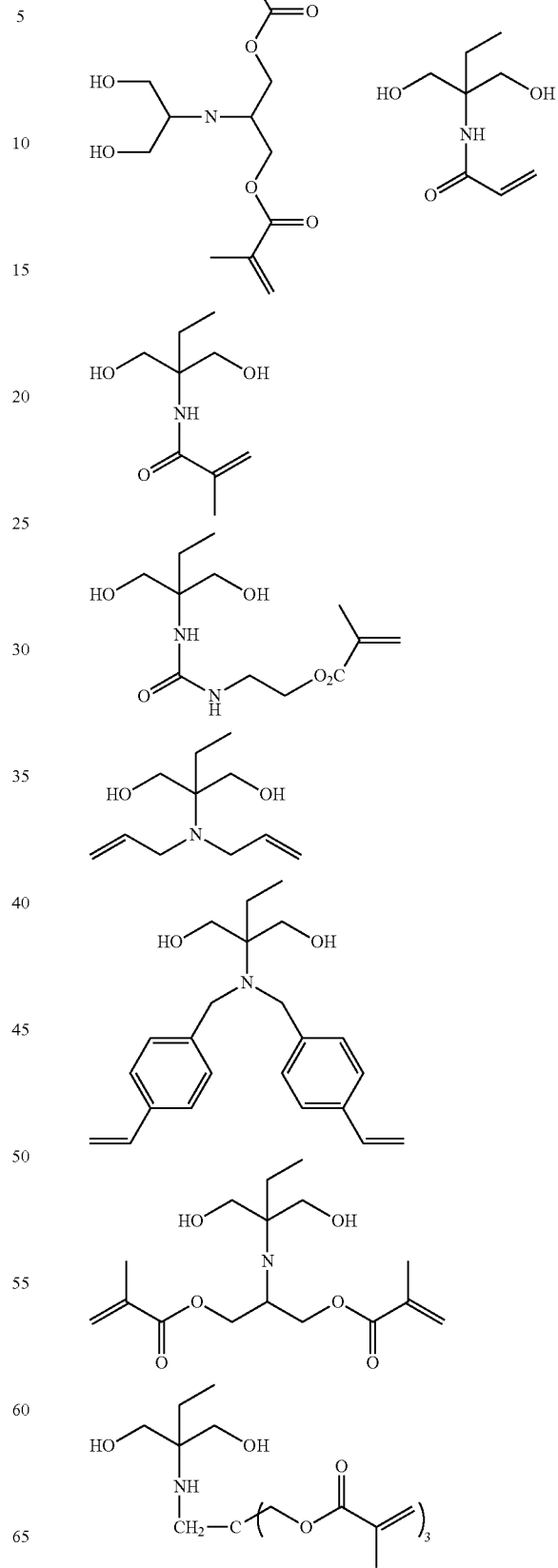

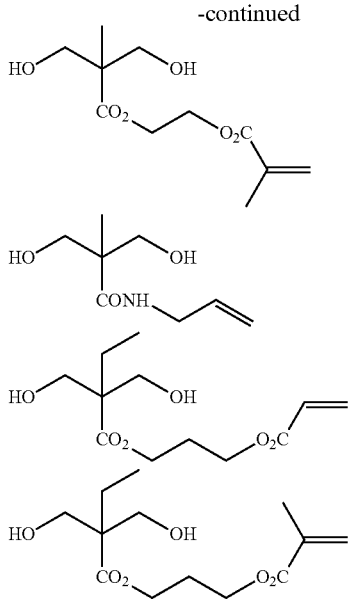

Further, examples of the binder polymer which is preferable in the invention include a polyurethane resin obtained by using a diol compound represented by the following general formula (G) as at least one diol compound having an ethylenically unsaturated bond group in the synthesis of a polyurethane.

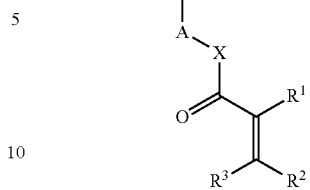

Formula (G)

In the general formula (G), $R^1$ to $R^3$ each independently represent a hydrogen atom or a monovalent organic group, A represents a divalent organic residue, X represents an oxygen atom, a sulfur atom, or —N($R^{12}$)—, and $R^{12}$ represents a hydrogen atom or a monovalent organic group.

Further, $R^1$ to $R^3$ and X in the general formula (G) have the same meanings as $R^1$ to $R^3$ and X in the general formula (1) and preferred embodiments thereof are also the same.

It is considered that by using a polyurethane resin derived from such a diol compound, an effect of preventing excessive molecular motion of the main polymer chain is obtained by virtue of the secondary alcohol having a larger steric hindrance and the film strength of the layer can be elevated.

Specific examples of the diol compound represented by the general formula (G), which is preferably used in the synthesis of the specific polyurethane resin, are set forth below.

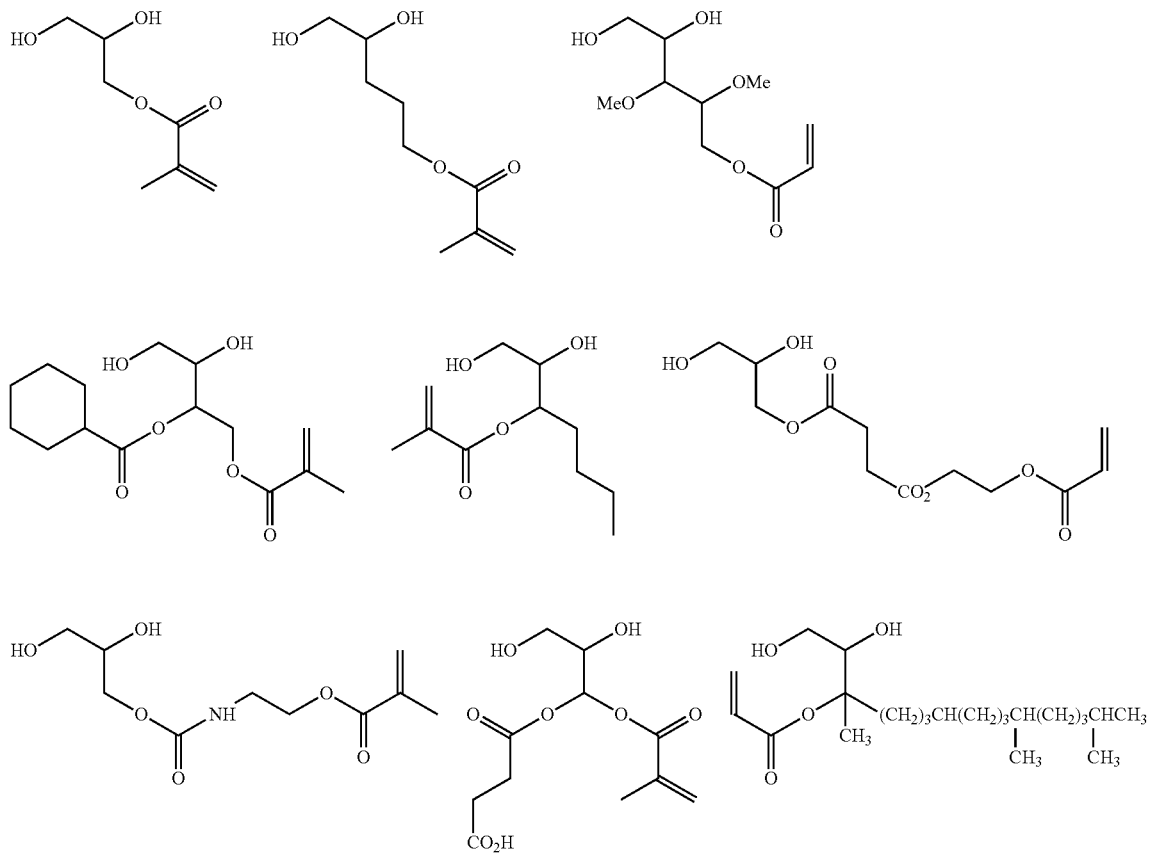

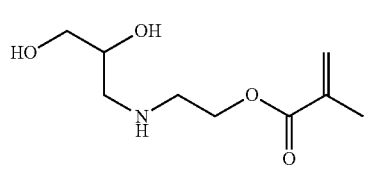
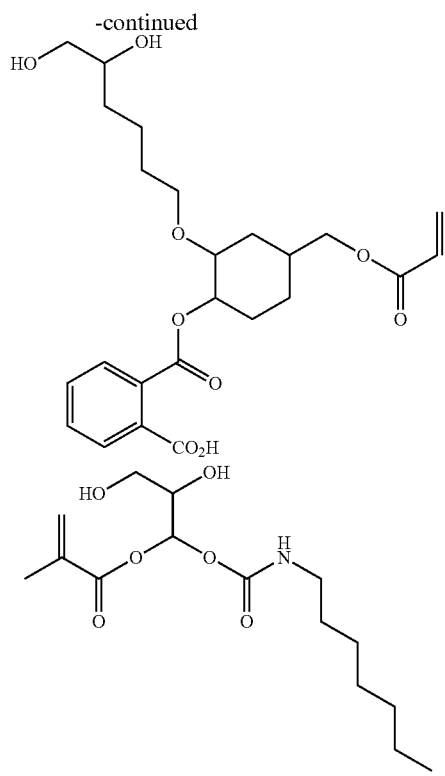
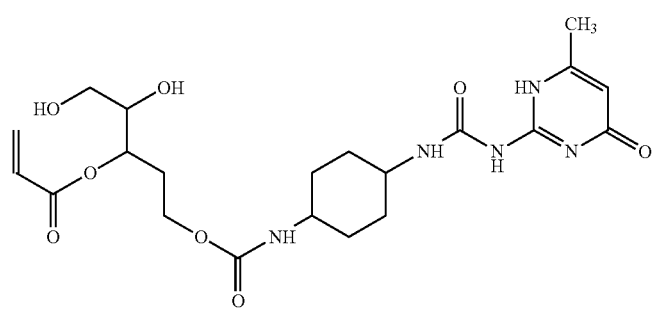
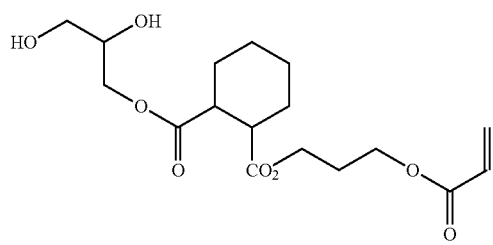
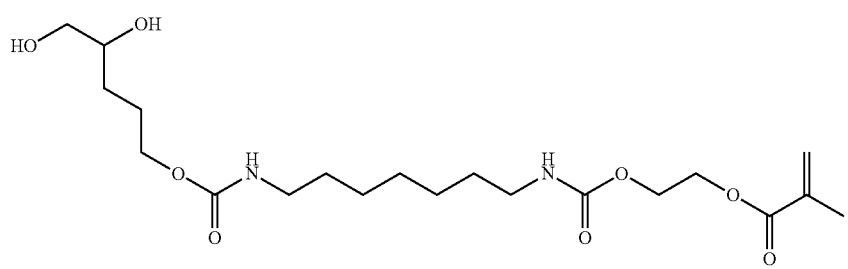

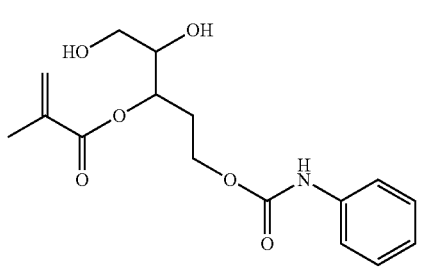
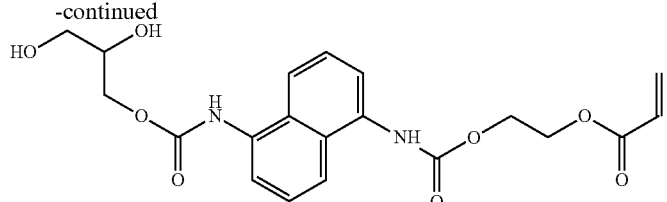
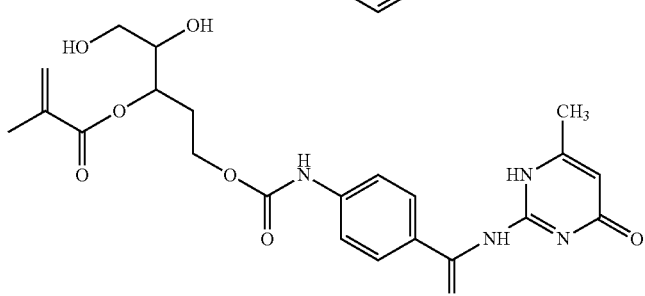
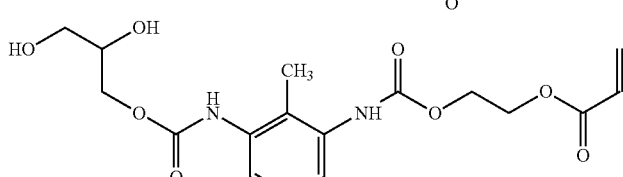
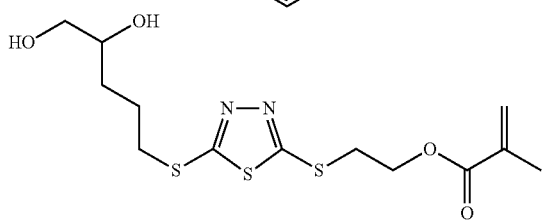

In the specific polyurethane resin for use in the invention, a diol compound other than the above-described diol compound having an unsaturated group may be copolymerized from the standpoint of, for example, elevating compatibility with other components in the polymerizable composition and enhancing the storage stability.

Examples of the diol compound include the above-described polyether diol compounds, polyester diol compounds, and polycarbonate diol compounds.

Examples of the polyether diol compound include the compounds represented by the following general formulae (7), (8), (9), (10), and (11), and hydroxyl-terminated random copolymers of ethylene oxide and propylene oxide.

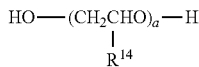 (7)

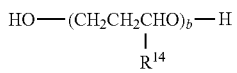 (8)

 (9)

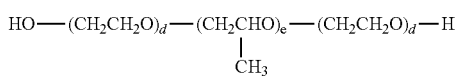 (10)

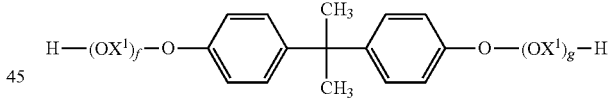 (11)

In the formulae (7) to (11), $R^{14}$ represents a hydrogen atom or a methyl group, and $X^1$ represents a group shown below. Further, a, b, c, d, e, f, and g each represent an integer of 2 or more, and preferably an integer of 2 to 100.

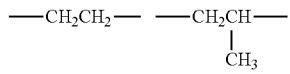

Specific examples of the polyether diol compounds represented by the formulae (7) and (8) include the following:

diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000, polypropylene glycol having a weight-average molecular weight of 4000, and the like.

Specific examples of the polyether diol compound represented by the formula (9) above include the following:

PTMG650, PTMG1000, PTMG2000, and PTMG3000 (trade names) (all manufactured by Sanyo Chemical Industries, Ltd.), and the like.

Specific examples of the polyether diol compound represented by the formula (10) above include the following:

Newpol PE-61, Newpol PE-62, Newpol PE-64, Newpol PE-68, Newpol PE-71, Newpol PE-74, Newpol PE-75, Newpol PE-78, Newpol PE-108, Newpol PE-128, and Newpol PE-61 (trade names) (all manufactured by Sanyo Chemical Ind., Ltd.), and the like.

Specific examples of the polyether diol compound represented by the formula (11) above include the following:

Newpol BPE-20, Newpol BPE-20F, Newpol BPE-20NK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P, and Newpol BPE-5P (trade names) (all manufactured by Sanyo Chemical Ind., Ltd.), and the like.

Specific examples of the ethylene oxide-propylene oxide random copolymer having a hydroxyl group at the terminal include the following:

Newpol 50HB-100, Newpol 50HB-260, Newpol 50HB-400, Newpol 50HB-660, Newpol 50HB-2000, Newpol 50HB-5100 (trade names) (all manufactured by Sanyo Chemical Ind., Ltd.), and the like.

Examples of the polyester diol compound include compounds represented by the formulae (12) and (13).

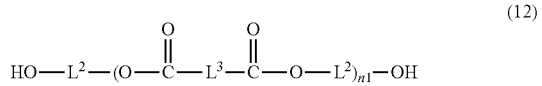
(12)

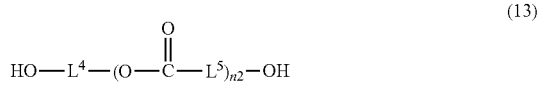
(13)

In the formulae (12) and (13), $L^2$, $L^3$, and $L^4$, which may be the same as or different from each other, each represent a divalent aliphatic or aromatic hydrocarbon group, and $L^3$ represents a divalent aliphatic hydrocarbon group. $L^2$ to $L^4$ each preferably represents an alkylene group, an alkenylene group, an alkynylene group or an arylene group, and $L^5$ preferably represents an alkylene group. Further, in $L^2$ to $L^5$, another functional group which does not react with the isocyanate group, such as an ether group, a carbonyl group, an ester group, a cyano group, an olefin group, a urethane group, an amide group, a ureido group, a halogen atom, and the like, may be present. n1 and n2 each represent an integer of 2 or more, and preferably an integer of 2 to 100.

Examples of the polycarbonate diol compound include compounds represented by the formula (14).

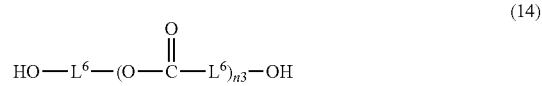
(14)

In the formula (14), $L^6$'s, which may be the same as or different from each other, each represent a divalent aliphatic or aromatic hydrocarbon group. $L^6$ is preferably an alkylene group, an alkenylene group, an alkynylene group, or an arylene group. Further, in $L^6$, another functional group which does not react with the isocyanate group, such as an ether group, a carbonyl group, an ester group, a cyano group, an olefin group, a urethane group, an amide group, a ureido group, a halogen atom, and the like, may be present. n3 represents an integer of 2 or more, and preferably an integer of 2 to 100.

Specific examples of the diol compounds represented by the formula (12), (13), or (14) are set forth below (Exemplary Compound Nos. 1 to 18). In these specific examples, n represents an integer of 2 or more.

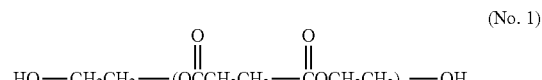
(No. 1)

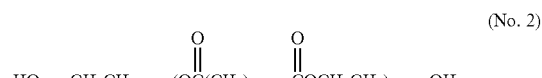
(No. 2)

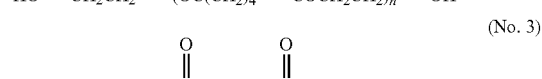
(No. 3)

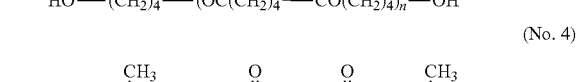
(No. 4)

(No. 5)

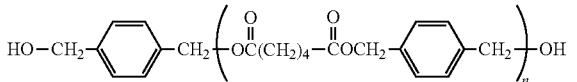
(No. 6)

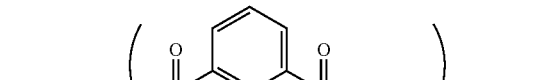
(No. 7)

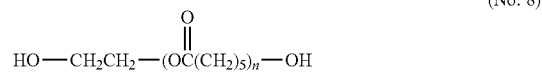
(No. 8)

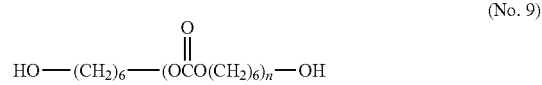
(No. 9)

-continued

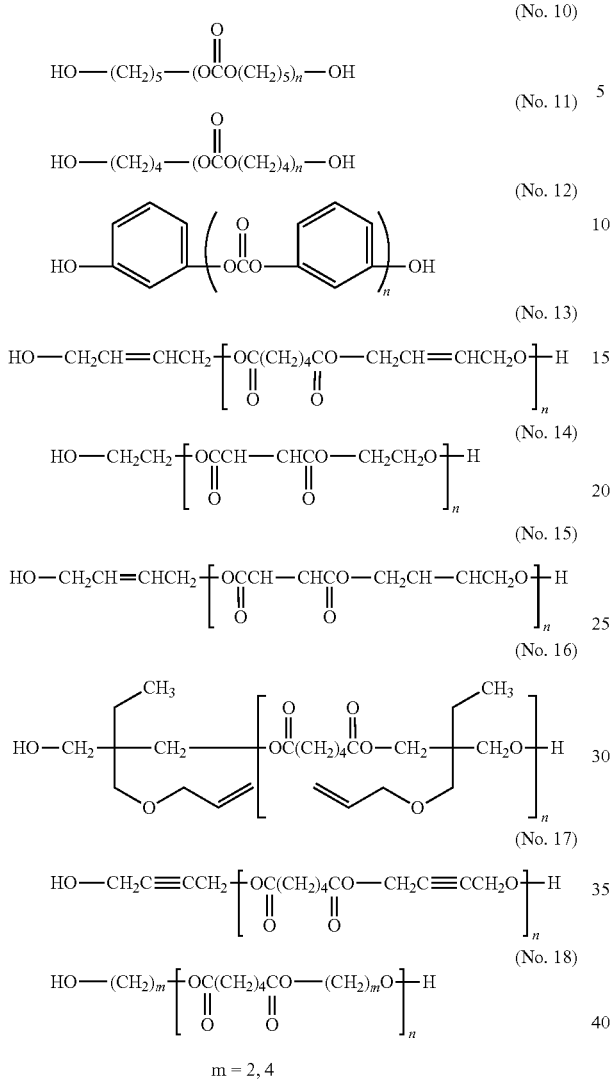

m = 2, 4

Further, in addition to the above-described diol compounds, a diol compound having a substituent which does not react with the isocyanate group may also be used, for the synthesis of the specific polyurethane resin. Examples of this diol compound include the following:

(15)

(16)

In the formulae (15) and (16), $L^7$ and $L^8$, which may be the same as or different from each other, each represent a divalent aliphatic or aromatic hydrocarbon group or a divalent heterocyclic group, which may have a substituent (for example, an alkyl group, an aralkyl group, an aryl group, an alkoxy group, an aryloxy group, a halogen atom such as —F, —Cl, —Br, —I, and the like). Further, in $L^7$ and $L^8$, another functional group which does not react with the isocyanate group, such as a carbonyl group, an ester group, a urethane group, an amide group, a ureido group, and the like, may be present, if desired. Also, $L^7$ and $L^8$ may form a ring.

Further, in addition to these diol compounds, a diol compound having a carboxyl group may also be used in combination for the synthesis of the specific polyurethane resin.

Examples of this diol compound include compounds represented by the following formulae (17) to (19).

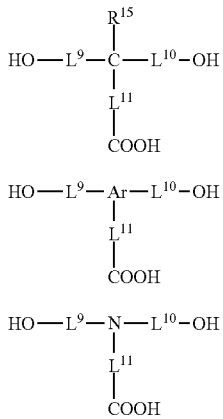

In the formulae (17) to (19), $R^{15}$ represents a hydrogen atom or an alkyl, aralkyl, aryl, alkoxy or aryloxy group which may have a substituent (examples of the substituent include a cyano group, a nitro group, a halogen atom such as —F, —Cl, —Br, —I, and the like, —CONH$_2$, —COOR$^{16}$, —OR$^{16}$, —NHCONHR$^{16}$, —NHCOOR$^{16}$, —NHCOR$^{16}$— OCONHR$^{16}$ (wherein $R^{16}$ represents an alkyl group having 1 to 10 carbon atoms or an aralkyl group having 7 to 15 carbon atoms), preferably a hydrogen atom, an alkyl group having 1 to 8 carbon atoms, or an aryl group having 6 to 15 carbon atoms. $L^9$, $L^{10}$, and $L^{11}$, which may be the same as or different from each other, each represent a single bond or a divalent aliphatic or aromatic hydrocarbon group which may have a substituent (preferred examples of the substituent include an alkyl group, an aralkyl group, an aryl group, an alkoxy group and a halogeno group), preferably an alkylene group having 1 to 20 carbon atoms or an arylene group having 6 to 15 carbon atoms, and more preferably an alkylene group having 1 to 8 carbon atoms. If desired, $L^9$ to $L^{11}$ each may contain another functional group which does not react with the isocyanate group, such as a carbonyl group, an ester group, a urethane group, an amide group, a ureido group, and an ether group. Two or three of $R^{15}$, and $L^7$, $L^8$, and $L^9$ may form a ring.

Ar represents a trivalent aromatic hydrocarbon group which may have a substituent, and preferably an aromatic group having 6 to 15 carbon atoms.

Specific examples of the carboxyl group-containing diol compounds represented by the formulae (17) to (19) above include the following:

3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, N,N-bis(2-hydroxyethyl)-3-carboxy-propionamide, and the like.

By virtue of the presence of a carboxyl group, properties such as a hydrogen bonding property and alkali solubility can be imparted to the polyurethane resin and this is preferred. More specifically, the polyurethane resin having an ethylenically unsaturated bond group in the side chain is a resin further having a carboxyl group in the side chain. Still more specifically, a polyurethane resin having 0.3 meq/g or more of an ethylenically unsaturated bond group in the side chain and having 0.4 meq/g or more of a carboxyl group in the side chain is preferably used as the binder polymer of the invention.

Further, in addition to these diols, a compound obtained by ring-opening a tetracarboxylic acid dianhydride represented by any one of the following formulae (20) to (22) with a diol compound may also be used for the synthesis of the specific polyurethane resin.

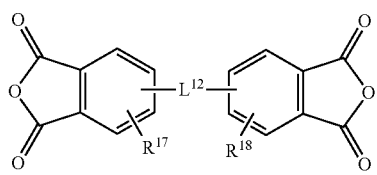
(20)

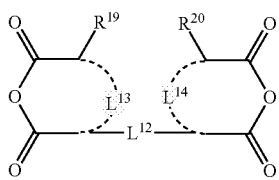
(21)

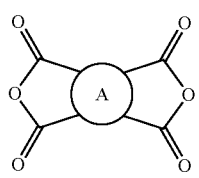
(22)

In the formulae (20) to (22), $L^{12}$ represents a single bond, a divalent aliphatic or aromatic hydrocarbon group which may have a substituent (preferred examples of the substituent include an alkyl group, an aralkyl group, an aryl group, an alkoxy group, a halogeno group, an ester group, and an amide group), —CO—, —SO—, —SO$_2$—, —O—, or —S—, and preferably a single bond, a divalent aliphatic hydrocarbon group having 1 to 15 carbon atoms, —CO—, —SO$_2$—, —O—, or —S—. $R^{17}$ and $R^{18}$, which may be the same as or different from each other, each represent a hydrogen atom, an alkyl group, an aralkyl group, an aryl group, an alkoxy group, or a halogeno group, and preferably a hydrogen atom, an alkyl group having 1 to 8 carbon atoms, an aryl group having 6 to 15 carbon atoms, an alkoxy group having 1 to 8 carbon atoms or a halogeno group. Two of $L^{12}$, $R^{17}$, and $R^{18}$ may be combined with each other to form a ring.

$R^{19}$ and $R^{20}$, which may be the same as or different from each other, each represent a hydrogen atom, an alkyl group, an aralkyl group, an aryl group or a halogeno group, preferably a hydrogen atom, an alkyl group having 1 to 8 carbon atoms or an aryl group having 6 to 15 carbon atoms. Two of $L^{12}$, $R^{19}$, and $R^{20}$ may be combined with each other to form a ring. $L^{13}$ and $L^{14}$, which may be the same as or different from each other, each represent a single bond, a double bond or a divalent aliphatic hydrocarbon group, preferably a single bond, a double bond or a methylene group. A represents a mononuclear or polynuclear aromatic ring, and preferably an aromatic ring having 6 to 18 carbon atoms.

Specific examples of the compounds represented by the formulae (20), (21), and (22) include the following:

aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)bis(iminocarbonyl)]diphthalic dianhydride, an adduct of hydroquinone diacetate and trimellitic anhydride, an adduct of diacetyldiamine and trimellitic anhydride, and the like; alicyclic tetracarboxylic dianhydrides such as 5-(2,5-dioxotetrahydrofuryl)-3-methyl-3-cyclohexene-1,2-dicarboxylic anhydride (EPICLON B-4400, manufactured by Dainippon Ink And Chemicals, Incorporated), 1,2,3,4-cyclopentanetetracarboxylic dianhydride, 1,2,4,5-cyclohexanetetracarboxylic dianhydride, tetrahydrofurantetracarboxylic dianhydride, and the like; and aliphatic tetracarboxylic dianhydrides such as 1,2,3,4-butanetetracarboxylic dianhydride, 1,2,4,5-pentanetetracarboxylic dianhydride, and the like.

Examples of the method for introducing a compound obtained by ring-opening these tetracarboxylic dianhydrides by a diol compound into the polyurethane resin include the following methods:

(a) a method of reacting a diisocyanate compound with an alcohol-terminated compound obtained by ring-opening the tetracarboxylic dianhydride by a diol compound, and (b) a method of reacting the tetracarboxylic dianhydride with an alcohol-terminated urethane compound obtained by reacting a diisocyanate compound and a diol compound under diol compound-excess conditions.

Specific examples of the diol compound used for the ring-opening reaction include the following:

ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinonedihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, bis(2-hydroxyethyl)isophthalate, and the like.

The specific polyurethane resin used in the invention is synthesized by adding the above-described diisocyanate compounds and diol compounds and a known catalyst having an activity according to the reactivity of respective compounds in an aprotic solvent and heating the solution. The molar ratio ($M_a$:$M_b$) between diisocyanate compounds and diol compounds used for the synthesis is preferably from 1:1 to 1.2:1. The reaction product may be treated with alcohols or amines, whereby a polyurethane resin having desired physical properties such as molecular weight and viscosity and having no remaining isocyanate groups can be finally synthesized.

As for the amount of the ethylenically unsaturated bond introduced into the specific polyurethane resin according to the invention, the ethylenically unsaturated bond group is preferably contained in the side chain in an amount of, in terms of equivalent, 0.3 meq/g or more, and more preferably from 0.35 to 1.50 meq/g. Particularly, the binder polymer of the invention is preferably a polyurethane resin containing, together with the ethylenically unsaturated bond group, 0.4 meq/g or more, more preferably from 0.45 to 1.00 meq/g, of a carboxyl group in the side chain.

The molecular weight of the specific polyurethane resin according to the invention is, in terms of the weight-average molecular weight, preferably 10,000 or more, more preferably from 40,000 to 200,000. Particularly, in the case of using the polymerizable composition of the invention for a colored region (pattern) of a solid-state imaging device, when the weight-average molecular weight is in the above-described range, the strength of the colored region (pattern) is excellent and the developability of the non-image area with an alkaline developer is excellent.

Further, as for the specific polyurethane resin according to the invention, those having an unsaturated group at the polymer terminal and in the main chain are also preferably used. By having an unsaturated group at the polymer terminal and in the main chain, the crosslinking reactivity between the polymerizable compound and the specific polyurethane resin or between specific polyurethane resins is increased to enhance the strength of the photocured product. As a result, when the specific polyurethane resin is used for the polymerizable composition of the invention, a colored region having excellent strength can be obtained. Here, the unsaturated group preferably contains a carbon-carbon double bond since the crosslinking reaction can readily occur.

The method of introducing an unsaturated group into the polymer terminal may be the following method. That is, the unsaturated group may be introduced by using alcohols, amines, or the like having an unsaturated group at the time when the isocyanate group remaining at the polymer terminal in the synthesis of the polyurethane resin is treated with alcohols, amines, or the like. Specific examples of the compound include the same compounds as exemplified above for the monofunctional alcohol or monofunctional amine compound having an unsaturated group.

Further, the unsaturated group is more preferably introduced into the polymer side chain rather than into the polymer terminal, because the amount of the unsaturated group introduced can be easily controlled and can be increased and also, the crosslinking reaction efficiency is enhanced.

In view of formability of a crosslinked and cured film, the ethylenically unsaturated bond group introduced is preferably a methacryloyl group, an acryloyl group or a styryl group, more preferably a methacryloyl group, or an acryloyl group. Also, from the standpoint of satisfying both the formability of a crosslinked and cured film and the raw-stock storability, the ethylenically unsaturated bond group is still more preferably a methacryloyl group.

In addition, the amount of the methacryloyl group introduced is preferably 0.30 meq/g or more, and more preferably from 0.35 to 1.50 meq/g, as described above. That is, a most preferred embodiment of the binder polymer for use in the invention is a polyurethane resin where a methacryloyl group is introduced into the side chain in the range from 0.35 to 1.50 meq/g.

The method of introducing an unsaturated group into the main chain may be a method of using a diol compound having an unsaturated group in the main chain direction for the synthesis of the polyurethane resin. Specific examples of the diol compound having an unsaturated group in the main chain direction include the following compounds:

cis-2-butene-1,4-diol, trans-2-butene-1,4-diol, polybutadiene diol, and the like.

In combination with the specific polyurethane resin according to the invention, an alkali-soluble polymer containing a polyurethane resin differing in structure from the specific polyurethane resin may also be used. For example, the specific polyurethane resin can be used in combination with a polyurethane resin having an aromatic group in the main chain and/or side chain.

Next, the specific styrene-based resin which is another preferred binder polymer of the invention is described in detail below.

(Styrene-Based Resin Having Ethylenically Unsaturated Bond in Side Chain)

Examples of the specific styrene-based resin for use in the invention include those having in the side chain thereof at least either one of a styrenic double bond (styrene or an α-methylstyrene-based double bond) represented by the following general formula (23) or a vinylpyridinium group represented by the following general formula (24).

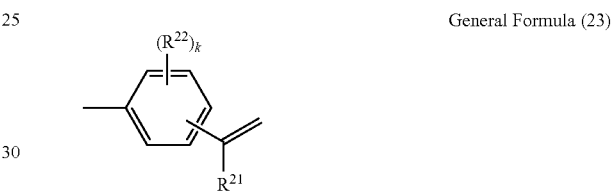

General Formula (23)

In the general formula (23), $R^{21}$ represents a hydrogen atom or a methyl group, $R^{22}$ represents an arbitrary atom or atomic group which can be substituted, and k represents an integer of 0 to 4.

Further, the styrenic double bond represented by the general formula (23) is linked to the polymer main chain through a single bond or a linking group containing an arbitrary atom or atomic group, and the manner of bonding is not particularly limited.

Preferred examples of the repeating unit of the polymer compound having the functional group represented by the general formula (23) are set forth below, but the invention is not limited to these examples.

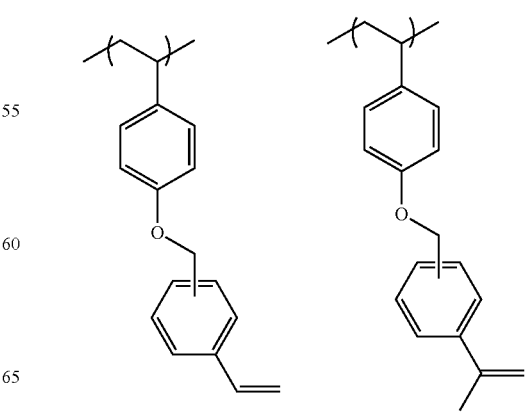

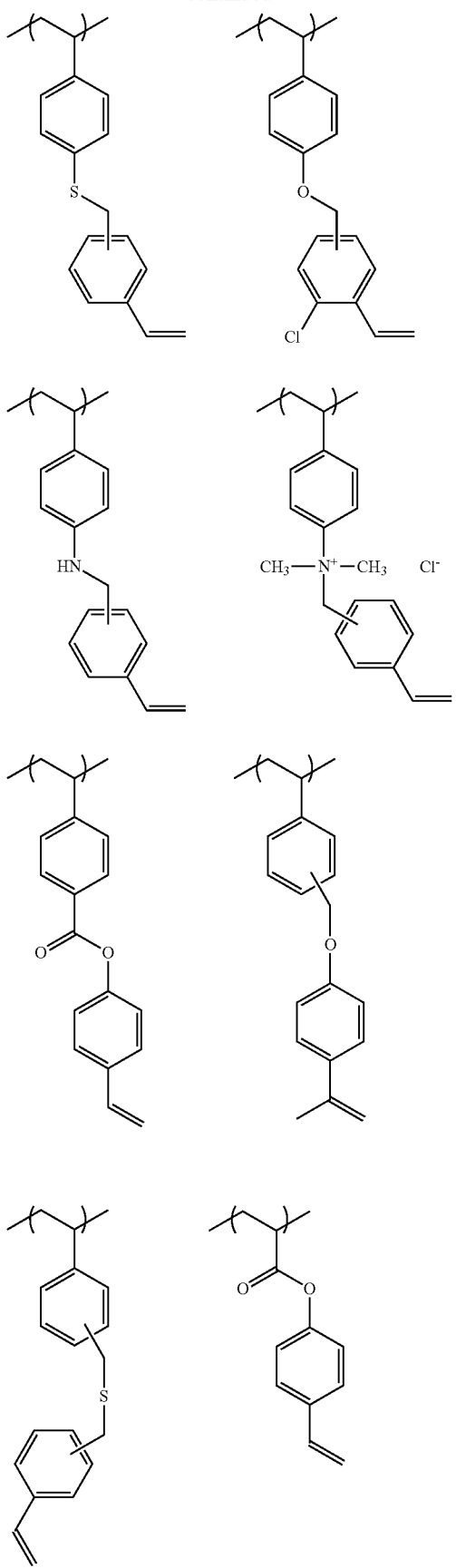
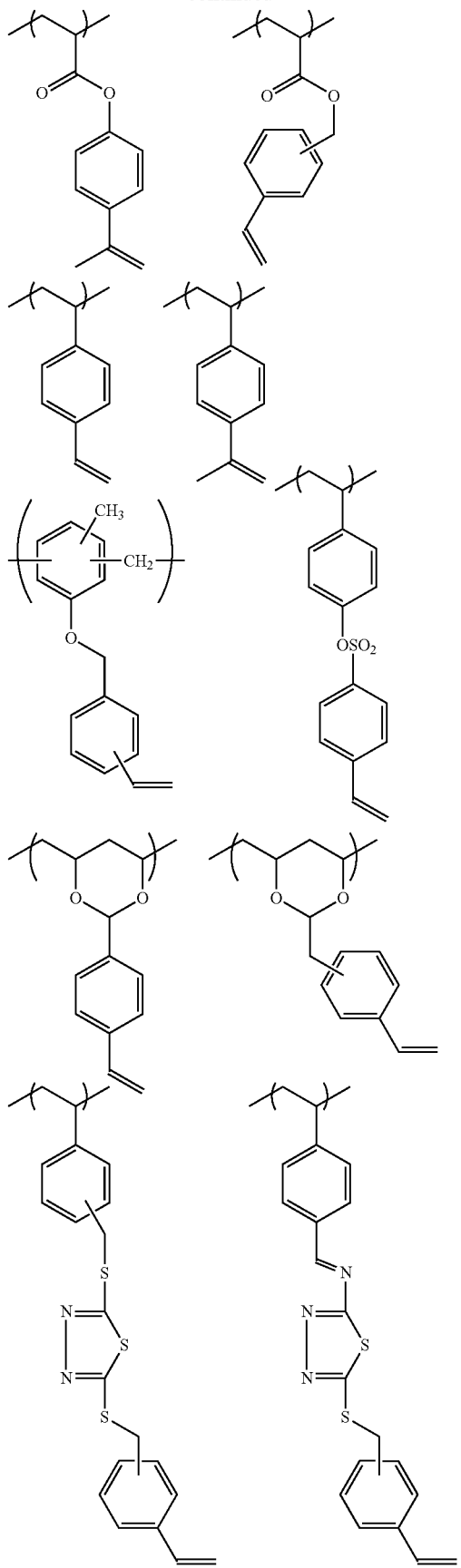

-continued

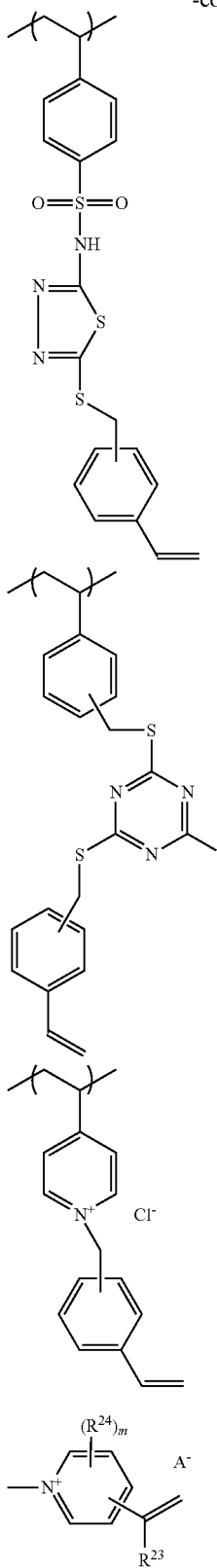

General Formula (24)

In the general formula (24), $R^{23}$ represents a hydrogen atom or a methyl group, $R^{24}$ represents an arbitrary atom or atomic group which can be substituted, m represents an integer of 0 to 4, and $A^-$ represents an anion. The pyridinium ring may take the form of benzopyridinium where a benzene ring is condensed as a substituent. In this case, a quinolium group and an isoquinolium group are included.

Further, the vinylpyridinium group represented by the general formula (24) is linked to the polymer main chain through a single bond or a linking group containing an arbitrary atom or atomic group, and the method of bonding is not particularly limited.

Preferred examples of the repeating unit of the polymer compound having the functional group represented by the general formula (24) are set forth below, but the invention is not limited to these examples.

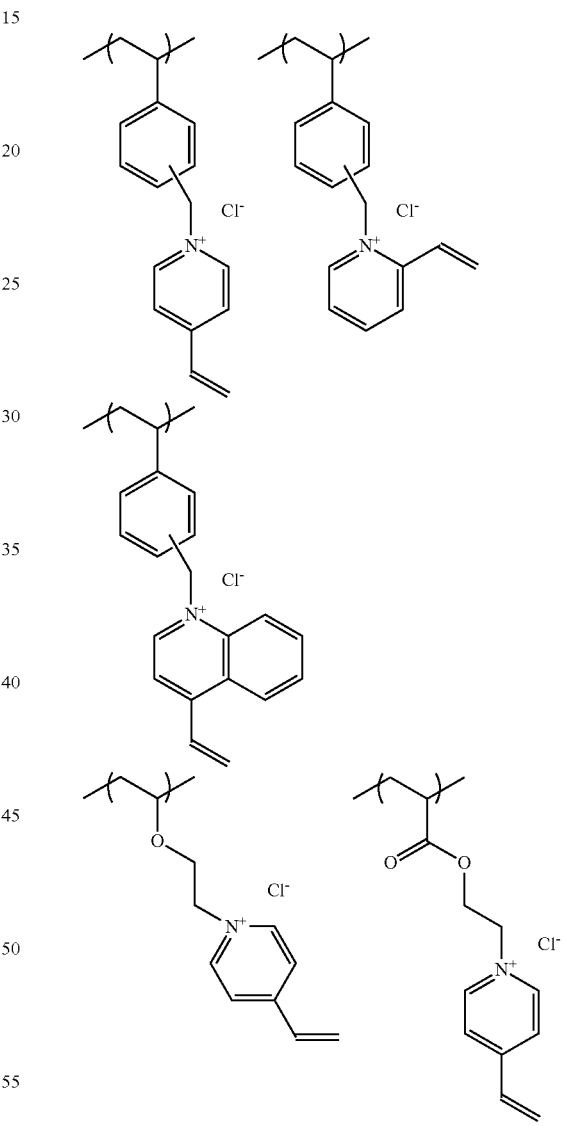

One of the methods for synthesizing the specific styrene-based resin according to the invention is a method of copolymerizing monomers having a functional group represented by the general formula (23) or (24) and having a functional group which is copolymerizable with other copolymerization components, by using a known copolymerization method. The specific styrene-based resin may be a homopolymer having only one kind of a functional group belonging to either one of the functional groups represented by the general formulae (23) and (24), or a copolymer having two or more kinds of functional groups belonging to either one or both of these functional groups.

In addition, the specific styrene-based resin may also be a copolymer with another copolymerization monomer containing such a functional group. In this case, a carboxyl group-containing monomer is preferably selected as this another copolymerization monomer for the purpose of, for example, imparting solubility in an aqueous alkali solution to the polymer. Examples thereof include acrylic acid, methacrylic acid, 2-carboxyethyl acrylate, 2-carboxyethyl methacrylate, crotonic acid, maleic acid, fumaric acid, maleic acid monoalkyl ester, fumaric acid monoalkyl ester, 4-carboxystyrene, and the like.

A (multi-component) copolymer may also be synthesized by introducing another monomer component, other than the monomer having a carboxyl group, into the copolymer, and such a copolymer is preferably used. As for the monomer which can be introduced into the copolymer in this case, various monomers including styrene derivatives such as styrene, 4-methylstyrene, 4-hydroxystyrene, 4-acetoxystyrene, 4-carboxystyrene, 4-aminostyrene, chloromethylstyrene, 4-methoxystyrene, and the like, vinylphosphonic acid, vinylsulfonic acid and a salt thereof, styrenesulfonic acid and a salt thereof, 4-vinylpyridine, 2-vinylpyridine, N-vinylimidazole, N-vinylcarbazole, 4-vinylbenzyltrimethylammonium chloride, a quaternized product of N-vinylimidazole by methyl chloride, 4-vinylbenzylpyridinium chloride, acrylonitrile, methacrylonitrile, phenylmaleimide, hydroxyphenylmaleimide, vinyl esters such as vinyl acetate, vinyl chloroacetate, vinyl propionate, vinyl butyrate, vinyl stearate, vinyl benzoate, and the like, vinyl ethers such as methyl vinyl ether, butyl vinyl ether, and the like, N-vinylpyrrolidone, acryloylmorpholine, vinyl chloride, vinylidene chloride, allyl alcohol, vinyltrimethoxysilane, and the like are appropriately used as a copolymerization monomer.

When such a copolymer as the specific styrene-based resin according to the invention is used, the proportion of the repeating units having a functional group represented by the general formula (23) and/or the general formula (24) in the entire copolymer composition is preferably 20% by mass or more, more preferably 40% by mass or more. Within this range, the effect of the invention is excellent, thereby providing a highly-sensitive crosslinking system.

Furthermore, the specific styrene-based resin according to the invention may change its property and become water-soluble when containing a quaternary salt structure in the repeating unit thereof. When the polymerizable composition of the invention containing such a resin is used for a colored region (pattern) of a solid-state imaging device, it can also be developed with water after exposure.

Particularly, when having the functional group represented by the general formula (23) in the repeating unit and having a quaternary salt structure in the linking group connecting the main chain and the functional group represented by the general formula (23) (for example, the specific examples above, and the like), the specific styrene-based resin may be a homopolymer having such a structure, but in other cases, the specific styrene-based resin is preferably a copolymer with another copolymerization monomer described below. For example, 4-vinylbenzyltrimethylammonium chloride, acryloyloxyethyltrimethylammonium chloride, methacryloyloxyethyltrimethylammonium chloride, a quaternized product of dimethylaminopropyl acrylamide by methyl chloride, a quaternized product of N-vinylimidazole by methyl chloride, 4-vinylbenzylpyridinium chloride, or the like is preferably used.

Also, when the functional group represented by the general formula (24) is contained in the repeating unit, the specified styrene-based resin may be a homopolymer or a copolymer with the above-described another copolymerization monomer.

Also, in the case of a copolymer in which a carboxyl group is introduced, development with an aqueous alkali solution also becomes available. In any case, the proportion of the repeating unit having the functional group represented by the general formula (23) and/or the general formula (24) is preferably 20% by mass or more, and the introduction of a repeating unit other than these can be freely selected according to the purpose.

The molecular weight of the specific styrene-based resin according to the invention is, in terms of the weight-average molecular weight, preferably from 10,000 to 300,000, more preferably from 15,000 to 200,000, and most preferably from 20,000 to 150,000. Particularly, in the case of using the polymerizable composition of the invention for a colored region (pattern) of a solid-state imaging device, when the weight-average molecular weight is in the above-described range, the strength of the colored region (pattern) is excellent and the developability of the non-image area with an alkaline developer is excellent.

(A) The specific binder polymer other than the specific polyurethane resin and specific styrene-based resin is described below.

Examples of the novolak resin having an ethylenically unsaturated group in the side chain include resins where an ethylenically unsaturated bond is introduced into the polymer described in JP-A No. 9-269596 by using the method described in JP-A No. 2002-62648, and the like.

Examples of the acetal resin having an ethylenically unsaturated bond in the side chain include resins described in JP-A No. 2002-162741, and the like.

Examples of the polyamide-based resin having an ethylenically unsaturated bond in the side chain include resins where an ethylenically unsaturated bond is introduced into the side chain of the resin described in Japanese Patent Application No. 2003-321022, or the polyamide resin cited therein by using the method described in JP-A No. 2002-62648, and the like.

Examples of the polyimide resin having an ethylenically unsaturated bond in the side chain include resins where an ethylenically unsaturated bond is introduced into the side chain of the resin described in Japanese Patent Application No. 2003-339785, or the polyimide resin cited therein by using the method described in JP-A No. 2002-62648, and the like.

Among them, alkali-soluble resins having a double bond in the side chain described in JP-A No. 2000-187322 and JP-A No. 2002-62698, and alkali-soluble resins having an amide group in the side chain described in JP-A No. 2001-242612 are suitable since the balance between film strength, sensitivity, and developability is excellent.

In the polymerizable composition of the invention, it is required that the mass ratio of the content of (A) the polymerizable compound to the content of (B) the binder polymer (that is, the content ratio (a)/(b) when the content of (A) the polymerizable compound is denoted as (a) and the content of (B) the binder polymer is denoted as (b)) be more than 1, preferably more than 1 but 200 or less, and more preferably from 1.2 to 50.

When the mass ratio is 1 or less, the content of the binder component is high and the mobility of the film is reduced. It is thought that since the light blocking property of the film is high, generation of radicals around the substrate is insufficient, and if the mobility of the film is low, the polymerization does not sufficiently proceed, and the sensitivity is reduced. Further, there is an effect that since the molecular weight of the monomer at an unexposed portion is low, the development is promoted, but if the above-described value is 1 or less, since the content of the monomer at the unexposed portion is low, the residues are easily generated. Further, the above-described value of 200 or less is preferable from the viewpoint of film-forming property or strength.

<(C) Photopolymerization Initiator>

The polymerizable composition of the invention includes (C) a photopolymerization initiator.

The photopolymerization initiator in the invention is a compound which is decomposed by light, and initiates and promotes the polymerization of (A) the polymerizable compound above. It preferably has an absorption in the region from 300 to 500 nm. Further, the photopolymerization initiators may be used singly or in combination of two or more kinds thereof.

Examples of the photopolymerization initiator include an organohalogenated compound, an oxydiazole compound, a carbonyl compound, a ketal compound, a benzoin compound, an acridine compound, an organoperoxide compound, an azo compound, a coumarin compound, an azide compound, a metallocene compound, a hexaaryl-biimidazole compound, an organoboron compound, a disulfonate compound, an oximeester compound, an onium salt compound, and an acylphosphine(oxide) compound.

Specific examples of the organic halogenated compound include the compounds described in Wakabayashi, et al., "Bull Chem. Soc. Japan", Vol. 42, 2924 (1969), U.S. Pat. No. 3,905,815, JP-B No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, and JP-A No. 63-298339, and M. P. Hutt, "Journal of Heterocyclic Chemistry", 1 (No. 3), (1970), or the like, and particularly oxazole compounds and s-triazine compounds having a trihalomethyl group substituted thereon.

Suitable examples of the s-triazine compounds include s-triazine derivatives in which at least one mono-, di- or trihalogen-substituted methyl group is bonded to a s-triazine ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-b is(trichloromethyl)-s-triazine, 2-(p-methoxy phenyl)-4,6-bis(trichloromethyl)-s-triazine, 2-(3,4-epoxy phenyl)-4,6-bis(trichloromethyl)-s-triazine, 2-(p-chlorophenyl)-4,6-bis(trichloromethyl)-s-triazine, 2-[1-(p-methoxy phenyl)-2,4-butadienyl]-4,6-bis(trichloromethyl)-s-triazine, 2-styryl 4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-nathoxynaphtyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromo methyl)-s-triazine, 2-methyl-4,6-bis(tribromo methyl)-s-triazine, 2-methoxy-4,6-bis(tribromo methyl)-s-triazine, and the like.

Examples of the oxydiazole compound include 2-trichloromethyl-5-styryl-1,3,4-oxydiazole, 2-trichloromethyl-5-(cyanostyryl)-1,3,4-oxydiazole, 2-trichloromethyl-5-(naphth-1-yl)-1,3,4-oxydiazole, 2-trichloromethyl-5-(4-styryl)styryl-1,3,4-oxydiazole, and the like.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone, 2-carboxybenzophenone, and the like; acetophenone derivatives such as 2,2-dimethoxy-2-phenylacetophenone, 2,2-diethoxyacetophenone, 1-hydroxycyclohexylphenyl ketone, α-hydroxy-2-methylphenylpropanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl)ketone, 2-benzyl-2-dimethylamino-4-morpholinobutyrophenone, and the like; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, 2,4-diisopropylthioxanthone, and the like; benzoic ester derivatives such as ethyl p-dimethylaminobenzoate, ethyl p-diethylaminobenzoate, and the like; and others.

Examples of the ketal compound include benzyl methyl ketal, benzyl-β-methoxyethyl ethyl acetal, and the like.

Examples of the benzoin compound include benzoin isopropyl ether, benzoin isobutyl ether, benzoin methyl ether, methyl o-benzoyl benzoate, and the like.

Examples of the acridine compound include 9-phenylacridine, 1,7-bis(9-acridinyl)heptane, and the like.

Examples of the organic peroxide compound include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(t-butylperoxycarbonyl)benzophenone, 3,3',4,4'-tetra(t-hexylperoxycarbonyl)benzophenone, 3,3',4,4'-tetra(p-isopropylcumylperoxycarbonyl)benzophenone, carbonyl di(t-butylperoxydihydrogendiphthalate), carbonyl di(t-hexylperoxydihydrogendiphthalate), and the like.

Examples of the azo compound include azo compounds described in JP-A No. 8-108621, and the like.

Examples of the coumarin compound include 3-methyl-5-amino((s-triazin-2-yl)amino)-3-phenylcoumarin, 3-chloro-5-diethylamino((s-triazin-2-yl)amino)-3-phenylcoumarin, 3-butyl-5-dimethylamino((s-triazin-2-yl)amino)-3-phenylcoumarin, and the like.

Examples of the azide compound include organic azide compounds described in U.S. Pat. No. 2,848,328, U.S. Pat. No. 2,852,379, and U.S. Pat. Nos. 2,940,853, 2,6-bis(4-azidobenzylidene)-4-ethylcyclohexanone (BAC-E), and the like.

Examples of the metallocene compound include various titanocene compounds described in JP-A No. 59-152396, JP-A No. 61-151197, JP-A No. 63-41484, JP-A No. 2-249, JP-A No. 2-4705, and JP-A No. 5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-terafluorophen-1-yl, and dimethylcyclopentadienyl-Ti-bis-2,3,4,5,6-pentafluorophen-1-yl, iron-allene complexes described in JP-A No. 1-304453 and JP-A No. 1-152109, and the like.

Preferable examples of the biimidazole-based compound include hexaarylbiimidazole compounds (Rofin dimer-based compounds), and the like.

Examples of the hexaaryl biimidazole compound include Rofin dimers described in JP-B No. 45-37377 and JP-B No. 44-86516, and various compounds described in each specification of JP-B No. 6-29285, and U.S. Pat. No. 3,479,185, U.S. Pat. No. 4,311,783, and U.S. Pat. No. 4,622,286, etc., specifically 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, 2,2'-bis(o-trifluorophenyl)-4,4',5,5'-tetraphenyl biimidazole, and the like.

Specific examples of the organic borate compound include organic borates described in JP-A No. 62-143044, JP-A No. 62-150242, JP-A No. 9-188685, JP-A No. 9-188686, JP-A No. 9-188710, JP-A No. 2000-131837, and JP-A No. 2002-107916, Japanese Patent No. 2764769, Japanese Patent Application No. 2000-310808, etc., Kunz, Martin, "RadTech '98. Proceeding Apr. 19-22, 1998, Chicago", and the like, organoboron sulfonium complexes or organoboron oxosulfonium complexes described in JP-A No. 6-157623, JP-A No. 6-175564, and JP-A No. 6-175561, organoboron iodonium complexes described in JP-A No. 6-175554 and JP-A No. 6-175553; organoboron phosphonium complexes described in JP-A No. 9-188710; and organoboron transition metal coordination complexes described in JP-A No. 6-348011, JP-A No. 7-128785, JP-A No. 7-140589, JP-A No. 7-306527, JP-A No. 7-292014, etc., and the like.

Examples of the disulfone compound include compounds described in JP-A No. 61-166544, Japanese Patent Application No. 2001-132318, etc., and the like.

Examples of the oxime ester compound include compounds described in J. C. S. Perkin II (1979) 1653-1660, J. C. S. Perkin II (1979) 156-162, Journal of Photopolymer Science and Technology (1995) 202-232, JP-A Nos. 2000-66385 and 2000-80068, and JP-A No. 2004-534797, and the like.

Among the oxime-based initiators, a compound represented by the following formula (C1) is more preferable in consideration of sensitivity, stability over time, and coloring at the time of post-heating.

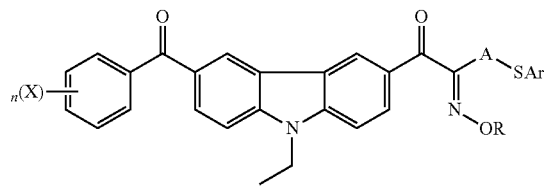

Formula (C1)

In the general formula (C1), R and X each independently represent a monovalent substituent, A represents a divalent organic group, and Ar represents an aryl group. n is an integer of 1 to 5.

Examples of the onium salt compound include the diazonium salts described in S. I. Schlesinger, Photogr. Sci. Eng., 18, 387 (1974), and T. S. Bal et al., Polymer, 21, 423 (1980), the ammonium salts described in the specification of U.S. Pat. No. 4,069,055, JP-A No. 4-365049, and the like, the phosphonium salts disclosed in each specification of U.S. Pat. Nos. 4,069,055 and 4,069,056, the iodonium salts described in each specification of European Patent No. 104,143, U.S. Pat. No. 339,049 and U.S. Pat. No. 410,201, each publication of JP-A No. 2-150848 and JP-A No. 2-296514, and the like.

An iodonium salt which can be suitably used in the invention is a diaryliodonium salt, and from the viewpoint of stability, a diaryliodonium salt substituted with two or more electron-donating groups such as an alkyl group, an alkoxy group, an aryloxy group, and the like is preferred. As another preferred form of the sulfonium salt, an iodonium salt in which one of the substituents of a triarylsulfonium salt has a coumarin or anthraquinone structure, and which has absorption at 300 nm or more, and the like are preferred.

Examples of the sulfonium salt which can be suitably used in the invention include sulfonium salts described in each specification of European Patents Nos. 370,693, 390, 214, 233, 567, 297,443, and 297,442, U.S. Pat. Nos. 4,933,377, 161,811, 410,201, 339,049, 4,760,013, 4,734,444, and 2,833, 827, and German Patents Nos. 2,904,626, 3,604,580, and 3,604,581. From the viewpoint of stability, those substituted with an electron withdrawing group are preferable. It is preferable that a Hammett's value of the electron withdrawing group is more than 0. Examples of the preferable electron withdrawing group include a halogen atom, a carboxylic acid, and the like.

Furthermore, examples of other preferable sulfonium salts include a sulfonium salt in which one of the substituents of a triarylsulfonium salt has a coumarin or anthraquinone structure, and which has absorption at 300 nm or more. Examples of still other preferable sulfonium salts include a sulfonium salt in which a triarylsulfonium salt is substituted with an aryloxy group or an arylthio group, and which has absorption at 300 nm or more.

Furthermore, examples of the onium salt compound include onium salts such as selenonium salts described in J. V. Crivello, et al., Macromolecules, 10 (6), 1307 (1977) and J. V. Crivello, et al., J. Polymer Sci., Polymer Chem. Ed., 17, 1047 (1979), arsonium salts described in C. S. Wen, et al., Tech. Proc. Conf. Rad. Curing ASIA, p. 478, Tokyo, October (1988) and the like, and others.

Examples of the acyl phosphine (oxide) compound include IRGACURE 819, DAROCURE 4265, DAROCURE TPO, and the like, all of which are manufactured by Ciba Specialty Chemicals, and others.

As (C) the photopolymerization initiator used in the invention, from the viewpoint of exposure sensitivity, a compound selected from the group consisting of a trihalomethyl triazine-based compound, a benzyldimethyl ketal compound, an α-hydroxyketone compound, an α-aminoketone compound, an acyl phosphine-based compound, a phosphine oxide-based compound, a metallocene compound, an oxime-based compound, a triallyl imidazole dimer, an onium-based compound, a benzothiazole-based compound, a benzophenone-based compound, an acetophenone-based compound and a derivative thereof, a cyclopentadiene-benzene-iron complex and a salt thereof, a halomethyl oxadiazole compound, and a 3-aryl-substituted coumarin compound is preferable.

A trihalomethyltriazine-based compound, an α-aminoketone compound, an acyl phosphine-based compound, a phosphine oxide-based compound, an oxime-based compound, a triarylimidazoledimer, an onium-based compound, a benzophenone-based compound, or an acetophenone-based compound is more preferable, and at least one compound selected from the group consisting of a trihalomethyltriazine-based compound, an α-aminoketone compound, an oxime-based compound, a triarylimidazole dimer, or a benzophenone-based compound is most preferable.

Particularly, when the polymerizable composition of the invention is used in the manufacture of a solid-state imaging device with a color filter, it is necessary to form fine pixels in a sharp shape, and accordingly, curing property and development of a fine unexposed portion without residues are important. From such a viewpoint, an oxime-based compound is particularly preferable. Particularly, in the case of forming fine pixels in a solid-state imaging device, a stepper exposure device is used for exposure for curing, but this exposure device has a risk of being impaired by halogen, and it is necessary to reduce the addition amount of the photopolymerization initiator. Accordingly, in consideration of this aspect, it can be said that it is most preferable to use an oxime-based compound as (C) the photopolymerization initiator to form a fine colored region (pattern) as in a solid-state imaging device.

The content of (C) the photopolymerization initiator contained in the polymerizable composition of the invention is preferably from 0.1 to 50% by mass, and more preferably from 0.5 to 30% by mass, and particularly preferably from 1 to 20% by mass, with respect to the total solid content of the polymerizable composition. In this range, a good sensitivity and pattern forming property can be obtained.

<(D) Titanium Black Dispersion>

(D) The titanium black dispersion in the invention refers to a dispersion in which titanium black as a solid content is dispersed in an appropriate solvent, and a dispersant may be further added thereto.

(Titanium Black)

The titanium black in the invention refers to a black particle having a titanium atom. It is preferably low valence titanium oxide, titanium oxynitride, or the like. The surface of titanium black particles can be modified as necessary for the purpose of improving the dispersibility, suppressing the aggregability, or the like. The titanium black can be coated with silicon oxide, titanium oxide, germanium oxide, aluminum oxide, magnesium oxide, or zirconium oxide, and it is also possible to carry out a treatment with a water-repellent material such as that shown in JP-A No. 2007-302836.

Furthermore, for the purpose of adjusting dispersibility, coloration properties, or the like, the titanium black may contain one type of black pigment such as composite oxides of Cu, Fe, Mn, V, Ni, and the like, cobalt oxide, iron oxide, carbon black, aniline black, and the like, or two or more types thereof in combination. In this case, the titanium black particles comprise 50% by mass or more of the pigment.

Moreover, for the purpose of controlling light-blocking properties at a desired wavelength, an existing colorant such as pigments or dyes with colors of red, blue, green, yellow, cyan, magenta, violet, orange, etc., and the like, or other black pigments such as carbon black, iron oxide, manganese oxide, graphite, and the like may be added.

The pigment used in combination is preferably used in a range from 2 to 50 parts by mass, more preferably from 2 to 30 parts by mass, and most preferably from 2 to 10 parts by mass, with respect to 100 parts by mass of the sum of the black pigment and the pigment used in combination.

Examples of the commercially available product of titanium black include Titanium Black 10 S, 12 S, 13 R, 13 M, 13 M-C, 13 R, and 13 R-N, all manufactured by Mitsubishi Materials Corporation, TILACK D manufactured by Ako Kasei Co., Ltd., and the like.

Examples of the method for preparing the titanium black include, but are not limited to, a method in which a mixture of titanium dioxide and metallic titanium is heated in a reducing atmosphere, thus carrying out reduction (JP-A No. 49-5432), a method in which ultrafine titanium dioxide obtained by high temperature hydrolysis of titanium tetrachloride is reduced in a reducing atmosphere containing hydrogen (JP-A No. 57-205322), a method in which titanium dioxide or titanium hydroxide is reduced at high temperature in the presence of ammonia (JP-A No. 60-65069 and JP-A No. 61-201610), a method in which a vanadium compound is deposited on titanium dioxide or titanium hydroxide, and a high temperature reduction is carried out in the presence of ammonia (JP-A No. 61-201610), and the like.

The particle diameter of the titanium black particles is not particularly limited, but from the viewpoint of dispersibility and coloration properties, it is preferably from 3 to 2000 nm, and more preferably from 10 to 500 nm.

The specific surface area of the titanium black is not particularly limited, but in order to obtain a predetermined performance for water repellency after titanium black is surface-treated with a water repellant, a value measured by a BET method is preferably about 5 to 150 $m^2/g$, and more preferably about 20 to 100 $m^2/g$.

In addition, from the viewpoint of improvement of the dispersibility of the titanium black, it is preferable that a pigment dispersant be added.

(Dispersant)

Examples of the dispersant for titanium black and an optional pigment (hereinafter simply referred to as "pigments such as titanium black and the like"), which can be used in the invention, include polymeric dispersants [for example, a polyamidoamine and a salt thereof, a polycarboxylic acid and a salt thereof, a high molecular weight unsaturated acid ester, a modified polyurethane, a modified polyester, a modified poly(meth)acrylate, a (meth)acrylic copolymer, and a naphthalenesulfonic acid-formalin condensate], a polyoxyethylene alkyl phosphoric acid ester, a polyoxyethylene alkylamine, an alkanolamine, pigment derivatives, and the like.

The polymeric dispersants may be further classified on the basis of the structure, into a linear polymer, a terminal modified polymer, a graft type polymer and a block type polymer.

A polymeric dispersant adsorbs to the surface of pigments such as titanium black and the like, and prevents re-aggregation. Thus, a terminal modified polymer, a graft type polymer, and a block type polymer, having an anchor site to the pigment surface, may be mentioned as preferred structures.

Further, as the dispersant in the invention, from the viewpoint of improvement of sensitivity, a resin having a polymerizable group such as an allyl group, a (meth)acryl group, a styryl group, and the like in the side chain can also be suitably used.

On the other hand, the pigment derivative modifies the surface of pigments such as titanium black and the like, thereby having an effect to enhance the adsorption of the polymeric dispersant.

Specific examples of the pigment dispersant which can be used in the invention include "DISPERBYK-101 (polyamidoamine phosphate), 107 (carboxylic ester), 110 (copolymerization product containing acid groups), 130 (polyamide), 161, 162, 163, 164, 165, 166, and 170 (high molecular copolymerization products)" and "BYK-P104, P105 (high molecular weight unsaturated polycarboxylic acid)" manufactured by BYK Chemie; "EFKA4047, 4050, 4010, and 4165 (polyurethane type), EFKA4330 and 4340 (block copolymer), 4400, 4402 (modified polyacrylate), 5010 (polyesteramide), 5765 (high molecular weight polycarboxylic acid salt), 6220 (aliphatic acid polyester), 6745 (phthalocyanine derivative), and 6750 (azo pigment derivative)" manufactured by EFKA; "AJISPER PB-821 and PB-822" manufactured by Ajinomoto-Fine-Techno Co., Inc.; "FLOWLEN TG-710 (urethaneoligomer)" and "POLYFLOW No. 50E, No. 300 (acrylic-type copolymer)" manufactured by KYOEISHA CHEMICAL CO., LTD.; "DISPARLON KS-860, 873SN, 874, #2150 (aliphatic polycarboxylic acid), #7004 (polyether ester), DA-703-50, DA-705, DA-725" manufactured by Kusumoto Chemicals, Ltd.; "DEMOL RN, N (naphthalenesulfonic acid formaldehyde polycondensation product), MS, C and SN-B (aromatic sulfonic acid formaldehyde polycondensation product)", "HOMOGENOL L-18 (polymer polycarboxylic acid)", "EMULGEN 920, 930, 935 and 985 (polyoxyethylene nonylphenyl ether)", and "ACETAMIN 86 (stearylamine acetate)" manufactured by Kao Corporation; "SOLSPERSE 5000 (phthalocyanine derivative), 22000 (azo pigment derivative), 13240 (polyester amine), 3000, 17000, 27000 (polymer having a functional part at the terminal), 24000, 28000, 32000 and 38500 (graft-type polymer)" manufactured by The Lubrizol Corporation; "NIKKOL T106 (polyoxyethylene sorbitan monooleate), MYS-IEX (polyoxyethylene monostearate)" manufactured by Nikko Chemicals; and the like.

These dispersants may be used singly or in combination of two or more kinds thereof. In the invention, it is particularly preferable to use the pigment derivative and the polymeric dispersant in combination.

(Solvent)

As a solvent used for (D) the titanium black dispersion above, various types of water-soluble or water-insoluble solvents may be used as long as they can function as a solvent, and examples thereof include water; alcohols such as methyl alcohol, ethyl alcohol, isopropyl alcohol, butyl alcohol, allyl alcohol, and the like; glycols and derivatives thereof such as ethylene glycol, propylene glycol, propylene glycol monomethyl ether, diethylene glycol, polyethylene glycol, polypropylene glycol, diethylene glycol monoethyl ether, polypropylene glycol monoethyl ether, polyethylene glycol monoallyl ether, polypropylene glycol monoallyl ether, and the like; glycerols and derivatives thereof such as glycerol, glycerol monoethyl ether, glycerol monoallyl ether, and the like; ethers such as tetrahydrofuran, dioxane, and the like; ketones such as methyl ethyl ketone, methyl isobutyl ketone, and the like; hydrocarbons such as liquid paraffin, decane, decene, methylnaphthalene, decalin, kerosene, diphenylmethane, toluene, dimethylbenzene, ethylbenzene, diethylbenzene, propylbenzene, cyclohexane, partially hydrogenated triphenyl, and the like, silicone oils such as polydimethylsiloxane, partially octyl-substituted polydimethylsiloxane, partially phenyl-substituted polydimethylsiloxane, fluorosilicone oil, and the like, halohydrocarbons such as chlorobenzene, dichlorobenzene, bromobenzene, chlorodiphenyl, chlorodiphenylmethane, and the like, fluorides such as DAIFLOIL (Daikin Industries Ltd.), DEMNUM (Daikin Industries Ltd.), and the like, ester compounds such as ethyl benzoate, octyl benzoate, dioctyl phthalate, trioctyl trimellitate, dibutyl sebacate, ethyl(meth)acrylate, butyl(meth)acrylate, dodecyl(meth)acrylate, ethyl acetate, butyl acetate, propylene glycol monomethyl ether acetate, and the like, amide-based solvents such as N,N-dimethylacrylamide, N,N-dimethylacetamide, N-methylpyrrolidone, and the like, and others may be selected as appropriate and used singly or in combination of plural kinds thereof.

In the preparation of (D) the titanium black dispersion according to the invention, a dispersant is preferably added in an amount of 5 to 200 parts by mass, and more preferably 10 to 100 parts by mass, with respect to 100 parts by mass of a pigment such as titanium black and the like. That is, if the dispersant is less than 5 parts by mass, there is a risk that it becomes difficult to sufficiently modify the surface properties and state of the titanium black, whereas if it is more than 200 parts by mass, the amount of the polymer to be dispersed and blended with titanium black increases, and there is a risk that the inherently required characteristics of titanium black, such as light-blocking property, coloring properties, and the like will be deteriorated.

When titanium black is added in the form of (D) the titanium black dispersion prepared in advance to the polymerizable composition of the invention, the dispersibility and the dispersion stability of titanium black are improved.

Further, the content of (D) the titanium black dispersion added to the polymerizable composition is preferably adjusted such that the content of the titanium black in the polymerizable composition in terms of a solid content be from 40% by mass to 90% by mass, more preferably from 45% by mass to 80% by mass, and particularly preferably from 50% by mass to 75% by mass.

The polymerizable composition of the invention may further contain optional components as described below, if desired. Hereinbelow, the optional components which can be contained in the polymerizable composition will be described.

[Sensitizer]

The polymerizable composition of the invention may contain a sensitizer for the purpose of improvement in radical generating efficiency of the radical initiator and achievement of a longer photosensitive wavelength.

As the sensitizer which can be used in the invention, those capable of sensitizing (C) the above-mentioned photopolymerization initiator (particularly preferably, an oxime compound) by an electron transfer mechanism or an energy transfer mechanism are preferable.

As the sensitizer used in the invention, those belonging to the compounds listed below and having the absorption wavelength in the wavelength region from 300 nm to 450 nm may be mentioned.

For example, polynuclear aromatic compounds (for example, phenanthrene, anthracene, pyrene, perylene, triphenylene, and 9,10-dialkoxyanthracene), xanthenes (such as fluorescein, eosin, erythrosine, rhodamine B, and rose bengal), thioxanthones (isopropylthioxanthone, diethylthioxanthone, and chlorothioxanthone), cyanines (for example, thiacarbocyanine and oxacarbocyanine), merocyanines (for example, merocyanine and carbomerocyanine), phthalocyanines, thiazines (for example, thionine, methylene blue, and toluidine blue), acrydines (for example, acrydine orange, chloroflavin, and acryflavin), anthraquinones (for example, anthraquinone), squariums (for example, squarium), acrydine orange, coumarines (for example, 7-diethylamino-4-methyl coumarin), ketocoumarin, phenothiadines, phenadines, styrylbenzenes, azo compounds, diphenylmethane, triphenylmethane, distyrylbenzenes, carbazoles, porphilin, spiro compounds, quinacridones, indigo, styryl, pyrylium compounds, pyromethene compounds, pyrazolotriazole compounds, benzothiazole compounds, barbituric acid derivatives, thiobarbituric acid derivatives, acetophenone, benzophenone, thioxantone, aromatic ketone compounds such as Michler's ketone and the like, heterocyclic compounds such as N-aryl oxazolidinone and the like, and others are also included.

More preferable examples of the sensitizer in the polymerizable composition of the invention include the following compounds represented by the following general formulae (e-1) to (e-4).

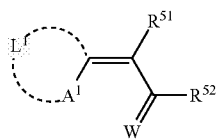

(e-1)

(In the formula (e-1), $A^1$ represents a sulfur atom or $NR^{50}$, $R^{50}$ represents an alkyl group or an aryl group, $L^1$ represents a nonmetallic atomic group which forms a basic nucleus of the pigment in association with adjacent $A^1$ and an adjacent carbon atom, $R^{51}$ and $R^{52}$ each independently represent a hydrogen atom or a monovalent nonmetallic group, and $R^{51}$ and $R^{52}$ may be bonded to each other to form an acidic nucleus of the pigment. W represents an oxygen atom or a sulfur atom.)

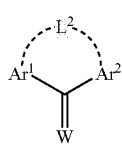

(e-2)

(In the formula (e-2), $Ar^1$ and $Ar^2$ each independently represent an aryl group, which are linked via a bond by -$L^2$-, wherein $L^2$ represents —O— or —S—. W has the same meaning as in the formula (e-1).)

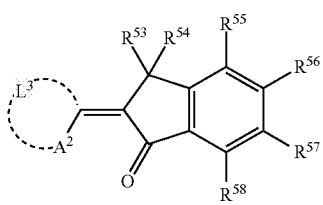

(e-3)

(In the formula (e-3), $A^2$ represents a sulfur atom or $NR^{59}$, $L^3$ represents a nonmetallic atomic group which forms a basic nucleus of the pigment in association with adjacent $A^2$ and an adjacent carbon atom, $R^{53}$, $R^{54}$, $R^{55}$, $R^{56}$, $R^{57}$, and $R^{58}$ each independently represent a monovalent nonmetallic atomic group, and $R^{59}$ represents an alkyl group or an aryl group.)

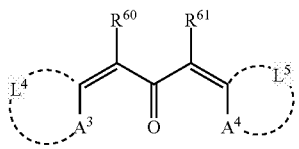

(e-4)

(In the formula (e-4), $A^3$ and $A^4$ each independently represent —S— or —$NR^{62}$. $R^{62}$ represents a substituted or unsubstituted alkyl group, or a substituted or unsubstituted aryl group, $L^4$ and $L^5$ each independently represent a nonmetallic atomic group which forms a basic nucleus of the pigment in association with adjacent $A^3$ or $A^4$ and an adjacent carbon atom, and $R^{60}$ and $R^{61}$ each independently represent a monovalent nonmetallic atomic group, and may be bonded to each other to form an aliphatic or aromatic ring.)

The content of the sensitizer in the polymerizable composition of the invention with respect to the total solid content is preferably from 0.1 to 20% by mass, and more preferably from 0.5 to 15% by mass in view of the light absorption efficiency at a deeper portion and the initiation decomposition efficiency.

The sensitizers may be used singly or in a combination of two or more kinds thereof.

Furthermore, examples of the preferred sensitizer which can be contained in the polymerizable composition of the invention include, in addition to the above-described sensitizers, at least one selected from a compound represented by the following general formula (II) and a compound represented by the following general formula (III).

These may be used singly or in a combination of two or more kinds thereof

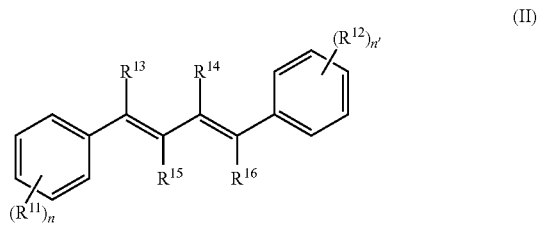

(II)

In the general formula (II), $R^{11}$ and $R^{12}$ are each independently a monovalent substituent; $R^{13}$, $R^{14}$, $R^{15}$, and $R^{16}$ are each independently a hydrogen atom or a monovalent substituent; and n is an integer of 0 to 5, and n' is an integer of 0 to 5, where n and n' are not 0 at the same time. When n is 2 or greater, a plurality of $R^{11}$ may be the same as or different from each other, and when n' is 2 or greater, plural $R^{12}$ may be the same as or different from each other. Further, the isomer due to a double bond in the general formula (II) is not limited to any isomer.

For the compounds represented by the general formula (II), the molar absorption coefficient ε at wavelength 365 nm is preferably 500 $mol^{-1} \cdot L \cdot cm^{-1}$ or greater, more preferably 3000 $mol^{-1} \cdot L \cdot cm^{-1}$ or greater, and most preferably 20,000 $mol^{-1} \cdot L \cdot cm^{-1}$ or greater. When the molar absorption coefficient ε at each wavelength is in the above range, sensitivity is improved highly effectively from the viewpoint of light absorption efficiency, thus it is preferable.

Specific examples of the preferable compound represented by the general formula (II) will be shown below, but the invention is not limited to these.

Moreover, in the present specification, there may be a case where the chemical formula is shown as a simplified structural formula, and particularly the solid line or the like with no element or substituent indicates a hydrocarbon group.

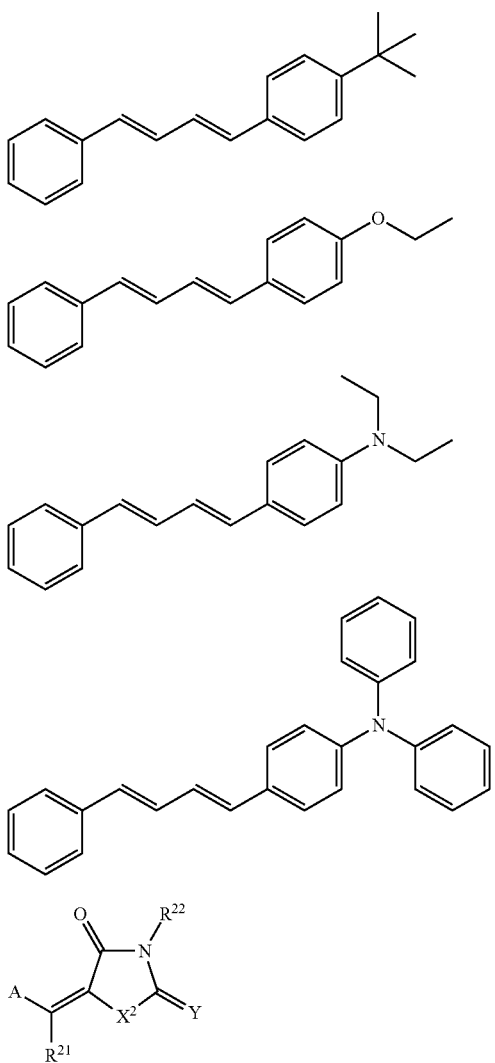

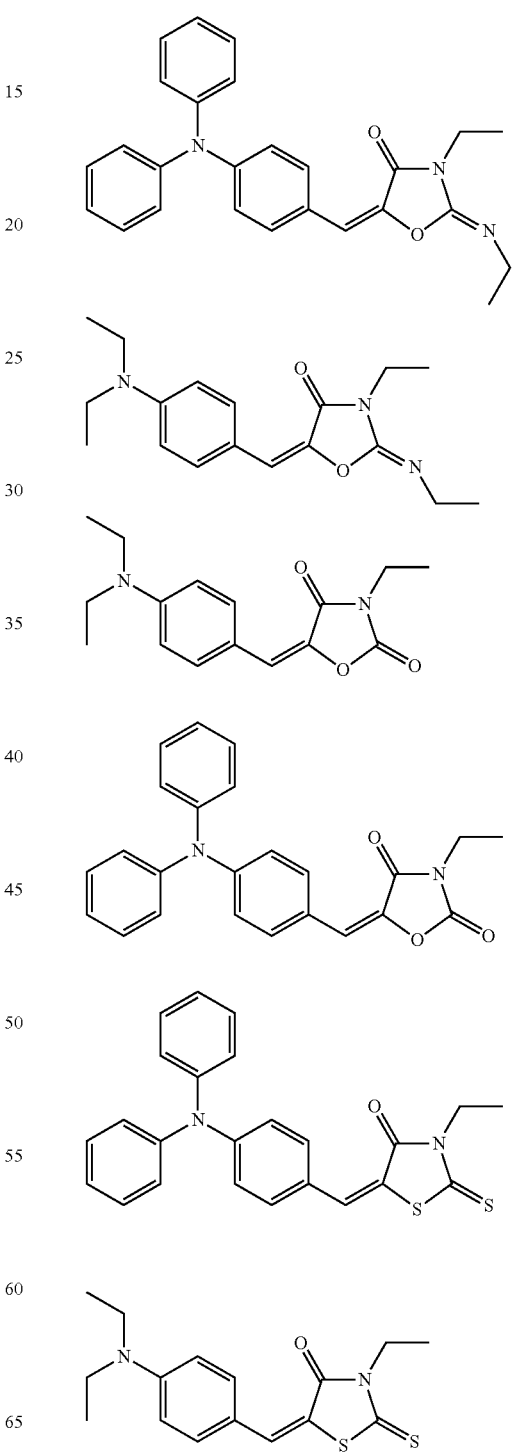

In the general formula (III), A represents an aromatic ring or hetero ring, which may have a substituent; $X^2$ represents an oxygen atom, a sulfur atom, or —N($R^{23}$)—; Y represents an oxygen atom, a sulfur atom, or —N($R^{23}$)—; and $R^{21}$, $R^{22}$, and $R^{23}$ each independently represent a hydrogen atom or a monovalent non-metallic atomic group, while A, $R^{21}$, $R^{22}$, and $R^{23}$ may be bonded to each other to form an aliphatic or aromatic ring.

In the general formula (III), $R^{21}$, $R^{22}$, and $R^{23}$ are each independently a hydrogen atom or a monovalent non-metallic atomic group. When $R^{21}$, $R^{22}$, and $R^{23}$ each represent a monovalent non-metallic atom, they are preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxyl group, or a halogen atom.

In the compound represented by the general formula (III), Y is preferably an oxygen atom or —N($R^{23}$)— from the viewpoint of improving the decomposition efficiency of the photopolymerization initiator. $R^{23}$'s are each independently a hydrogen atom or a monovalent non-metallic atomic group. Further, Y is most preferably —N($R^{23}$)—.

Hereinbelow, specific examples of the preferable compound represented by the general formula (III) will be presented, but the invention is not limited to these. The isomer due to a double bond linking the acidic nucleus and the basic nucleus is not clarified, and the invention is not limited to any isomer.

-continued

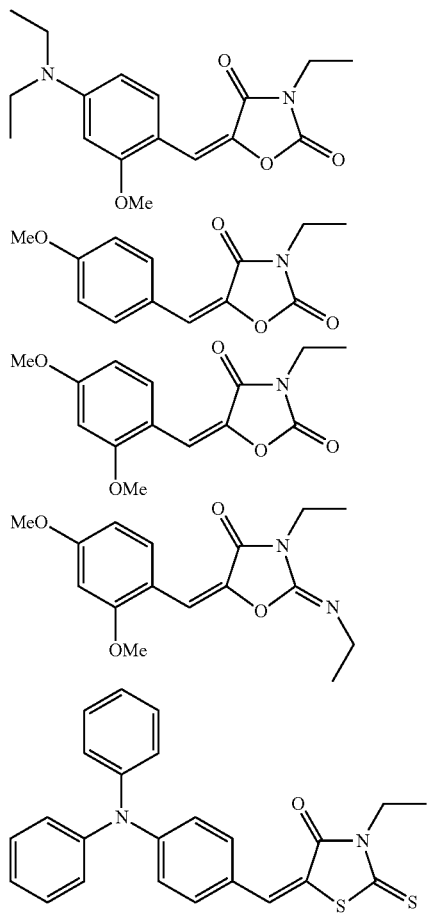

[Cosensitizer]

The polymerizable composition of the invention preferably contains a cosensitizer.

In the invention, the cosensitizer has the actions of further improving the sensitivity of (C) the photopolymerization initiator or the sensitizer with respect to the actinic radiation, or restraining the polymerization inhibition of (A) the polymerizable compound due to oxygen, or the like.

Examples of such a cosensitizer include the amines such as the compounds described in for example "Journal of Polymer Society" vol. 10, page 3173 (1972) written by M. R. Sander et al., JP-B No. 44-20189, JP-A No. 51-82102, JP-A No. 52-134692, JP-A No. 59-138205, JP-A No. 60-84305, JP-A No. 62-18537, and JP-A No. 64-33104, and Research Disclosure No. 33825, and the like, and specifically, triethanolamine, ethyl p-dimethylaminobenzoate, p-formyl dimethylaniline, p-methyl thiodimethylaniline, and the like.

Other examples of the cosensitizer include thiols and sulfides, for example, thiol compounds described in JP-A No. 53-702, JP-B No. 55-500806, and JP-A No. 5-142772, disulfide compounds described in JP-A No. 56-75643, and the like, and specifically, 2-mercaptobenzothiazole, 2-mercaptobenzoxazole, 2-mercaptobenzimidazole, 2-mercapto-4(3H)-quinazoline, β-mercaptonaphthalene, and the like.

In addition, other examples of the cosensitizer include amino acid compounds (for example, N-phenylglycine and the like), organic metal compounds (for example, tributyltin acetate and the like) described in JP-B No. 48-42965, hydrogen donating compounds described in JP-B No. 55-34414, sulfur compounds (for example, trithiane and the like) described in JP-A No. 6-308727, and others.

From the viewpoint of the improvement of the curing speed according to the balance of the polymerization growth speed and the chain transfer, the content of the cosensitizer with respect to the weight of the total solid content of the polymerizable composition of the invention is preferably in a range from 0.1 to 30% by mass, more preferably in a range from 1 to 25% by mass, and even more preferably in a range from 0.5 to 20% by mass.

[Adhesion Promoter]

An adhesion promoter may be added to the polymerizable composition of the invention in order to improve the adhesion to a hard surface such as a support and the like. Examples of the adhesion promoter include a silane coupling agent, a titanium coupling agent, and the like.

Examples of the silane coupling agent include, for example, γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatepropyltrimethoxysilane, γ-isocyanatepropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, (acryloxymethyl)methyldimethoxysilane, and the like.

Among these, the silane coupling agent is preferably γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, or phenyltrimethoxysilane, and most preferably γ-methacryloxypropyltrimethoxysilane.

When the polymerizable composition of the invention contains the adhesion promoter, the addition amount of the adhesion promoter is preferably 0.1 to 30% by mass, and more preferably 0.5 to 20% by mass, in the total solid content of the polymerizable composition of the invention.

[Diluent]

In the polymerizable composition of the invention, various organic solvents can be used as a diluent.

Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, and the like.

These solvents may be used singly or as a mixture. The solid concentration with respect to the organic solvent is preferably 2 to 60% by mass.

[Other Additives]

Further, known additives such as an inorganic filler for improving the physical properties of a cured film, a plasticizer, a fat-sensitizer, and the like may be added to the polymerizable composition of the invention.

Examples of the plasticizers include dioctyl phthalate, didodecyl phthalate, triethylene glycol dicaprylate, dimethyl glycol phthalate, tricresyl phosphate, dioctyl adipate, dibutyl sebacate, triacetyl glycerin, and the like. When a binder is used, the plasticizer can be added in an amount of 10% by mass or less with respect to the total weight of the polymerizable compound and the binder polymer.

(Polymerization Inhibitor)

In the invention, it is preferable to add a small amount of a thermal polymerization inhibitor for inhibiting the unnecessary thermal polymerization of the compound having a polymerizable ethylenically unsaturated double bond during the preparation or the storage of the polymerizable composition.

Examples of the thermal polymerization inhibitor which can be used in the invention include hydroquinone, p-methoxyphenol, di-t-butyl-p-cresol, pyrogarol, t-butylcatechol, benzoquinone, 4,4'-thiobis(3-methyl-6-t-butylphenol), 2,2'-methylenebis(4-methyl-6-t-butyl phenol), a N-nitrosophenylhydroxylamine cerium salt, and the like.

An addition amount of the thermal polymerization inhibitor is preferably from about 0.01% by mass to about 5% by mass with respect to a weight of the total composition. If desired, in order to prevent polymerization inhibition with oxygen, a higher fatty acid derivative such as behenic acid and behenic amide, and the like may be added, and distributed in a surface of a photosensitive layer during a drying process after coating. An addition amount of the higher fatty acid derivative is preferably from about 0.5% by mass to about 10% by mass of the total composition.

<Light-Blocking Color Filter and Method for Producing the Same>

Next, the light-blocking color filter of the invention and a method for producing the same will be described.

The "light-blocking color filter" in the invention refers to a light-blocking pattern obtained by exposing a photosensitive polymerizable composition including at least a black color material, a polymerizable compound, a binder polymer, a photopolymerization initiator, and a solvent, and developing the photosensitive polymerizable composition that has been exposed. The color of the "light-blocking color filter" in the invention may be an achromatic color such as black, gray, and the like, or may be black, gray, or the like mixed with a chromatic color.

In addition, since the "light-blocking color filter" is obtained by exposing a photosensitive polymerizable composition including at least a black color material, a polymerizable compound, a binder polymer, a photopolymerization initiator, and a solvent and developing the photosensitive polymerizable composition that has been exposed, it may also be referred to as a light-blocking film or light-blocking filter.

The light-blocking color filter (hereinafter simply referred to as the "color filter") has a colored region (pattern) formed on a support using the polymerizable composition of the invention. Hereinbelow, the color filter will be described in detail with reference to the method for producing the same.

Specifically, the method of producing the light-blocking color filter includes a step of coating the polymerizable composition of the invention on a support to form a colored polymerizable composition layer (hereinafter, appropriately referred to as the "colored polymerizable composition layer-foaming step"), a step of exposing the colored polymerizable composition layer through a mask (hereinafter, appropriately referred to as the "exposing step"), and a step of developing the polymerizable composition layer after exposure to form a colored region (pattern) (hereinafter, appropriately referred to as the "developing step").

Specifically, the above-described color filter can be produced by coating the polymerizable composition of the invention directly or via another layer onto a support (substrate) to form a polymerizable composition layer (a colored polymerizable composition layer-forming step), exposing the layer through a predetermined mask pattern and curing only the coated film portion which has been irradiated (an exposing step), and developing the layer with a developer (a developing step) to form a pattern-wise film.

Hereinbelow, each step in the production method of the invention will be described.

[Colored Polymerizable Composition Layer-Forming Step]

In the colored polymerizable composition layer-forming step, the polymerizable composition of the invention is coated onto a support to form a colored polymerizable composition layer.

Examples of the support which can be used in the present step include a soda glass, a PYREX (registered trademark) glass, a quartz glass and these glass with a transparent conduction film attached thereto, which are used in a liquid crystal display device or the like, a photoelectric conversion element substrate used in an imaging device or the like, for example, a silicon substrate, a complementary metal oxide film semiconductor (CMOS), and the like. On these substrates, a black stripe, which isolates each pixel, is formed in some cases.

If necessary, on these supports, an undercoat layer may be provided for improving adhesion with an upper layer, preventing the diffusion of a substance, and flattening a substrate surface.

As the method of applying the polymerizable composition of the invention onto a support, there are various application methods to be employed such as slit coating, an ink-jet process, spin coating, casting coating, roll coating, a screen printing method, and the like.

The coating film thickness of the polymerizable composition of the invention is in the range of preferably 0.1 μm to 10 μm, more preferably 0.2 μm to 5 μm, and even more preferably 0.2 μm to 3 μm.

Further, in the production of a color filter for a solid-state imaging device, the coating film thickness of the polymerizable composition is preferably 0.35 μm to 1.5 μm, and more preferably 0.40 μm to 1.0 μm, from the viewpoint of resolution and developability.

The polymerizable composition coated on the support is dried usually under the condition of at 70° C. to 110° C. for about 2 minutes to 4 minutes to form a colored polymerizable composition layer.

[Exposing Step]

In the exposing step, the colored polymerizable composition layer formed in the above-mentioned colored polymerizable composition layer-forming step is exposed through a mask, and only the coated film portion which has been irradiated is cured.

Exposure is preferably carried out by irradiation, and as the irradiation which can be used in exposure, particularly, UV ray such as a g-ray, an i-ray, and the like is preferably used, and high-pressure mercury lamp or the like is more desirable. The radiation intensity is preferably from 5 mJ to 1500 mJ, more preferably from 10 mJ to 1000 mJ, and most preferably from 10 mJ to 800 mJ.

[Developing Step]

When an alkali developing treatment (developing step) is subsequently carried out, a portion not irradiated with light in the exposing step is eluted with an aqueous alkali solution to leave only the light cured portion.

The developer is desirably an organic alkali developer that does not cause damage to a circuit of the substrate or the like. The developing temperature is usually from 20° C. to 30° C., and the developing time is usually from 20 to 90 seconds.

Examples of the alkali used in the developer include organic alkali compounds such as aqueous ammonia, ethylamine, diethylamine, dimethylethanolamine, tetramethylammonium hydroxide, tetraethylammonium hydroxide, choline, pyrrole, piperidine, 1,8-diazabicyclo-[5,4,0]-7-undecene, and the like, and these alkali agents are diluted with pure water such that the alkali agent concentration is in the range of 0.001 to 10% by mass, and preferably 0.01 to 1% by mass, thereby giving an aqueous alkali solution, which can be used preferably as a developer. Further, when a developer including such an aqueous alkali solution is used, washing with pure water (rinsing) is usually performed after the development.

Further, the method for producing a color filter may include a curing step in which the formed colored region (pattern) is cured by heating and/or exposure, if required, after carrying out the polymerizable composition layer-forming step, the exposing step, and the developing step.

Since the color filter employs the polymerizable composition of the invention, the formed colored region (pattern) exhibits a high adhesiveness to a support substrate, and since the cured composition is excellent in resistance to development, excellent exposure sensitivity and adhesiveness to a substrate of an exposed portion are exhibited, thereby forming a high resolution pattern providing a desired cross-sectional shape. Accordingly, it is suitable for liquid crystal display devices and solid-state imaging devices such as CCD and the like, particularly suitable for a high resolution CCD device, CMOS, or the like having greater than 1,000,000 pixels. That is, the color filter is preferably applied for a solid-state imaging device.

The color filter can be used as, for example, a color filter disposed between the light-receiving part of the pixels for constituting the CCD and micro-lenses for converging the light.

<<Solid-State Imaging Device>>

The solid-state imaging device of the invention is provided with the light-blocking color filter for a solid-state imaging device of the invention.

Since the solid-state imaging device of the invention is provided with the light-blocking color filter of the invention, in which degradation of light-blocking performances at the periphery is suppressed, it is possible to reduce the noise and improve the color reproducibility of the solid-state imaging device.

The constitution of the solid-state imaging device of the invention is not particularly limited as long as it has the light-blocking color filter for a solid-state imaging device of the invention, and functions as a solid-state imaging device. However, one example of the constitution of the solid-state imaging device includes, on a support, light-receiving elements formed of a plural number of photo diodes and polysilicon or the like, which serves as a light-receiving area of the solid-state imaging device (a CCD image sensor, a CMOS image sensor, and the like), and the light-blocking color filter for a solid-state imaging device of the invention on the surface of the support opposite to the surface on which the light-receiving elements are formed.

EXAMPLES

Hereinafter, the present invention will be described in more detail by reference to Examples, but the invention is not limited to these. Further, in the following Examples, "parts" refers to parts by mass unless otherwise specified.

(Synthesis of Specific Resin 1)

800 parts of cyclohexanone was introduced into a reaction container and then heated to 100° C. while nitrogen gas was injected into the container, and a mixture of 60.0 parts of styrene, 80.0 parts of methacrylic acid, 68.0 parts of methyl methacrylate, 62.0 parts of butyl methacrylate, and 9.0 parts of azobisisobutyronitrile was added dropwise at the same temperature for 1 hour and subjected to a polymerization reaction. After the dropwise addition, the reaction was continued at 100° C. for an additional 3 hours, and a solution obtained by dissolving 2.0 parts of azobisisobutyronitrile in 50 parts of cyclohexanone was added thereto and subjected to reaction at 100° C. for an additional 1 hour to obtain a solution of an acryl resin 1 having a weight-average molecular weight of about 30,000 and an acid value of 3.44 mmol/g.

After cooling to room temperature, about 2 g of the resin solution was sampled, then dried under heating at 180° C. for 20 minutes, and the nonvolatile matter thereof was measured. The previously synthesized resin solution was mixed with cyclohexanone such that its nonvolatile matter was adjusted to 20% by mass, to prepare a specific resin 1 solution.

(Synthesis of Specific Resin 2)

To the acryl resin 1 solution were added 10 parts by mass of glycidyl methacrylate and 1 part by mass of tetraethylammonium bromide, followed by stirring at 90° C. for 2 hours to obtain a solution of a specific resin 2 having a double bond group introduced in the side chain, and having a weight-average molecular weight of about 32000 and an acid value of 3.1 mmol/g.

Thereafter, the solvent amount was adjusted so as to have a content of the nonvolatile matter of 20% by mass in the same manner as the synthesis of the specific resin 1, thereby obtaining a specific resin 2 solution.

(Synthesis of Specific Resin 3)

To a 30% by mass propylene glycol monomethyl ether acetate solution of polyacrylic acid/methyl methacrylate (mass ratio 50 parts/50 parts) having a weight-average molecular weight of 10,000 and an acid value of 6.9 mmol/g were added 50 parts by mass of glycidyl methacrylate and 1 part by mass of tetraethylammonium bromide, followed by stirring at 90° C. for 3 hours to obtain a specific resin 3 having a double bond group introduced in the side chain, and having a weight-average molecular weight of 12,000 and an acid value of 1.95 mmol/g.

Thereafter, the solvent amount was adjusted so as to have a content of nonvolatile matter of 20% by mass in the same manner as the synthesis of the specific resin 1, thereby obtaining a specific resin 3 solution.

(Synthesis of Specific Resin 4)

To a 1000-ml three-necked flask, 100 g of 1-methyl-2-pyrrolidone was charged, followed by heating to 90° C. under nitrogen gas flow. 84 g of Compound (i-1) below, 33 g of benzyl methacrylate, 14 g of methacrylic acid, and 100 g of a 1-methyl-2-pyrrolidone solution with 5.2 g of V-601 (manufactured by Wako Pure Chemical Industries, Ltd.) were added dropwise thereto for 2 hours. After the dropwise addition, the solution was further stirred for 2 hours. Then, the reaction solution was cooled to room temperature and then poured into 7 L of water to precipitate a polymer compound. The precipitated polymer compound was collected by filtration, washed with water, and dried to obtain 131 g of a polymer compound.

The weight-average molecular weight of the obtained polymer compound was measured by means of Gel Permeation Chromatography (GPC) using polystyrene as a standard material, and the result obtained was 11800. Further, the acid value of the polymer compound was determined by titration and it was found to be 69.6 mgKOH/g (calculated value 69.7 mgKOH/g).

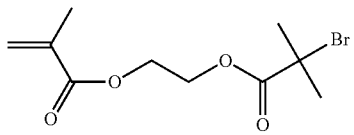

(i-1)

To 131 g of the obtained polymer compound was added 1.0 g of p-methoxyphenol, and 580 g of 1-methyl-2-pyrrolidone was added thereto and dissolved, and then cooled in an ice bath filled with ice water. When the temperature of the mixed solution reached 5° C. or lower, 150 g of 1,8-diazabicyclo[5.4.0]-7-undecene (DBU) was further added dropwise through a dripping funnel for 1 hour. After the dropwise addition, the ice bath was removed and the mixed solution was further stirred for 8 hours. To the reaction solution, concentrated hydrochloric acid was added to adjust the pH to 7, and then the solution was poured into 7 L of water to precipitate a polymer compound [specific resin (I)]. The precipitated polymer compound was collected by filtration, washed with water, and dried to obtain 105 g of a desired specific dispersion resin 4.

(Synthesis of Specific Resin 5)

In a 500-ml 3-necked round-bottom flask equipped with a condenser and a stirrer, 8.2 g (0.05 moles) of 2,2-bis(hydroxymethyl)butanoic acid and 8.01 g (0.05 moles) of a diol compound (1) below were dissolved in 100 ml of N,N-dimethylacetamide. To the solution were added 25.5 g (0.102 moles) of 4,4-diphenylmethane diisocyanate and 0.1 g of dibutyltin dilaurate, and the mixture was heated at 100° C. for 6 hours under stirring. Then, the reaction mixture was diluted with 100 ml of N,N-dimethylformamide and 200 ml of methyl alcohol, and stirred for 30 minutes. The reaction solution was poured into 3 liters of water while stirring to precipitate a white polymer. This polymer was collected by filtration, washed with water, and dried under vacuum to obtain 37 g of a specific resin 5.

The molecular weight was measured by gel permeation chromatography (GPC), and it was found to be 60,000 in terms of a weight-average molecular weight (in terms of standard polystyrene).

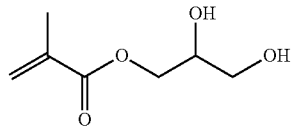

(1)

(Specific Resin 6)

A copolymer of benzyl methacrylate/methacrylic acid (molar ratio 7/3, weight-average molecular weight 30,000) was used as a specific resin 6.

<Preparation of Titanium Black Dispersion A>

The following composition 1 was subjected to a high viscosity dispersion treatment using two rolls to obtain a dispersion. At this time, the dispersion had a viscosity of 40,000 mPa·s.

Further, kneading was carried out by a kneader for 30 minutes prior to the high viscosity dispersion treatment.

(Composition 1)

| | |
|---|---|
| Titanium black 13M-C having an average primary particle diameter of 75 nm (manufactured by Mitsubishi Materials Corporation) (Pigment Black 35) | 40 parts |
| Propylene glycol monomethyl ether acetate solution of benzyl (meth)acrylate/(meth)acrylic acid copolymer (BzMA/MAA = 70/30, Mw: 30000, solid content 40% by mass) | 8 parts |
| SOLSPERSE 5000 (manufactured by Astra Zeneca PLC) | 2 parts |

To the obtained dispersion was added a mixture of the following composition 2, and the mixture was stirred under the conditions of 3000 rpm using a homogenizer for 3 hours. The obtained mixed solution was subjected to a fine dispersion treatment with a dispersion machine (trade name: DISPERMAT, manufactured by GETZMANN GMBH) with use of 0.3 mm zirconia beads for 4 hours, thereby obtaining a titanium black dispersion A (hereinafter denoted as a TB dispersion A).

At this time, the viscosity of the mixed solution was 7.0 mPa·s.

(Composition 2)

| | |
|---|---|
| Propylene glycol monomethyl ether acetate solution of benzyl (meth)acrylate/(meth)acrylic acid copolymer (BzMA/MAA = 70/30, Mw: 30000, solid content 40% by mass) | 10 parts |
| Propylene glycol monomethyl ether acetate | 200 parts |

<Preparation of Titanium Black Dispersion B>

The following composition 3 was subjected to a high viscosity dispersion treatment using two rolls to obtain a dispersion. At this time, the dispersion had a viscosity of 40000 mPa·s.

Further, kneading was carried out by a kneader for 30 minutes prior to the high viscosity dispersion treatment.

(Composition 3)

| | |
|---|---|
| Titanium black 13M-C having an average primary particle diameter of 75 nm (manufactured by Mitsubishi Materials Corporation) (Pigment Black 35) | 39 parts |
| Propylene glycol monomethyl ether acetate solution of allyl (meth)acrylate/(meth)acrylic acid copolymer (allyl methacrylate/MAA = 70/30, Mw: 25000, solid content 40% by mass) | 8 parts |
| SOLSPERSE 5000 (manufactured by Astra Zeneca PLC) | 1 part |

To the obtained dispersion was added a mixture of the following composition 4, and the mixture was stirred under the conditions of 3000 rpm using a homogenizer for 3 hours. The obtained mixed solution was subjected to a fine dispersion treatment with a dispersion machine (trade name: DISPERMAT, manufactured by GETZMANN GMBH) with use of 0.3 mm zirconia beads for 4 hours, thereby obtaining a titanium black dispersion B (hereinafter denoted as a TB dispersion B).

At this time, the viscosity of the mixed solution was 7.0 mPa·s.

(Composition 4)

| | |
|---|---|
| Propylene glycol monomethyl ether acetate solution of allyl (meth)acrylate/(meth)acrylic acid copolymer (allyl methacrylate/MAA = 70/30, Mw: 25,000, solid content 40% by mass) | 8 parts |
| Propylene glycol monomethyl ether acetate | 200 parts |

<Preparation of Carbon Black Dispersion A>

The following composition 5 was subjected to a high viscosity dispersion treatment using two rolls to obtain a dispersion. At this time, the dispersion had a viscosity of 70,000 mPa·s.

Then, to the obtained dispersion was added a mixture of the following composition 6, and the mixture was stirred under the conditions of 3000 rpm using a homogenizer for 3 hours. The obtained mixed solution was subjected to a fine dispersion treatment with a dispersion machine (trade name: DISPERMAT, manufactured by GETZMANN GMBH) with use of 0.3 mm zirconia beads for 4 hours, thereby obtaining a carbon black dispersion A (hereinafter denoted as a CB dispersion A). At this time, the viscosity of the mixed solution was 37 mPa·s.

(Composition 5)

| | |
|---|---|
| Carbon black having an average primary particle diameter of 15 nm (Pigment Black 7) | 23 parts |
| 45% by mass propylene glycol monomethyl ether acetate solution of benzyl methacrylate/methacrylic acid copolymer (BzMA/MAA = 67/33, Mw: 28000) | 22 parts |
| SOLSPERSE 5000 (manufactured by Astra Zeneca PLC) | 1.2 part |

(Composition 6)

| | |
|---|---|
| 45% by mass propylene glycol monomethyl ether acetate solution of benzyl methacrylate/methacrylic acid copolymer (BzMA/MAA = 67/33, Mw: 28,000) | 22 parts |
| Propylene glycol monomethyl ether acetate | 200 parts |

Examples 1 to 14 and Comparative Examples 1 to 3

<Black Photopolymerizable Composition>

The components of Composition A below were mixed by a stirrer to obtain black photopolymerizable compositions of Examples 1 to 14 and Comparative Examples 1 to 3.

(Composition A)

| | |
|---|---|
| Polymerizable compound (monomer) (monomers and amounts described in Table 1) | |
| Binder polymer (polymers and amounts described in Table 1) | |
| Pigment dispersion (pigment dispersion described in Table 1) | 24 parts |
| Propylene glycol monomethyl ether acetate | 18 parts |
| Initiator (compound described in Table 1) | 0.7 parts |
| Polymerization inhibitor (p-methoxyphenol) | 0.001 parts |

TABLE 1

| | Pigment dispersion | Monomer/ parts | Polymer/ parts | Initiator | Sensitivity (mJ/cm$^2$) | Residue |
|---|---|---|---|---|---|---|
| Example 1 | TB dispersion A | MM-1/1.9 | Resin 2/1.6 | I-1 | 590 | A |
| Example 2 | TB dispersion A | MM-1/2.0 | Resin 2/1.5 | I-1 | 560 | A |
| Example 3 | TB dispersion A | MM-1/2.5 | Resin 2/1.0 | I-1 | 520 | A |
| Example 4 | TB dispersion A | MM-2/2.0 | Resin 1/1.5 | I-2 | 550 | A |
| Example 5 | TB dispersion A | MM-3/2.0 | Resin 1/1.5 | I-2 | 540 | A |
| Example 6 | TB dispersion A | MM-4/2.0 | Resin 1/1.5 | I-2 | 560 | A |
| Example 7 | TB dispersion A | MM-5/2.0 | Resin 1/1.5 | I-2 | 560 | A |
| Example 8 | TB dispersion A | MM-6/2.0 | Resin 1/1.5 | I-2 | 580 | A |
| Example 9 | TB dispersion A | MM-1/2.5 | Resin 4/1.0 | I-1 | 510 | A |
| Example 10 | TB dispersion A | MM-1/2.5 | Resin 4/1.0 | I-2 | 500 | A |
| Example 11 | TB dispersion A | MM-1/2.5 | Resin 4/1.0 | I-3 | 560 | A |
| Example 12 | TB dispersion A | MM-1/2.5 | Resin 4/1.0 | I-4 | 480 | A |
| Example 13 | TB dispersion B | MM-1/2.5 | Resin 4/1.0 | I-5 | 470 | A |
| Example 14 | TB dispersion B | MM-1/2.5 | Resin 4/1.0 | I-5 | 450 | A |
| Comparative Example 1 | CB dispersion A | MM-1/2.0 | Resin 2/1.5 | I-1 | 980 | A |
| Comparative Example 2 | TB dispersion A | MM-1/1.6 | Resin 2/1.9 | I-1 | 630 | B |
| Comparative Example 3 | TB dispersion A | MM-1/1.0 | Resin 2/2.5 | I-1 | 920 | C |

Further, the parts with respect to the polymers mean the solid contents.

In addition, the monomers and initiators described in Table 1 are as below.

MM-1: Dipentaerythritol hexaacrylate (DPHA)

MM-2: Pentaerythritol tetraacrylate (NKester A-TMMT, manufactured by Shin-Nakamura Chemical Co., Ltd.)

| Compound No. | Structure |
| --- | --- |
| Compound I-1 | IRGACURE OXE01 (manufactured by Ciba Specialty Chemicals) |
| Compound I-2 | IRGACURE OXE02 (manufactured by Ciba Specialty Chemicals) |
| Compound I-3 | IRGACURE 379 |
| Compound I-4 | |
| Compound I-5 | |

MM-3: Pentaerythritol triacrylate (NKester A-TMPT, manufactured by Shin-Nakamura Chemical Co., Ltd.))

MM-4: Caprolactone-modified trimethylolpropane triacrylate (Ebecryl 2047, manufactured by Daicel UBC, Ltd.)

MM-5: 2,2-Bis[4-(acryloxydiethoxy)phenyl]propane (NKester A-BPE-4, manufactured by Shin-Nakamura Chemical Co., Ltd.)

MM-6: Trimethylolpropane trimethacrylate (SR-350, manufactured by Nippon Kayaku Co., Ltd.)

MM-7: Tris(2-hydroxyethyl)isocyanurate triacrylate (SR-368, manufactured by Nippon Kayaku Co., Ltd.)

MM-8: Pentaerythritol triacrylate hexamethylene diisocyanate urethane prepolymer (UA-306H, manufactured by KYOEISHA CHEMICAL CO., Ltd.)

MM-9: Succinic acid-modified pentaerythritol triacrylate

<Preparation of Silicon Substrate with Undercoat Layer>

The components in Composition below were mixed and dissolved to prepare a resist solution for an undercoat layer.

<Composition>

| | |
|---|---|
| Propylene glycol monomethyl ether acetate (PGMEA: solvent) | 19.20 parts |
| Ethyl lactate | 36.67 parts |
| Binder polymer [40% PGMEA solution of a benzyl methacrylate/methacrylic acid/methacrylic acid-2-hydroxyethyl copolymer (molar ratio = 60/22/18)] | 30.51 parts |
| Dipentaerythritol hexaacrylate (photopolymerizable compound) | 12.20 parts |
| Polymerization inhibitor (p-methoxy phenol) | 0.0061 parts |
| Fluorine-containing surfactant (F-475, manufactured by Dainippon Ink And Chemicals, Incorporated) | 0.83 parts |
| Photopolymerization initiator (TAZ-107 (a trihalomethyltriazine-based photopolymerization initiator), manufactured by Midori Kagaku Co., Ltd.) | 0.586 parts |

A 6-inch silicon wafer was subjected to heat treatment in an oven at 200° C. for 30 minutes. Then, the resist liquid above was applied onto this silicon wafer to give a dried film thickness of 2 μm, and then dried by heating in an oven at 220° C. for 1 hour to form an undercoat layer, thereby obtaining a silicon wafer substrate with an undercoat layer.

<<Preparation of Light-Blocking Color Filter for Solid-State Imaging Device and Evaluation of Sensitivity Thereof>>

The black photopolymerizable compositions of Examples 1 to 14 and Comparative Examples 1 to 3 thus obtained were coated on the above obtained silicon wafer by spin coating, and subsequently heated on a hot plate at 120° C. for 2 minutes, thereby obtaining a photosensitive layer.

Subsequently, the photosensitive layer thus obtained was irradiated with light using an i-ray stepper through a photomask with a 3 mm square pattern at an exposure amount varying in a range from 100 to 5000 mJ/cm² in steps of 100 mJ/cm².

The photosensitive layer after the exposure was subjected to a puddle development which was carried out using a 0.3% by mass aqueous solution of tetramethylammonium hydroxide at 25° C. for 40 seconds. Subsequently, rinsing with pure water was carried out by a spin shower to obtain a light-blocking color filter pattern. The minimum exposure amount when the 3 mm square pattern was obtained by carrying out the development for 60 seconds is shown in Table 1.

From the viewpoint of productivity, the exposure amount of 600 mJ/cm² or less can mean that the sensitivity is good.

<<Evaluation of Residues>>

Moreover, the black photopolymerizable compositions of Examples 1 to 14 and Comparative Examples 1 to 3 thus obtained were evaluated for their developability by the following method. The results are shown in Table 1.

That is, in the exposing step during evaluation of the sensitivity, the presence of the residue in the region not irradiated with light (unexposed portion) was observed and the developability was evaluated. The evaluation criteria are as follows.

—Evaluation Criteria—

A: No residue was confirmed in the unexposed portion.

B: Slight residue was confirmed in the unexposed portion to a degree not causing a problem in practical use.

C: Marked residue was confirmed in the unexposed portion.

Examples 15 to 33 and Comparative Examples 4 to 6

<Black Photopolymerizable Composition>

The components of Composition B below were mixed by a stirrer to obtain black photopolymerizable compositions of Examples 15 to 33 and Comparative Examples 4 to 6.

(Composition B) (High Pigment Concentration)

| | |
|---|---|
| Polymerizable compound (monomer) (monomers and amounts described in Table 2) | |
| Binder polymer (polymers and amounts described in Table 2) | |
| Pigment dispersion (pigment dispersion described in Table 2) | 24 parts |
| Propylene glycol monomethyl ether acetate | 10 parts |
| Cyclohexanone | 8 parts |
| Initiator (compound described in Table 2) | 0.8 parts |
| Adhesive (S) below | 0.1 parts |

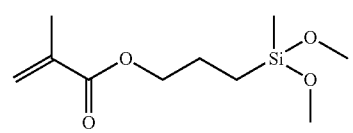

(S)

TABLE 2

| | Pigment dispersion | Monomer/parts | Polymer/parts | Initiator | Sensitivity (mJ/cm²) | Residue |
|---|---|---|---|---|---|---|
| Example 15 | TB dispersion A | MM-9/1.3 | Resin 6/1.0 | I-2 | 580 | A |
| Example 16 | TB dispersion A | MM-9/1.7 | Resin 6/0.6 | I-2 | 540 | A |
| Example 17 | TB dispersion A | MM-9/2.1 | Resin 6/0.2 | I-2 | 510 | A |
| Example 18 | TB dispersion A | MM-1/1.7 | Resin 6/0.6 | I-2 | 540 | A |
| Example 19 | TB dispersion A | MM-7/1.7 | Resin 6/0.6 | I-2 | 570 | A |
| Example 20 | TB dispersion A | MM-8/1.7 | Resin 6/0.6 | I-2 | 570 | A |
| Example 21 | TB dispersion B | MM-1/1.0 MM-9/0.8 | Resin 1/0.5 | I-2 | 530 | A |

TABLE 2-continued

| | Pigment dispersion | Monomer/parts | Polymer/parts | Initiator | Sensitivity (mJ/cm$^2$) | Residue |
|---|---|---|---|---|---|---|
| Example 22 | TB dispersion B | MM-1/1.9 | Resin 1/0.4 | I-1 | 550 | A |
| Example 23 | TB dispersion B | MM-1/1.9 | Resin 2/0.4 | I-1 | 530 | A |
| Example 24 | TB dispersion B | MM-1/1.9 | Resin 3/0.4 | I-1 | 530 | A |
| Example 25 | TB dispersion B | MM-1/1.9 | Resin 4/0.4 | I-1 | 520 | A |
| Example 26 | TB dispersion B | MM-1/1.9 | Resin 5/0.4 | I-1 | 530 | A |
| Example 27 | TB dispersion B | MM-1/1.9 | Resin 6/0.4 | I-1 | 550 | A |
| Example 28 | TB dispersion B | MM-9/2.1 | Resin 2/0.2 | I-1 | 510 | A |
| Example 29 | TB dispersion B | MM-9/2.1 | Resin 2/0.2 | I-2 | 490 | A |
| Example 30 | TB dispersion B | MM-9/2.1 | Resin 2/0.2 | I-3 | 540 | A |
| Example 31 | TB dispersion B | MM-9/2.1 | Resin 2/0.2 | I-4 | 470 | A |
| Example 32 | TB dispersion B | MM-9/2.1 | Resin 2/0.2 | I-5 | 460 | A |
| Example 33 | TB dispersion B | MM-1/2.1 | Resin 2/0.2 | I-5 | 450 | A |
| Comparative Example 4 | TB dispersion A | MM-9/1.7 | Resin 6/0.6 | I-2 | 980 | A |
| Comparative Example 5 | TB dispersion A | MM-9/1.0 | Resin 6/1.3 | I-2 | 620 | B |
| Comparative Example 6 | TB dispersion A | MM-9/0.2 | Resin 6/2.1 | I-1 | 1000 or more | C |

<<Preparation of Light-Blocking Color Filter for Solid-State Imaging Device and Evaluation on Sensitivity Thereof>>

The black photopolymerizable compositions of Examples 15 to 33 and Comparative Examples 4 to 6 thus obtained were coated on a silicon wafer having no undercoat layer by a spin coating method, and subsequently heated on a hot plate at 120° C. for 2 minutes, thereby obtaining a photosensitive layer.

Subsequently, the photosensitive layer thus obtained was irradiated with light using an i-ray stepper through a photomask with a 2.5 μm square pattern at an exposure amount varying in a range from 100 to 5000 mJ/cm$^2$ in steps of 100 mJ/cm$^2$.

The photosensitive layer after the exposure was subjected to a puddle development which was carried out using a 0.3% by mass aqueous solution of tetramethylammonium hydroxide at 25° C. for 40 seconds. Subsequently, rinsing with pure water was carried out by a spin shower to obtain a light-blocking color filter pattern. The minimum exposure amount when the 3 mm square pattern was obtained by carrying out the development for 60 seconds is shown in Table 2.

<<Evaluation of Residues>>

Moreover, the black photopolymerizable compositions of Examples 15 to 33 and Comparative Examples 4 to 6 thus obtained were evaluated for their developability by the following method. The results are shown in Table 2.

That is, in the exposing step during evaluation of the sensitivity, the presence of the residue in the region not irradiated with light (unexposed portion) was observed and the developability was evaluated. The evaluation criteria are as follows.

—Evaluation Criteria—

A: No residue was confirmed in the unexposed portion.

B: Slight residue was confirmed in the unexposed portion to a degree not causing a problem in practical use.

C: Marked residue was confirmed in the unexposed portion.

The invention claimed is:

1. A polymerizable composition comprising at least (A) a polymerizable compound, (B) a binder polymer, (C) a photopolymerization initiator, and (D) a titanium black dispersion,
wherein the mass ratio of the content of the polymerizable compound (A) to the content of the binder polymer (B) is 2.5 or more; and
the photopolymerization initiator (C) is selected from the group consisting of compound I-1, compound I-4 and a compound represented by formula (C1):

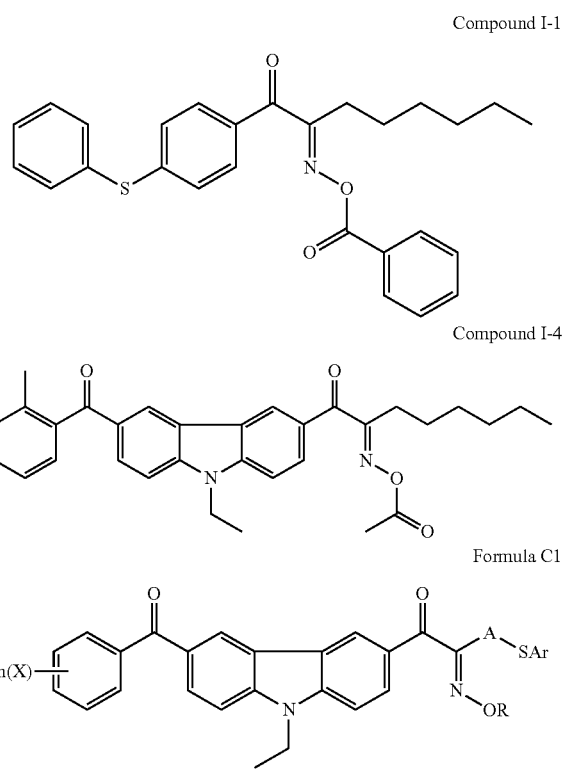

wherein in general formula (C1), R and X each independently represents a monovalent substituent, A represents a divalent organic group, Ar represents an aryl group, and n is an integer of 1 to 5.

2. The polymerizable composition according to claim 1, wherein the binder polymer (B) has a polymerizable group in a side chain.

3. The polymerizable composition according to claim 1, wherein the content of the titanium black is from 40% by mass to 90% by mass with respect to the total solids content of the polymerizable composition.

4. The polymerizable composition according to claim 1, which is used for formation of a colored region of a solid-state imaging device.

5. A light-blocking color filter for a solid-state imaging device, comprising a colored region formed using the polymerizable composition according to claim 4 on a support.

6. A solid-state imaging device comprising the light-blocking color filter for a solid-state imaging device according to claim 5.

7. A method for producing a light-blocking color filter for a solid-state imaging device, the method comprising:
coating the polymerizable composition according to claim 1 on a support to form a colored polymerizable composition layer;
exposing the colored polymerizable composition layer through a mask; and
developing the colored polymerizable composition layer after exposure to form a colored region.

8. The polymerizable composition according to claim 1, wherein the photopolymerization initiator (C) is a compound represented by formula (C1).

9. The polymerizable composition according to claim 1, wherein the binder polymer (B) is a polymer having a structural unit represented by formula (B1), (B2) or (B3):

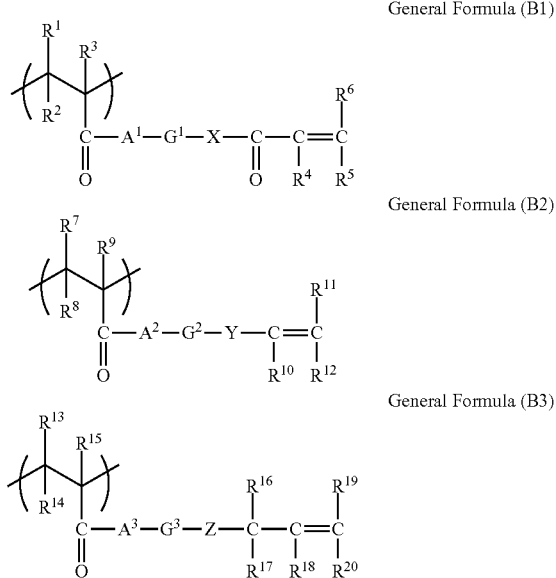

General Formula (B1)

General Formula (B2)

General Formula (B3)

wherein in the general formulas (B1) to (B3), $A^1$, $A^2$, and $A^3$ each independently represents an oxygen atom, a sulfur atom, or —N($R^{21}$)—, wherein $R^{21}$ represents an alkyl group which may have a substituent; $G^1$, $G^2$, and $G^3$ each independently represents a divalent organic group; X and Z each independently represents an oxygen atom, a sulfur atom, or —N($R^{22}$)—, wherein $R^{22}$ represents an alkyl group which may have a substituent; Y represents a single bond, an oxygen atom, a sulfur atom, a phenylene group which may have a substituent, or —N($R^{23}$)—, wherein $R^{23}$ represents an alkyl group which may have a substituent; and $R^1$ to $R^{20}$ each independently represents a hydrogen atom or a monovalent substituent.

10. A polymerizable composition comprising at least (A) a polymerizable compound, (B) a binder polymer, (C) a photopolymerization initiator, and (D) a titanium black dispersion, wherein the mass ratio of the content of the polymerizable compound (A) to the content of the binder polymer (B) is 2.5 or more.

11. The polymerizable composition according to claim 10, wherein the binder polymer (B) has a polymerizable group in a side chain.

12. The polymerizable composition according to claim 10, wherein the content of the titanium black is from 40% by mass to 90% by mass with respect to the total solids content of the polymerizable composition.

13. The polymerizable composition according to claim 10, which is used for formation of a colored region of a solid-state imaging device.

14. A light-blocking color filter for a solid-state imaging device, comprising a colored region formed using the polymerizable composition according to claim 13 on a support.

15. A solid-state imaging device comprising the light-blocking color filter for a solid-state imaging device according to claim 14.

16. A method for producing a light-blocking color filter for a solid-state imaging device, the method comprising:
coating the polymerizable composition according to claim 10 on a support to form a colored polymerizable composition layer;
exposing the colored polymerizable composition layer through a mask; and
developing the colored polymerizable composition layer after exposure to form a colored region.

17. The polymerizable composition according to claim 10, wherein the photopolymerization initiator (C) is a compound represented by formula (C1):

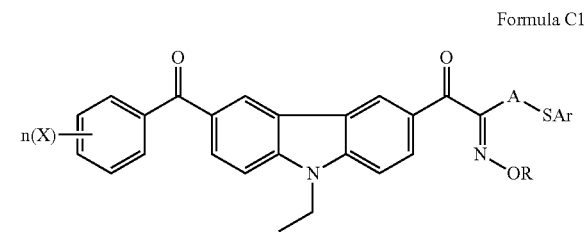

Formula C1 wherein in general formula (C1), R and X each independently represents a monovalent substituent, A represents a divalent organic group, Ar represents an aryl group, and n is an integer of 1 to 5.

18. The polymerizable composition according to claim 10, wherein the binder polymer (B) is a polymer having a structural unit represented by formula (B1), (B2) or (B3):

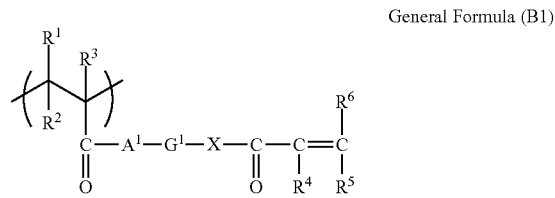

General Formula (B1)

-continued

General Formula (B2)

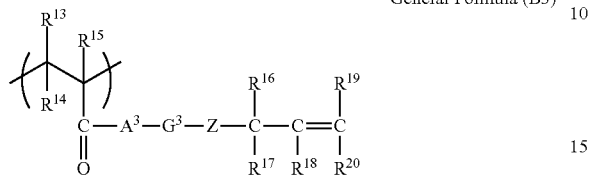

General Formula (B3)

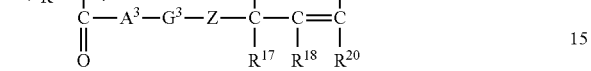

wherein in the general formulas (B1) to (B3), $A^1$, $A^2$, and $A^3$ each independently represents an oxygen atom, a sulfur atom, or —N($R^{21}$)—, wherein $R^{21}$ represents an alkyl group which may have a substituent; $G^1$, $G^2$, and $G^3$ each independently represents a divalent organic group; X and Z each independently represents an oxygen atom, a sulfur atom, or —N($R^{22}$)—, wherein $R^{22}$ represents an alkyl group which may have a substituent; Y represents a single bond, an oxygen atom, a sulfur atom, a phenylene group which may have a substituent, or —N($R^{23}$)—, wherein $R^{23}$ represents an alkyl group which may have a substituent; and $R^1$ to $R^{20}$ each independently represents a hydrogen atom or a monovalent substituent.

* * * * *